United States Patent
Widjaja

(10) Patent No.: US 10,403,361 B2
(45) Date of Patent: Sep. 3, 2019

(54) MEMORY CELLS, MEMORY CELL ARRAYS, METHODS OF USING AND METHODS OF MAKING

(71) Applicant: Zeno Semiconductor, Inc., Sunnyvale, CA (US)

(72) Inventor: Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 16/273,629

(22) Filed: Feb. 12, 2019

(65) Prior Publication Data

US 2019/0189212 A1    Jun. 20, 2019

Related U.S. Application Data

(60) Continuation of application No. 16/140,106, filed on Sep. 24, 2018, now Pat. No. 10,242,739, which is a
(Continued)

(51) Int. Cl.
*G11C 14/00* (2006.01)
*G11C 13/00* (2006.01)
(Continued)

(52) U.S. Cl.
CPC ........ *G11C 14/0045* (2013.01); *G11C 11/404* (2013.01); *G11C 11/4026* (2013.01);
(Continued)

(58) Field of Classification Search
CPC ............ G11C 11/4094; G11C 11/5678; G11C 13/0069; G11C 8/16
See application file for complete search history.

(56) References Cited

U.S. PATENT DOCUMENTS

| 4,300,212 A | 11/1981 | Simko |
| 4,385,308 A | 5/1983 | Uchida |

(Continued)

OTHER PUBLICATIONS

Chatterjee, et al. "Taper isolated dynamic gain RAM cell." Electron Devices Meeting, 1978 International. vol. 24. IEEE, 1978, pp. 698-699.
(Continued)

*Primary Examiner* — Tuan T Nguyen
(74) *Attorney, Agent, or Firm* — Law Office of Alan W. Cannon

(57) ABSTRACT

A semiconductor memory cell and arrays of memory cells are provided In at least one embodiment, a memory cell includes a substrate having a top surface, the substrate having a first conductivity type selected from a p-type conductivity type and an n-type conductivity type; a first region having a second conductivity type selected from the p-type and n-type conductivity types, the second conductivity type being different from the first conductivity type, the first region being formed in the substrate and exposed at the top surface; a second region having the second conductivity type, the second region being formed in the substrate, spaced apart from the first region and exposed at the top surface; a buried layer in the substrate below the first and second regions, spaced apart from the first and second regions and having the second conductivity type; a body region formed between the first and second regions and the buried layer, the body region having the first conductivity type; a gate positioned between the first and second regions and above the top surface; and a nonvolatile memory configured to store data upon transfer from the body region.

21 Claims, 39 Drawing Sheets

Related U.S. Application Data continuation of application No. 15/948,926, filed on Apr. 9, 2018, now Pat. No. 10,109,349, which is a continuation of application No. 15/810,400, filed on Nov. 13, 2017, now Pat. No. 9,978,450, which is a continuation of application No. 15/623,754, filed on Jun. 15, 2017, now Pat. No. 9,847,131, which is a continuation of application No. 15/414,870, filed on Jan. 25, 2017, now Pat. No. 9,715,932, which is a continuation of application No. 14/630,185, filed on Feb. 24, 2015, now Pat. No. 9,679,648, which is a division of application No. 14/148,373, filed on Jan. 6, 2014, now Pat. No. 8,995,186, which is a division of application No. 13/937,612, filed on Jul. 9, 2013, now Pat. No. 8,654,583, which is a continuation of application No. 13/462,702, filed on May 2, 2012, now Pat. No. 8,531,881, which is a continuation of application No. 12/552,903, filed on Sep. 2, 2009, now Pat. No. 8,194,451, which is a continuation-in-part of application No. 12/533,661, filed on Jul. 31, 2009, now Pat. No. 8,077,536, which is a continuation-in-part of application No. 12/545,623, filed on Aug. 21, 2009, now Pat. No. 8,159,868.

(60) Provisional application No. 61/093,726, filed on Sep. 3, 2008, provisional application No. 61/094,540, filed on Sep. 5, 2008.

(51) Int. Cl.

| | | |
|---|---|---|
| *H01L 45/00* | (2006.01) | |
| *G11C 11/56* | (2006.01) | |
| *H01L 27/24* | (2006.01) | |
| *H01L 29/66* | (2006.01) | |
| *H01L 29/78* | (2006.01) | |
| *H01L 29/788* | (2006.01) | |
| *H01L 27/105* | (2006.01) | |
| *G11C 11/402* | (2006.01) | |
| *H01L 27/102* | (2006.01) | |
| *H01L 27/108* | (2006.01) | |
| *G11C 11/4074* | (2006.01) | |
| *G11C 11/404* | (2006.01) | |
| *G11C 16/04* | (2006.01) | |

(52) U.S. Cl.
CPC .......... *G11C 11/4074* (2013.01); *G11C 11/56* (2013.01); *G11C 13/0002* (2013.01); *G11C 13/003* (2013.01); *G11C 13/0004* (2013.01); *G11C 13/0007* (2013.01); *G11C 13/0038* (2013.01); *G11C 13/0097* (2013.01); *G11C 14/0018* (2013.01); *H01L 27/1023* (2013.01); *H01L 27/1052* (2013.01); *H01L 27/10802* (2013.01); *H01L 27/24* (2013.01); *H01L 29/66825* (2013.01); *H01L 29/66833* (2013.01); *H01L 29/7841* (2013.01); *H01L 29/7881* (2013.01); *H01L 45/06* (2013.01); *H01L 45/145* (2013.01); *G11C 16/0416* (2013.01); *G11C 2211/4016* (2013.01); *G11C 2213/76* (2013.01); *G11C 2213/79* (2013.01); *H01L 45/144* (2013.01)

(56) References Cited

U.S. PATENT DOCUMENTS

| | | |
|---|---|---|
| 4,959,812 A | 9/1990 | Momodoni et al. |
| 5,519,831 A | 5/1996 | Holzhammer |
| 5,581,504 A | 12/1996 | Chang et al. |
| 5,767,549 A | 6/1998 | Chen et al. |
| 5,999,444 A | 12/1999 | Fujiwara et al. |
| 6,005,818 A | 12/1999 | Ferrant et al. |
| 6,043,527 A | 3/2000 | Forbes |
| 6,064,100 A | 5/2000 | Wen |
| 6,141,248 A | 10/2000 | Forbes et al. |
| 6,163,048 A | 12/2000 | Hirose et al. |
| 6,166,407 A | 12/2000 | Ohta |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,625,057 B2 | 9/2003 | Iwata |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,870,751 B2 | 3/2005 | van Brocklin et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 * | 11/2005 | Fazan .................... G11C 11/403 365/185.04 |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,209,384 B1 | 4/2007 | Kim |
| 7,224,019 B2 | 5/2007 | Hieda et al. |
| 7,259,420 B2 | 8/2007 | Anderson et al. |
| 7,259,992 B2 | 8/2007 | Shirota |
| 7,280,399 B2 * | 10/2007 | Fazan .................... G11C 11/403 365/185.04 |
| 7,285,820 B2 | 10/2007 | Park et al. |
| 7,301,803 B2 | 11/2007 | Okhonin et al. |
| 7,301,838 B2 | 11/2007 | Waller et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Matthew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,660,144 B2 | 2/2010 | Bhattacharyya |
| 7,701,763 B2 | 4/2010 | Roohparvar |
| 7,733,693 B2 | 6/2010 | Ferrant et al. |
| 7,738,312 B2 * | 6/2010 | Shimano ................ G11C 5/063 365/207 |
| 7,759,715 B2 | 7/2010 | Bhattacharyya |
| 7,760,548 B2 | 7/2010 | Widjaja |
| 7,847,338 B2 | 12/2010 | Widjaja |
| 7,933,139 B2 | 4/2011 | Lung |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja |
| 8,243,499 B2 | 8/2012 | Widjaja |
| 8,294,193 B2 | 10/2012 | Widjaja |
| 8,391,066 B2 | 3/2013 | Widjaja |
| 8,416,636 B2 * | 4/2013 | Carman .................. G11C 7/02 365/185.21 |
| 8,472,249 B2 | 6/2013 | Widjaja |
| 8,531,881 B2 | 9/2013 | Widjaja |
| 8,559,257 B2 | 10/2013 | Widjaja |
| 8,570,803 B2 | 10/2013 | Widjaja |
| 8,654,583 B2 | 2/2014 | Widjaja |
| 8,787,085 B2 | 7/2014 | Widjaja |
| 8,837,247 B2 | 9/2014 | Widjaja |

(56) References Cited

U.S. PATENT DOCUMENTS

| | | | |
|---|---|---|---|
| 8,923,052 B2 | 12/2014 | Widjaja | |
| 8,995,186 B2 | 3/2015 | Widjaja | |
| 9,087,580 B2 | 7/2015 | Widjaja | |
| 9,153,333 B2 | 10/2015 | Widjaja | |
| 9,230,965 B2 | 1/2016 | Widjaja | |
| 9,257,179 B2 | 2/2016 | Widjaja | |
| 9,460,790 B2 | 10/2016 | Widjaja | |
| 9,484,082 B2 | 11/2016 | Widjaja | |
| 9,490,012 B2 | 11/2016 | Widjaja | |
| 9,646,693 B2 | 5/2017 | Widjaja | |
| 9,679,648 B2 | 6/2017 | Widjaja | |
| 9,715,932 B2 | 7/2017 | Widjaja | |
| 9,716,311 B2 | 7/2017 | Greene et al. | |
| 9,761,589 B2 | 9/2017 | Widjaja | |
| 9,812,203 B2 | 11/2017 | Widjaja | |
| 9,847,131 B2 | 12/2017 | Widjaja | |
| 9,928,910 B2 | 3/2018 | Widjaja | |
| 9,960,166 B2 | 5/2018 | Widjaja | |
| 9,978,450 B2 | 5/2018 | Widjaja | |
| 10,032,514 B2 | 7/2018 | Widjaja | |
| 10,109,349 B2 | 10/2018 | Widjaja | |
| 10,210,934 B2 | 2/2019 | Widjaja | |
| 10,211,209 B2 | 2/2019 | Widjaja | |
| 10,242,739 B2 | 3/2019 | Widjaja | |
| 2002/0018366 A1 | 2/2002 | Schwerin et al. | |
| 2002/0048193 A1 | 4/2002 | Tanikawa et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0092689 A1 | 5/2006 | Braun et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Huang et al. | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0284648 A1 | 12/2007 | Park et al. | |
| 2008/0025072 A1 | 1/2008 | Tamai et al. | |
| 2008/0048239 A1 | 2/2008 | Huo et al. | |
| 2008/0080248 A1 | 4/2008 | Lue et al. | |
| 2008/0111154 A1 | 5/2008 | Voldman | |
| 2008/0123418 A1 | 5/2008 | Widjaja | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0034320 A1 | 2/2009 | Ueda | |
| 2009/0065853 A1 | 3/2009 | Hanafi | |
| 2009/0073740 A1 | 3/2009 | Ogura et al. | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0129141 A1 | 5/2009 | Hosotani et al. | |
| 2009/0173985 A1 | 7/2009 | Lee et al. | |
| 2009/0190402 A1 | 7/2009 | Hsu et al. | |
| 2009/0251960 A1 | 10/2009 | Schultz et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0157664 A1 | 6/2010 | Chung | |
| 2010/0214820 A1 | 8/2010 | Hosono et al. | |
| 2010/0238702 A1 | 9/2010 | Yamaguchi et al. | |
| 2010/0246277 A1 | 9/2010 | Widjaja | |
| 2010/0246284 A1 | 9/2010 | Widjaja | |
| 2010/0290271 A1 | 11/2010 | Lung | |
| 2011/0026332 A1 | 2/2011 | Kitagawa | |
| 2011/0032756 A1 | 2/2011 | Widjaja | |
| 2011/0042736 A1 | 2/2011 | Widjaja | |
| 2011/0044110 A1 | 2/2011 | Widjaja | |
| 2011/0170329 A1 | 7/2011 | Kang | |
| 2011/0228591 A1 | 9/2011 | Widjaja | |
| 2011/0305085 A1 | 12/2011 | Widjaja | |
| 2012/0012915 A1 | 1/2012 | Widjaja et al. | |
| 2012/0014180 A1 | 1/2012 | Widjaja | |
| 2012/0014188 A1 | 1/2012 | Widjaja et al. | |
| 2012/0069652 A1 | 3/2012 | Widjaja | |
| 2012/0106234 A1 | 5/2012 | Widjaja | |
| 2012/0113712 A1 | 5/2012 | Widjaja | |
| 2012/0230123 A1 | 9/2012 | Widjaja et al. | |
| 2012/0241708 A1 | 9/2012 | Widjaja | |
| 2013/0094280 A1 | 4/2013 | Widjaja | |
| 2013/0148422 A1 | 6/2013 | Widjaja | |
| 2013/0250685 A1 | 9/2013 | Widjaja | |
| 2013/0268727 A1 | 10/2013 | Sohn et al. | |
| 2013/0292635 A1 | 11/2013 | Widjaja | |
| 2014/0003127 A1 | 1/2014 | Sakamoto et al. | |
| 2014/0021549 A1 | 1/2014 | Widjaja | |
| 2014/0211568 A1 | 7/2014 | Mui et al. | |
| 2014/0269046 A1 | 9/2014 | Laurin et al. | |
| 2014/0332899 A1 | 11/2014 | Widjaja | |
| 2014/0355343 A1 | 12/2014 | Widjaja | |
| 2015/0109860 A1 | 4/2015 | Widjaja | |
| 2015/0170743 A1 | 6/2015 | Widjaja | |
| 2015/0310917 A1 | 10/2015 | Widjaja | |
| 2015/0357032 A1 | 12/2015 | Tatsumura et al. | |
| 2015/0371707 A1 | 12/2015 | Widjaja | |
| 2016/0086655 A1 | 3/2016 | Widjaja | |
| 2016/0111158 A1 | 4/2016 | Widjaja | |
| 2016/0372606 A1 | 12/2016 | Ito et al. | |
| 2017/0012139 A1 | 1/2017 | Sasagawa et al. | |
| 2017/0025534 A1 | 1/2017 | Widjaja | |
| 2017/0032842 A1 | 2/2017 | Widjaja | |
| 2017/0040326 A1 | 2/2017 | Widjaja | |
| 2017/0062619 A1 | 3/2017 | Sasagawa et al. | |
| 2017/0133091 A1 | 5/2017 | Widjaja | |
| 2017/0213593 A1 | 7/2017 | Widjaja | |
| 2017/0262194 A1 | 9/2017 | Kodama et al. | |
| 2017/0294230 A1 | 10/2017 | Widjaja | |
| 2017/0365340 A1 | 12/2017 | Widjaja | |
| 2017/0365607 A1 | 12/2017 | Widjaja | |
| 2018/0025780 A1 | 1/2018 | Widjaja | |
| 2018/0075907 A1 | 3/2018 | Widjaja | |
| 2018/0102160 A1 | 4/2018 | Ong et al. | |
| 2018/0108760 A1 | 4/2018 | Okamoto et al. | |
| 2018/0174654 A1 | 6/2018 | Widjaja | |
| 2018/0219013 A1 | 8/2018 | Widjaja | |
| 2018/0233199 A1 | 8/2018 | Widjaja | |
| 2018/0330790 A1 | 11/2018 | Widjaja | |
| 2019/0027220 A1 | 1/2019 | Widjaja | |

OTHER PUBLICATIONS

Chatterjee, et al. Circuit Optimization of the Paper Isolated Dynamic Gain RAM Cell for VLSI Memories, pp. 22-23, 1979.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Lanyon et al., "Bandgap Narrowing in Moderately to Heavily Doped Silicon", pp. 1014-1018, No. 7, vol. ED-26, 1979 IEEE.

Leiss, et al, "dRAM Design Using the Taper-Isolated Dynamic RAM Cell." Solid-State Circuits, IEEE Journal of 17.2 (1982): 337-344.

Lin et al., "A new 1T DRAM Cell with enhanced Floating Body Effect", pp. 1-5, Proceedings of the 2006 IEEE International Workshop on Memory Technology.

Ohsawa et al., "Autonomous refresh of floating body cell (FBC)", Electron Devices Meeting, 2008. IEDM 2008. IEEE International. IEEE 2008, pp. 801-804.

Oh et al., "A 4-Bit Double SONOS memory (DSM) with 4 Storage Nodes Per Cell for Ultimate Multi-Bit Operation", pp. 1-2, 2006 Symposium on VLSI Technology Digest of Technical Papers.

(56) References Cited

OTHER PUBLICATIONS

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.

Reisch, "On bistable behavior and open-base breakdown of bipolar transistors in the avalanche regime-modeling and applications." Electron Devices, IEEE Transactions on 39.6 (1992): 1398-1409.

Sakui et al., "A new static memory cell based on reverse bias current (RBC) effect of bipolar transistor", Electron Devices Meeting, 1988. IEDM'88. Technical Digest, International IEEE, 1988, pp. 44-47.

Sakui et al., "A new static memory cell based on the reverse bias current effect of bipolar transistors", Electron Devices, IEEE Transactions on 36.6 (1989): 1215-1217.

Sze et al., "Physics of Semiconductor Devices", Wiley-Interscience, 2007, p. 104.

Terada et al., "A new VLSI memory cell using capacitance coupling (CC) cell", Electron Devices, IEEE Transactions on 31.9 (1984); pp. 1319-1324.

Villaret et al., "Further insight into the physics and modeling of floating-body capacitorless DRAMs", Electron Devices, IEEE Transactions on 52.11 (2005); pp. 2447-2454.

Ohsawa et al., "Autonomous refresh of floating-body cell due to Current Anomaly of Impact Ionization", vol. 56, No. 10, pp. 2301-2311, 2009.

Ban et al., "A Scaled Floating Body Cell (FBC) memory with High-k+Metal Gate on Thin-Silicon and Thin-BOX fro 16-nm Technology Node and Beyond", Symposium on VLSI Technology, 2008, pp. 92-93.

Campardo et al., VLSI Design of Non-Volatile Memories, Springer-Berlin Heidelberg New York, 2005, pp. 94-95.

Han et al., "Programming/Erasing Characteristics of 45 nm NOR-Type Flash Memory Based on SOI Fin FET Structure", J. Korean Physical Society, vol. 47, Nov. 2005, pp. S564-S567.

Headland, Hot electron injection, Feb. 19, 2004.

Pellizer et al., "A 90 nm Phase Change Memory Technology for Stand-Alone Non-Volatile Memory Applications", Symposium on VLSI Technology Digest of Technical Papers, IEEE, 2006, pp. 1-2.

Ranica et al., "Scaled 1T-Bulk devices built with CMOS 90nm technology for low-cost eDRAM applications", 2005 Symposium on VLSI Technology Digest of Technical Papers, pp. 38-39.

Pierret, Semiconductor Device Fundamentals, ISBN: 0-201-54393-1, 1996, Addison-Wesley Publishing Company, Inc., PNPN Devices 463-476.

Tack et al., "The Multistable Charge-Controlled Memory Effect in SOI Transistors at Low Temperatures", IEEE Transactions on Electron Devices, vol. 37, May 1990, pp. 1373-1382.

Okhonin et al., "A SOI Capacitor-less 1T DRAM Concept", 2001 IEEE International SOI Conference, pp. 153-154.

Ohsawa et al., "An 18.5ns 128Mb SOI DRAM with a Floating Body Cell", IEEE International Solid-State Circuits Conference, 2005, pp. 458-459 and 609.

Okhonin et al., "Principles of Transient Charge Pumping on Partially Depleted SOI MOSFETs", IEEE Electron Device Letters, vol. 23, No. 5, May 2002, pp. 279-281.

Okhonin et al., "A Capacitor-less 1T DRAM Cell", IEEE Electron device Letters, vol. 23, No. 2, Feb. 2002, pp. 85-87.

Ohsawa et al., "Memory Design using One-Transistor Gain Cell on SOI", Tech. Digest, IEEE Internataional Solid-State Circuits, vol. 37, No. 11, 2002, pp. 1510-1522.

Yoshida et al., "A Design of a Capacitorless 1T-DRAM Cell Using Gate-Induced Drain Leakage (GIDL) Current for Low-power and High-speed Embedded Memory", International Electron Devices Meeting, 2003, pp. 1-4.

Villaret et al., "Mechansims of charge modulation in the floating body of triple-well nMOSFETcapacitor-less DRAMs", Microelectronic Engineering 72 (2004) 434-439.

* cited by examiner

| Operation | Terminal | | | | |
|---|---|---|---|---|---|
| | 70 | 72 | 74 | 76 | 78 |
| Read | Positive | Neutral | Positive | Neutral or Positive | Neutral |
| Read SCR | Positive | Float | Neutral | Float | Positive |
| Write '1' Hot hole injection | Negative | Neutral | Positive | Neutral or Positive | Neutral |
| Write '1' Impact ionization | Positive | Neutral | Positive | Neutral or Positive | Neutral |
| Write '1' Impact ionization | Positive | Neutral | Positive | Float | Positive |
| Write '1' SCR | Positive | Float | Neutral | Float | Positive |

FIG. 3A

| Operation | Terminal | | | | |
|---|---|---|---|---|---|
| | 70 | 72 | 74 | 76 | 78 |
| Write '0' | Neutral or Negative | Negative | Neutral | Neutral or Positive | Neutral |
| Write '0' SCR | Positive | Float | Positive | Float | Positive |
| Holding/Refresh | Neutral or Negative | Neutral | Float | Float | Positive |
| Holding/Refresh | Neutral or Negative | Float | Neutral | Float | Positive |

FIG. 3B

MEMORY CELLS, MEMORY CELL ARRAYS, METHODS OF USING AND METHODS OF MAKING

CROSS-REFERENCE

This application is a continuation of co-pending application Ser. No. 16/140,106, filed Sep. 24, 2018, which is a continuation of application Ser. No. 15/948,926, filed Apr. 9, 2018, now U.S. Pat. No. 10,109,349, which is a continuation of application Ser. No. 15/810,400, filed Nov. 13, 2017, now U.S. Pat. No. 9,978,450, which is a continuation of application Ser. No. 15/623,754, filed Jun. 15, 2017, now U.S. Pat. No. 9,847,131, which is a continuation of application Ser. No. 15/414,870, filed Jan. 25, 2017, now U.S. Pat. No. 9,715,932, which is a continuation of application Ser. No. 14/630,185, filed Feb. 24, 2015, now U.S. Pat. No. 9,679,648, which is a division of application Ser. No. 14/148,373, filed Jan. 6, 2014, now U.S. Pat. No. 8,995,186, which is a division of application Ser. No. 13/937,612, filed Jul. 9, 2013, now U.S. Pat. No. 8,654,583, which is a continuation of application Ser. No. 13/462,702, filed May 2, 2012, now U.S. Pat. No. 8,531,881, which is a continuation of application Ser. No. 12/552,903, filed Sep. 2, 2009, now U.S. Pat. No. 8,194,451, each of which applications and patents are hereby incorporated herein, in their entireties, by reference thereto and to which applications we claim priority under 35 USC § 120.

Application Ser. No. 12/552,903 is a continuation-in-part application of application Ser. No. 12/533,661, filed Jul. 31, 2009, now U.S. Pat. No. 8,077,536, which application and which patent are hereby incorporated herein, in their entireties, by reference thereto and to which application we claim priority under 35 USC § 120.

Application Ser. No. 12/552,903 is a continuation-in-part application of application Ser. No. 12/545,623, filed Aug. 21, 2009, now U.S. Pat. No. 8,159,868, which application and which patent are hereby incorporated herein, in their entireties, by reference thereto and to which application we claim priority under 35 USC § 120.

Application Ser. No. 12/552,903 claims the benefit of U.S. Provisional Application No. 61/093,726, filed Sep. 3, 2008, and U.S. Provisional Application No. 61/094,540, filed Sep. 5, 2008, both of which applications are hereby incorporated herein, in their entireties, by reference thereto, and to which applications we claim priority under 35 USC § 119.

FIELD OF THE INVENTION

The present invention relates to semiconductor memory technology. More specifically, the present invention relates to semiconductor memory having both volatile and non-volatile semiconductor memory features.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Non-volatile memory devices, such as flash erasable programmable read only memory (Flash EPROM) device, retain stored data even in the absence of power supplied thereto. Unfortunately, non-volatile memory devices typically operate more slowly than volatile memory devices. Accordingly, it would be desirable to provide a universal type memory device that includes the advantages of both volatile and non-volatile memory devices, i.e., fast operation on par with volatile memories, while having the ability to retain stored data when power is discontinued to the memory device. It would further be desirable to provide such a universal type memory device having a size that is not prohibitively larger than comparable volatile or non-volatile devices.

SUMMARY OF THE INVENTION

The present invention provides semiconductor memory cells, arrays of said memory cells, methods of using and methods of making.

A semiconductor memory cell is provided that includes: a substrate having a top surface, the substrate having a first conductivity type selected from a p-type conductivity type and an n-type conductivity type; a first region having a second conductivity type selected from the p-type and n-type conductivity types, the second conductivity type being different from the first conductivity type, the first region being formed in the substrate and exposed at the top surface; a second region having the second conductivity type, the second region being formed in the substrate, spaced apart from the first region and exposed at the top surface; a buried layer in the substrate below the first and second regions, spaced apart from the first and second regions and having the second conductivity type; a body region formed between the first and second regions and the buried layer, the body region having the first conductivity type; a gate positioned between the first and second regions and above the top surface; and a nonvolatile memory configured to store data upon transfer from the body region.

In at least one embodiment, the nonvolatile memory is further configured to restore data to the body region.

In at least one embodiment, the nonvolatile memory comprises a floating gate or trapping layer positioned in between the first and second regions, above the top surface and below the gate.

In at least one embodiment, the nonvolatile memory comprises a resistance change element connected to one of the first and second regions.

In at least one embodiment, the resistance change element comprises a phase change material.

In at least one embodiment, the resistance change element comprises a metal-oxide-metal system.

In at least one embodiment, nonvolatile memory is configured to store data upon transfer from the body region resulting from an instruction to back up the data stored in the body region.

In at least one embodiment, the transfer from the body region commences upon loss of power to the cell, wherein the cell is configured to perform a shadowing process wherein the data in the body region is loaded into and stored in the nonvolatile memory.

In at least one embodiment, the loss of power to the cell initiating transfer from the body region is one of unintentional power loss or intentional power loss, wherein intentional power loss is predetermined to conserve power.

In at least one embodiment, upon restoration of power to the cell, the data in the nonvolatile memory is loaded into the body region and stored therein.

In at least one embodiment, the cell is configured to reset the nonvolatile memory to an initial state after loading the data into the body region upon the restoration of power.

In at least one embodiment, the cell is configured to reset the nonvolatile memory just prior to writing new data into the nonvolatile memory during a shadowing operation.

In at least one embodiment, a semiconductor memory array is provided that includes a plurality of the semiconductor memory cells arranged in a matrix of rows and columns.

In at least one embodiment, a plurality of the matrices are vertically stacked and electrically connected to form a three-dimensional array.

In at least one embodiment, a source line terminal is electrically connected to one of the first and second regions; a bit line terminal is electrically connected to the other of the first and second regions; a word line terminal is connected to the gate; a buried well terminal is electrically connected to the buried layer; and a substrate terminal is electrically connected to the substrate below the buried layer.

In at least one embodiment, the nonvolatile memory comprises a resistance change element connected to one of the first and second regions, and one of the source line terminal and the bit line terminal is connected to the resistance change element.

In at least one embodiment, a data state of the body region is maintained by applying a voltage to the substrate terminal.

In at least one embodiment, the voltage applied to the substrate terminal automatically activates the cell when the floating body has a first data state to refresh the first data state, and wherein when the body region of the cell has a second data state, the cell automatically remains deactivated upon application of the voltage to the substrate terminal so that the body region of the cell remains in the second data state.

In at least one embodiment, the substrate terminal is periodically biased by pulsing the substrate terminal with the voltage, and the data state of the body region of the cell is refreshed upon each the pulse.

In at least one embodiment, the substrate terminal is constantly biased by application of the voltage thereto, and the body region constantly maintains the data state.

In at least one embodiment, the first and second regions are formed in a fin that extends above the buried layer, the gate is provided on opposite sides of the fin, between the first and second regions, and the body region is between the first and second regions and between the gate on opposite sides of the fin.

In at least one embodiment, the gate is additionally provided above a top surface of the body region.

A semiconductor memory cell is provided that includes an arrangement of layers having alternating conductivity types selected from p-type conductivity type and n-type conductivity type configured to function as a silicon controlled rectifier device to store data in volatile memory; and a nonvolatile memory configured to store data upon transfer from volatile memory.

In at least one embodiment, the silicon controlled rectifier device is provided as a P1-N2-P3-N4 silicon-rectifier device.

In at least one embodiment, the cell includes: a substrate having a top surface, the substrate having a p-type conductivity type; a first region having an n-type conductivity type the first region being formed in the substrate and exposed at the top surface; a second region having the n-type conductivity type, the second region being formed in the substrate, spaced apart from the first region and exposed at the top surface; a buried layer in the substrate below the first and second regions, spaced apart from the first and second regions and having the n-type conductivity type; and a body region formed between the first and second regions and the buried layer, the body region having the p-type conductivity type; wherein the substrate functions as the P1 region of the P1-N2-P3-N4 silicon-rectifier device, the buried layer functions as the N2 region of the P1-N2-P3-N4 silicon-rectifier device, the body region functions as the P3 region of the P1-N2-P3-N4 silicon-rectifier device and the first region or the second region functions as the N4 region of the of P1-N2-P3-N4 silicon-rectifier device.

In at least one embodiment, a gate is positioned between the first and second regions and above the top surface.

In at least one embodiment, the nonvolatile memory comprises a floating gate or trapping layer positioned in between the first and second regions, above the top surface and below the gate.

In at least one embodiment, the nonvolatile memory comprises a resistance change element connected to one of the first and second regions.

A method of operating a memory cell having a floating body for storing, reading and writing data as volatile memory, and a nonvolatile memory for storing data is provided, including: reading and storing data to the floating body while power is applied to the memory cell; biasing a substrate terminal connected to a substrate of the memory cell to operate the memory cell as a silicon rectifier device in a conducting operation when the floating body has a first data state, but wherein a blocking operation results when the floating body has a second data state; and transferring the data stored in the floating body to the nonvolatile memory when power to the cell is interrupted.

A method of operating a semiconductor storage device comprising a plurality of memory cells each having a floating body for storing, reading and writing data as volatile memory, and a resistance change element for storing data as non-volatile memory is provided, including: reading and storing data to the floating bodies as volatile memory while power is applied to the device; biasing a substrate terminal connected to a substrate of the memory cell to operate the memory cell as a silicon rectifier device in a conducting operation when the floating body has a first data state, but wherein a blocking operation results when the floating body has a second data state; transferring the data stored in the floating bodies, by a parallel, non-algorithmic process, to the resistance change elements corresponding to the floating bodies, when power to the device is interrupted; and storing the data in the resistance change elements as non-volatile memory.

In at least one embodiment, the method further includes: transferring the data stored in the resistance change elements, by a parallel, non-algorithmic restore process, to the floating bodies corresponding to the resistance change elements, when power is restored to the cell; and storing the data in the floating bodies as volatile memory.

A semiconductor memory cell formed in a vertical arrangement to provide a compact cell size is provided, including: a thin capacitively coupled thyristor access device; and a resistance change memory.

In at least one embodiment, the thin capacitively coupled thyristor access device functions as select device and the resistance change memory functions as nonvolatile memory.

In at least one embodiment, the thin capacitively coupled thyristor access device comprises a stack of four layers forming p-n-p-n regions.

In at least one embodiment, the resistance change memory comprises a bottom electrode, a chalcogenide material and a top electrode.

A semiconductor memory array is provided that includes a plurality of the semiconductor memory cells comprising a thin capacitively couple thyristor access device and a resistance change memory.

In at least one embodiment, the memory array further includes a plurality of the matrices vertically stacked and electrically connected to form a three-dimensional array.

A method of making a semiconductor memory array is provided, including: depositing a conductor layer on an insulator layer; depositing a polysilicon layer on the conductor layer; doping the polysilicon layer to form an n-type region; patterning and etching the conductor layer and polysilicon layer to form column lines of the array; depositing an insulator layer on the polysilicon layer; forming holes through the insulator layer; depositing polysilicon films to fill the holes; ion implanting the polysilicon films to form p-n-p regions; patterning and etching the insulator layer to form row lines of the array; depositing a thin insulating layer; depositing polysilicon to form a gate; depositing an additional insulating layer; depositing a bottom electrode, a resistance change material and a top electrode; patterning and etching the layers to form rows; and depositing an insulating layer to cap the resulting layers.

These and other features of the invention will become apparent to those persons skilled in the art upon reading the details of the devices and methods as more fully described below.

BRIEF DESCRIPTION OF THE DRAWINGS

FIGS. 3A-3B illustrate various voltage states applied to terminals of a memory cell or plurality of memory cells, to carry out various functions according to various embodiments of the present invention.

DETAILED DESCRIPTION OF THE INVENTION

Figure 1:
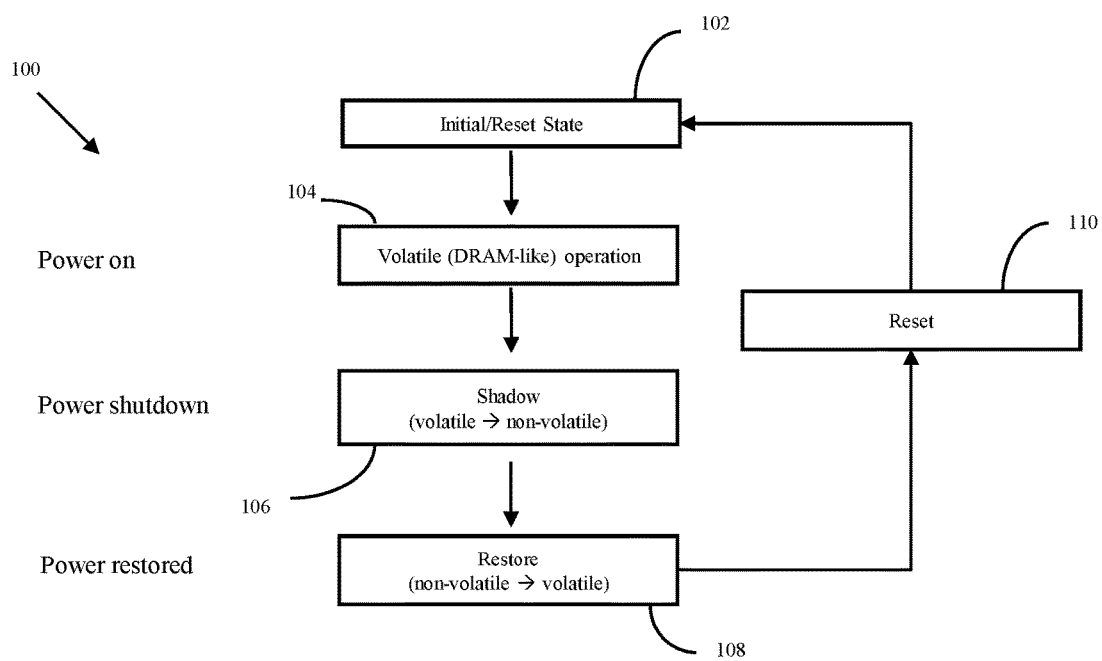
FIG. 1 is a flowchart illustrating operation of a memory device according to the present invention.

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a device" includes a plurality of such devices and reference to "the transistor" includes reference to one or more transistors and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The terms "shadowing" "shadowing operation" and "shadowing process" refer to a process of copying the content of volatile memory to non-volatile memory.

"Restore", "restore operation", or "restore process", as used herein, refers to a process of copying the content of non-volatile memory to volatile memory.

"Reset", "reset operation", or "reset process", as used herein, refers to a process of setting non-volatile memory to a predetermined state following a restore process, or when otherwise setting the non-volatile memory to an initial state (such as when powering up for the first time, prior to ever storing data in the non-volatile memory, for example).

When a terminal is referred to as being "left floating", this means that the terminal is not held to any specific voltage, but is allowed to float to a voltage as driven by other electrical forces with the circuit that it forms a part of.

A "resistance change material" refers to a material which resistivity can be modified by means of electrical signals.

DESCRIPTION

FIG. 1 is a flowchart 100 illustrating operation of a memory device according to an embodiment of the present invention. At event 102, when power is first applied to a memory device having volatile and non-volatile operation modes, the memory device is placed in an initial state, in a volatile operational mode and the nonvolatile memory is set to a predetermined state. At event 104 the memory device of the present invention operates in the same manner as a conventional DRAM memory cell, i.e., operating as volatile memory. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data held in volatile memory is lost. Shadowing can also be performed during backup operations, which may be performed at regular intervals during DRAM operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period that is longer than the time period required to perform the shadowing process with careful consideration of the non-volatile memory reliability.

After the content of the volatile memory has been moved during a shadowing operation to nonvolatile memory, the shutdown of the memory device occurs, as power is no longer supplied to the volatile memory. At this time, the memory device retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device is again set to the initial state (event 102) and again operates in a volatile mode, like a DRAM memory device, event 104.

The present invention thus provides a memory device which combines the fast operation of volatile memories with the ability to retain charge that is provided in nonvolatile memories. Further, the data transfer from the volatile mode to the non-volatile mode and vice versa, operate in parallel by a non-algorithmic process described below, which greatly enhances the speed of operation of the storage device. As one non-limiting practical application of use of a memory device according to the present invention, a description of operation of the memory device in a personal computer follows. This example is in no way intended to limit the applications in which the present invention may be used, as there are many applications, including, but not limited to: cell phones, laptop computers, desktop computers, kitchen appliances, land line phones, electronic gaming, video games, personal organizers, mp3 and other electronic forms of digital music players, and any other applications, too numerous to mention here, that use digital memory. In use, the volatile mode provides a fast access speed and is what is used during normal operations (i.e., when the power is on to the memory device). In an example of use in a personal computer (PC), when the power to the PC is on (i.e., the PC is turned on), the memory device according to the present invention operates in volatile mode. When the PC is shut down (i.e., power is turned off), the memory content of the volatile memory is shadowed to the non-volatile memory of the memory device according to the present invention. When the PC is turned on again (power is turned on), the memory content is restored from the non-volatile memory to the volatile memory. A reset process is then conducted on the non-volatile memory so that its data does not interfere with the data having been transferred to the volatile memory.

Figure 2:
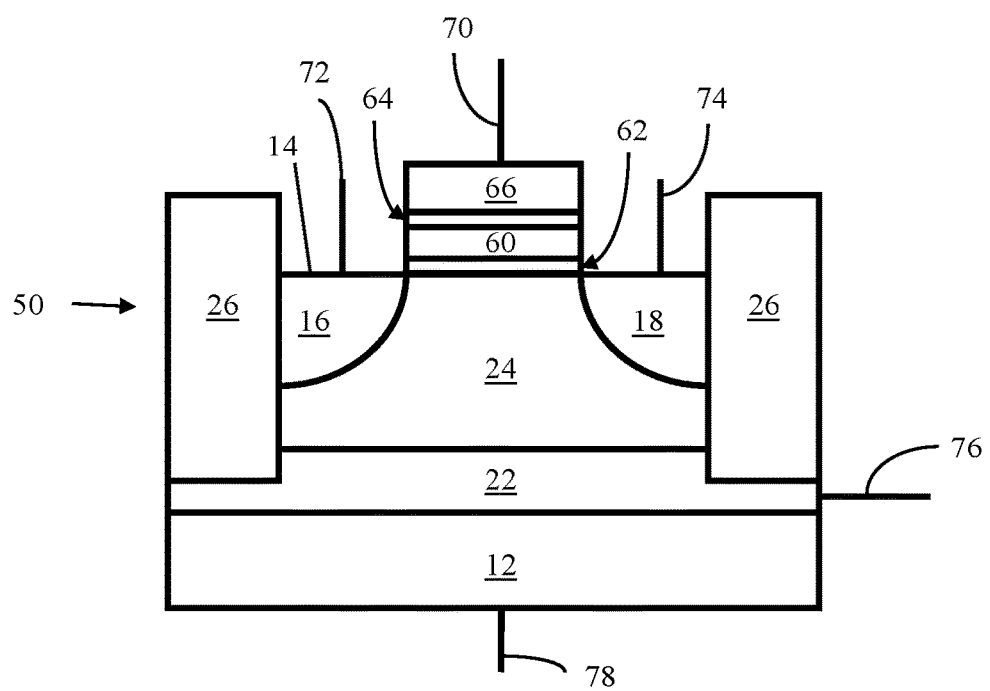
FIG. 2 schematically illustrates an embodiment of a memory cell according to the present invention.

FIG. 2 schematically illustrates an embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 is also formed by an ion implantation process on the material of substrate 12. A body region 24 of the substrate 12 is bounded by surface 14, first and second regions 16,18 and insulating layers 26 (e.g. shallow trench isolation (STI)), which may be made of silicon oxide, for example. Insulating layers 26 insulate cell 50 from neighboring cells 50 when multiple cells 50 are joined to make a memory device. A floating gate or trapping layer 60 is positioned in between the regions 16 and 18, and above the surface 14. Trapping layer/floating gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. Floating gate/trapping layer 60 may be made of polysilicon material. If a trapping layer is chosen, the trapping layer may be made from silicon nitride or silicon nanocrystal, etc. Whether a floating gate 60 or a trapping layer 60 is used, the function is the same, in that they hold data in the absence of power. The primary difference between the floating gate 60 and the trapping layer 60 is that the floating gate 60 is a conductor, while the trapping layer 60 is an insulator layer. Thus, typically one or the other of trapping layer 60 and floating gate 60 are employed in device 50, but not both.

A control gate 66 is positioned above floating gate/trapping layer 60 and insulated therefrom by insulating layer 64 such that floating gate/trapping layer 60 is positioned between insulating layer 62 and surface 14 underlying floating gate/trapping layer 60, and insulating layer 64 and control gate 66 positioned above floating gate/trapping layer 60, as shown. Control gate 66 is capacitively coupled to floating gate/trapping layer 60. Control gate 66 is typically made of polysilicon material or metal gate electrode, such as tungsten, tantalum, titanium and their nitrides. The relationship between the floating gate/trapping layer 60 and control gate 66 is similar to that of a nonvolatile stacked gate floating gate/trapping layer memory cell. The floating gate/trapping layer 60 functions to store non-volatile memory data and the control gate 66 is used for memory cell selection.

The cell 50 in FIG. 2 includes five terminals: word line (WL) terminal 70, source line (SL) terminal 72, bit line (BL) terminal 74, buried well (BW) terminal 76 and substrate terminal 78. Terminal 70 is connected to control gate 66. Terminal 72 is connected to first region 16 and terminal 74 is connected to second region 18. Alternatively, terminal 72 can be connected to second region 18 and terminal 74 can be connected to first region 16. Terminal 76 is connected to buried layer 22. Substrate terminal 78 is connected to substrate 12 below buried layer 22.

When power is applied to cell 50, cell 50 operates like a currently available capacitorless DRAM cell. In a capacitorless DRAM device, the memory information (i.e., data that is stored in memory) is stored as charge in the floating body of the transistor, i.e., in the body 24 of cell 50. The presence of the electrical charge in the floating body 24 modulates the threshold voltage of the cell 50, which determines the state of the cell 50.

FIGS. 3A-3B illustrates relative voltages that can be applied to the terminals of memory cell 50 to perform various volatile mode operations. A read operation can be performed on memory cell 50 through the following bias condition. A neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage more positive than the voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a substantially neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage is applied to WL terminal 70, with the voltage applied to BL terminal 74 being more positive than the voltage applied to terminal

70. If cell 50 is in a state "1" having holes in the body region 24, then the parasitic bipolar transistor formed by the SL terminal 72, floating body 24, and BL terminal 74 will be turned on and a higher cell current is observed compared to when cell 50 is in a state "0" having no holes in body region 24. In one particular non-limiting embodiment, about 0.0 volts is applied to terminal 72, about +3.0 volts is applied to terminal 74, about +0.5 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a positive voltage is applied to the substrate terminal 78, a substantially neutral voltage is applied to BL terminal 74, and a positive voltage is applied to WL terminal 70. Terminals 72 and 76 are left floating. Cell 50 provides a P1-N2-P3-N4 silicon controlled rectifier device, with substrate 78 functioning as the P1 region, buried layer 22 functioning as the N2 region, body region 24 functioning as the P3 region and region 16 or 18 functioning as the N4 region. The functioning of the silicon controller rectifier device is described in further detail in application Ser. No. 12/533,661 filed Jul. 31, 2009 and titled "Methods of Operating Semiconductor Memory Device with Floating Body Transistor Using Silicon Controlled Rectifier Principle". Application Ser. No. 12/533,661 is hereby incorporated herein, in its entirety, by reference thereto. In this example, the substrate terminal 78 functions as the anode and terminal 72 or terminal 74 functions as the cathode, while body region 24 functions as a p-base to turn on the SCR device. If cell 50 is in a state "1" having holes in the body region 24, the silicon controlled rectifier (SCR) device formed by the substrate, buried well, floating body, and the BL junction will be turned on and a higher cell current is observed compared to when cell 50 is in a state "0" having no holes in body region 24. A positive voltage is applied to WL terminal 70 to select a row in the memory cell array 80 (e.g., see FIGS. 23A-23B), while negative voltage is applied to WL terminal 70 for any unselected rows. The negative voltage applied reduces the potential of floating body 24 through capacitive coupling in the unselected rows and turns off the SCR device of each cell 50 in each unselected row. In one particular non-limiting embodiment, about +0.8 volts is applied to terminal 78, about +0.5 volts is applied to terminal 70 (for the selected row), and about 0.0 volts is applied to terminal 74, while terminals 72 and 76 are left floating. However, these voltage levels may vary.

Figure 4:
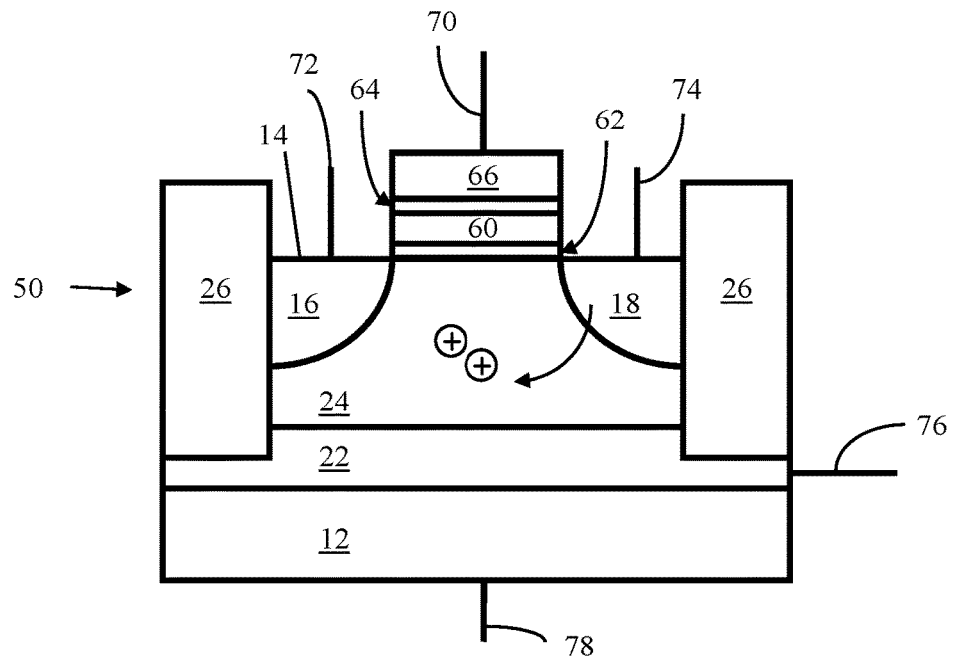
FIG. 4 illustrates write state "1" operations that can be carried out on a memory cell according to the present invention.

FIG. 4 illustrate a write state "1" operation that can be carried out on cell 50 according to an embodiment of the invention, by performing band-to-band tunneling hot hole injection or impact ionization hot hole injection. To write state "1" using a band-to-band tunneling hot hole injection mechanism, the following voltages are applied to the terminals: a positive voltage is applied to BL terminal 74, a neutral voltage is applied to SL terminal 72, a negative voltage is applied to WL terminal 70, a positive voltage less than the positive voltage applied to terminal 74 is applied to BW terminal 76, and a neutral voltage is applied to the substrate terminal 78. Under these conditions, holes are injected from BL terminal 74 into the floating body region 24, leaving the body region 24 positively charged. In one particular non-limiting embodiment, a charge of about 0.0 volts is applied to terminal 72, a voltage of about +2.0 volts is applied to terminal 74, a voltage of about −1.2 volts is applied to terminal 70, a voltage of about +0.6 volts is applied to terminal 76, and about 0.0 volts is applied to terminal 78. However, these voltage levels may vary, while maintaining the relative relationships between the charges applied, as described above.

Alternatively, to write state "1" using an impact ionization hot hole injection mechanism, the following voltages are applied to the terminals: a positive voltage is applied to BL terminal 74, a neutral voltage is applied to SL terminal 72, a positive voltage is applied to WL terminal 70, a positive voltage less than the positive voltage applied to BL terminal 74 is applied to BW terminal 76, and a neutral voltage is applied to the substrate terminal 78. Under these conditions, holes are injected from BL terminal 74 into the floating body region 24, leaving the body region 24 positively charged. In one particular non-limiting embodiment, +0.0 volts is applied to terminal 72, a voltage of about +2.0 volts is applied to terminal 74, a charge of about +0.5 volts is applied to terminal 70, a charge of about +0.6 volts is applied to terminal 76, and about 0.0 volts is applied to terminal 78. However, these voltage levels may vary, while maintaining the relative relationships between the charges applied, as described above.

For example, voltage applied to terminal 72 may be in the range of about 0.0 volts to about +0.4 volts, voltage applied to terminal 74 may be in the range of about +1.5 volts to about +3.0 volts, voltage applied to terminal 70 may be in the range of about 0.0 volts to about −3.0 volts, and voltage applied to terminal 76 may be in the range of about 0.0 volts to about +1.0 volts. Further, the voltages applied to terminals 72 and 74 may be reversed, and still obtain the same result, e.g., a positive voltage applied to terminal 72 and a neutral charge applied to terminal 74. For example, voltage applied to terminal 72 may be in the range of about 0.0 volts to about +0.6 volts, voltage applied to terminal 74 may be in the range of about +1.5 volts to about +3.0 volts, voltage applied to terminal 70 may be in the range of about 0.0 volts to about +1.6 volts, and voltage applied to terminal 76 may be in the range of about 0.0 volts to about 1.0 volts. Further, the voltages applied to terminals 72 and 74 may be reversed, and still obtain the same result, e.g., a positive voltage applied to terminal 72 and a neutral charge applied to terminal 74.

In an alternate write state "1" using impact ionization mechanism, a positive bias can be applied to substrate terminal 78, a positive voltage greater than or equal to the positive voltage applied to substrate terminal 78 is applied to BL terminal 74, a neutral voltage is applied to SL terminal 72, a positive voltage less than the positive voltage applied to terminal 74 is applied to WL terminal 70, while the BW terminal 76 is left floating. The parasitic silicon controlled rectifier device of the selected cell is now turned off due to the negative potential between the substrate terminal 78 and the BL terminal 74. Under these conditions, electrons will flow near the surface of the transistor, and generate holes through the impact ionization mechanism. The holes are subsequently injected into the floating body region 24. In one particular non-limiting embodiment, about +0.0 volts is applied to terminal 72, a voltage of about +2.0 volts is applied to terminal 74, a voltage of about +0.5 volts is applied to terminal 70, and about +0.8 volts is applied to terminal 78, while terminal 76 is left floating. However, these voltage levels may vary, while maintaining the relative relationships between the charges applied, as described above.

Alternatively, the silicon controlled rectifier device of cell 50 can be put into a state "1" (i.e., by performing a write "1" operation) by applying the following bias: a neutral voltage is applied to BL terminal 74, a positive voltage is applied to WL terminal 70, and a positive voltage is applied to the substrate terminal 78, while SL terminal 72 and BW terminal 76 are left floating. The positive voltage applied to the WL terminal 70 will increase the potential of the floating body 24 through capacitive coupling and create a feedback process that turns the SCR device on. Once the SCR device of cell 50 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +3.0 volts is applied to terminal 78. However, these voltage levels may vary, while maintaining the relative relationships between the voltages applied, as described above, e.g., the voltage applied to terminal 78 remains greater than the voltage applied to terminal 74.

Figure 5:
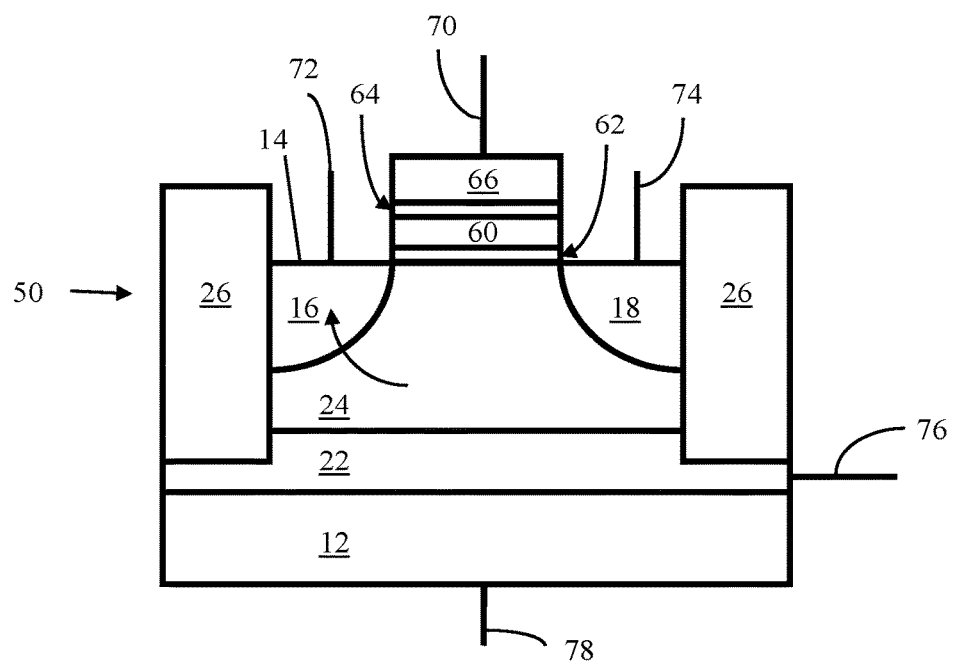
FIG. 5 illustrates a write state "0" operation that can be carried out on a memory cell according to the present invention.

A write "0" operation of the cell 50 is now described with reference to FIG. 3B and FIG. 5. To write "0" to cell 50, a negative bias is applied to SL terminal 72, a neutral voltage is applied to BL terminal 74, a neutral or negative voltage is applied to WL terminal 70, a neutral or positive voltage is applied to BW terminal 76 and a neutral voltage is applied to substrate terminal 78. Under these conditions, the p-n junction (junction between 24 and 18) is forward-biased, evacuating any holes from the floating body 24. In one particular non-limiting embodiment, about −2.0 volts is applied to terminal 72, about −1.2 volts is applied to terminal 70, about 0.0 volts is applied to terminal 74, about +0.6 volts is applied to terminal 76 and about 0.0 volts is applied to terminal 78. However, these voltage levels may vary, while maintaining the relative relationships between the charges applied, as described above. Alternatively, the voltages applied to terminals 72 and 74 may be switched.

Alternatively, a write "0" operation can be performed by putting the silicon controlled rectifier device into the blocking mode. This can be performed by applying the following bias: a positive voltage is applied to BL terminal 74, a positive voltage is applied to WL terminal 70, and a positive voltage equal to or less positive than the positive voltage applied to terminal 74 is applied to the substrate terminal 78, while leaving SL terminal 72 and BW terminal 76 floating. Under these conditions the voltage difference between anode and cathode, defined by the voltages at substrate terminal 78 and BL terminal 74, will become too small to maintain the SCR device in conducting mode. As a result, the SCR device of cell 50 will be turned off. In one particular non-limiting embodiment, a voltage of about +0.8 volts is applied to terminal 74, a voltage of about +0.5 volts is applied to terminal 70, and about +0.8 volts is applied to terminal 78. However, these voltage levels may vary, while maintaining the relative relationships between the charges applied, as described above.

Figure 6:
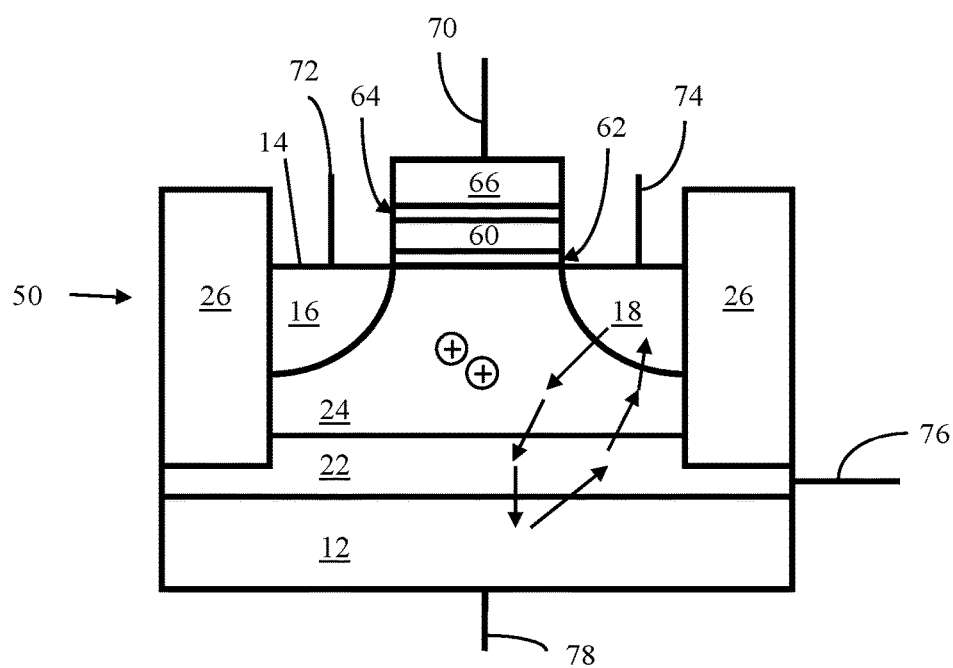
FIG. 6 illustrates a holding operation that can be carried out on a memory cell according to an embodiment of the present invention.

A holding or standby operation is described with reference to FIGS. 3B and 6. Such holding or standby operation is implemented to enhance the data retention characteristics of the memory cells 50. The holding operation can be performed by applying the following bias: a substantially neutral voltage is applied to BL terminal 74, a neutral or negative voltage is applied to WL terminal 70, and a positive voltage is applied to the substrate terminal 78, while leaving SL terminal 72 and BW terminal 76 floating. Under these conditions, if memory cell 50 is in memory/data state "1" with positive voltage in floating body 24, the SCR device of memory cell 50 is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 50 can be refreshed by periodically applying a positive voltage pulse through substrate terminal 78. Those memory cells 50 that are commonly connected to substrate terminal 78 and which have a positive voltage in body region 24 will be refreshed with a "1" data state, while those memory cells 50 that are commonly connected to the substrate terminal 78 and which do not have a positive voltage in body region 24 will remain in blocking mode, since their SCR device will not be turned on, and therefore memory state "0" will be maintained in those cells. In this way, all memory cells 50 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships therebetween. Alternatively, the voltage described above as being applied to terminal 74 may be applied to terminal 72 and terminal 74 may be left floating.

Figure 7A:
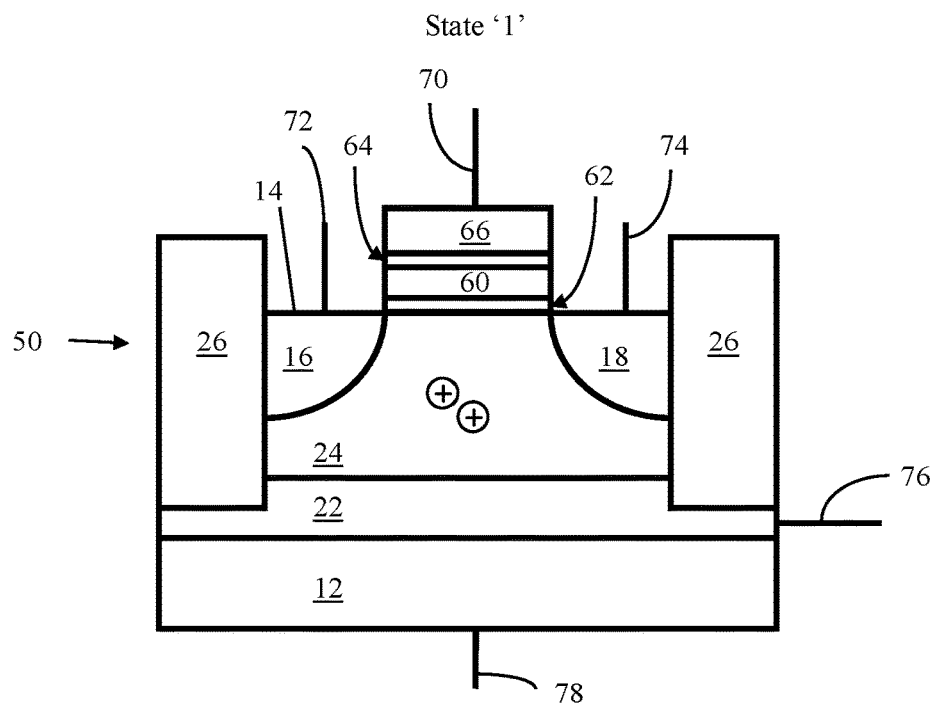
FIGS. 7A and 7B illustrate shadowing operations according to the present invention.
Figure 7B:
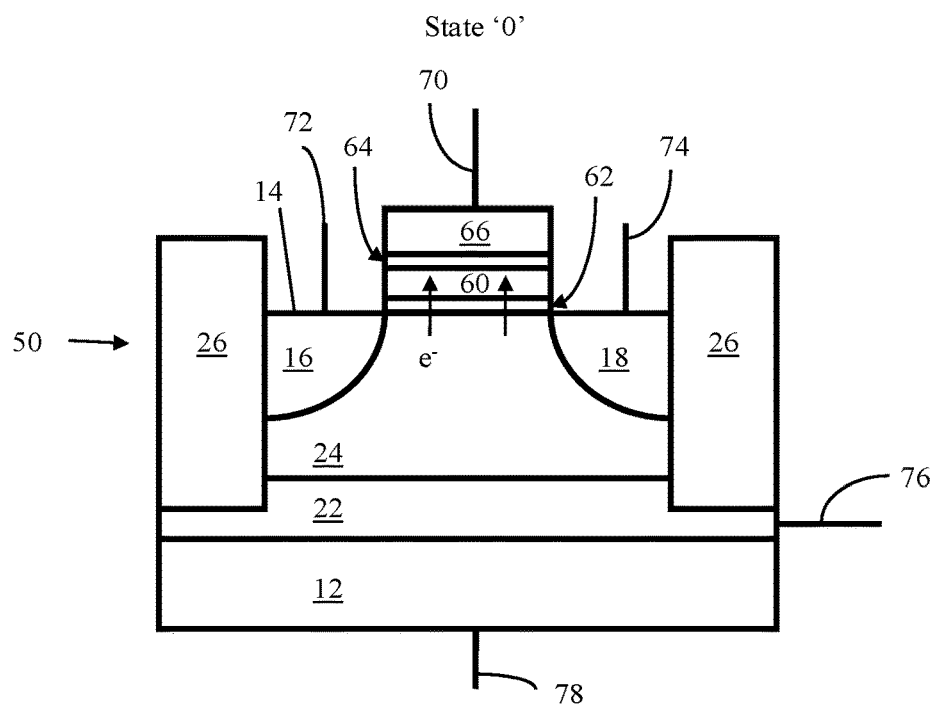

When power down is detected, e.g., when a user turns off the power to cell 50, or the power is inadvertently interrupted, or for any other reason, power is at least temporarily discontinued to cell 50, data stored in the floating body region 24 is transferred to floating gate/trapping layer 60. This operation is referred to as "shadowing" and is described with reference to FIGS. 7A and 7B. To perform the shadowing operation, both SL terminal 72 and BL terminal 74 are left floating (i.e., not held to any specific voltage, but allowed to float to their respective voltages). A high positive voltage (e.g., about +18 volts) is applied to WL terminal 70, a low positive voltage (e.g., about +0.6 volts) is applied to BW terminal 76, and the substrate terminal 78 is grounded. If cell 50 is in a state "1" as illustrated in FIG. 7A, thus having holes in body region 24, a lower electric field between the floating gate/trapping layer 60 and the floating body region 24 is observed in comparison to the electric field observed between the floating gate/trapping layer 60 and the floating body region 24 when cell 50 is in a state "0" as illustrated in FIG. 7B.

The high electric field between the floating gate/trapping layer region 60 and the floating body region 24, when floating body 24 is at state "0" causes electrons to tunnel from floating body 24 to floating gate/trapping layer 60 and the floating gate/trapping layer 60 thus becomes negatively charged. Conversely, the relatively lower electric field existent between the floating gate/trapping layer region 60 and floating body 24 when cell 50 is in the state "1" is not sufficient to cause electron tunneling from the floating body 24 to floating gate/trapping layer 60 and therefore floating gate/trapping layer 60 does not become negatively charged in this situation.

In one particular non-limiting embodiment, terminals 72 and 74 are allowed to float, about +18 volts is applied to terminal 70, about +0.6 volts is applied to terminal 76, and about 0.0 volts is applied to terminal 78. However, these voltage levels may vary, while maintaining the relative relationships between the charges applied, as described above. For example, voltage applied to terminal 70 may be in the range of about +12.0 volts to about +20.0 volts, and voltage applied to terminal 76 may be in the range of about 0.0 volts to about 1.0 volts.

Figure 8A:
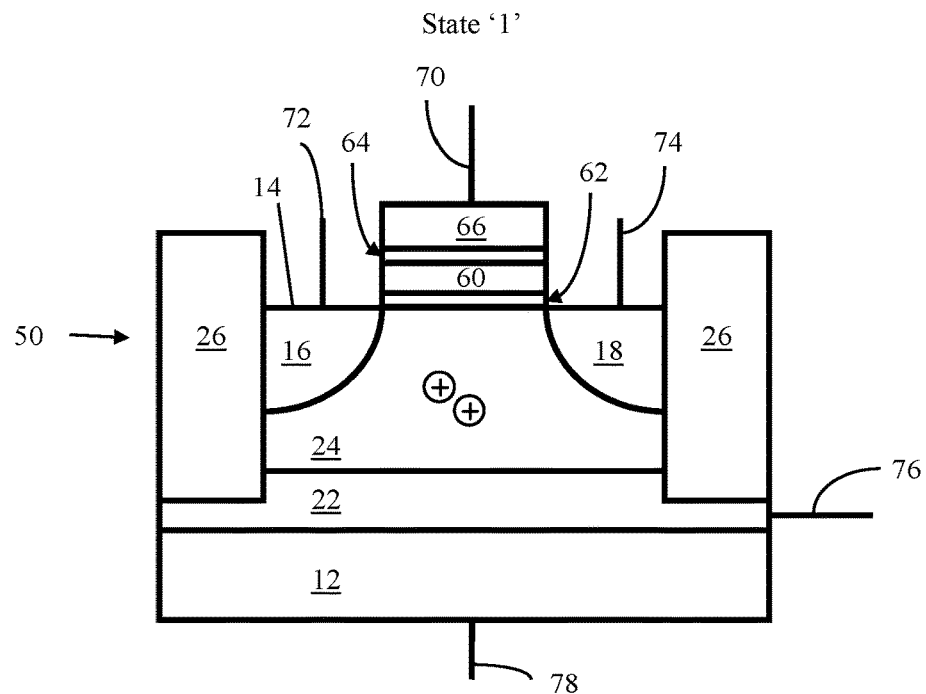
FIGS. 8A and 8B illustrate restore operations according to the present invention.
Figure 8B:
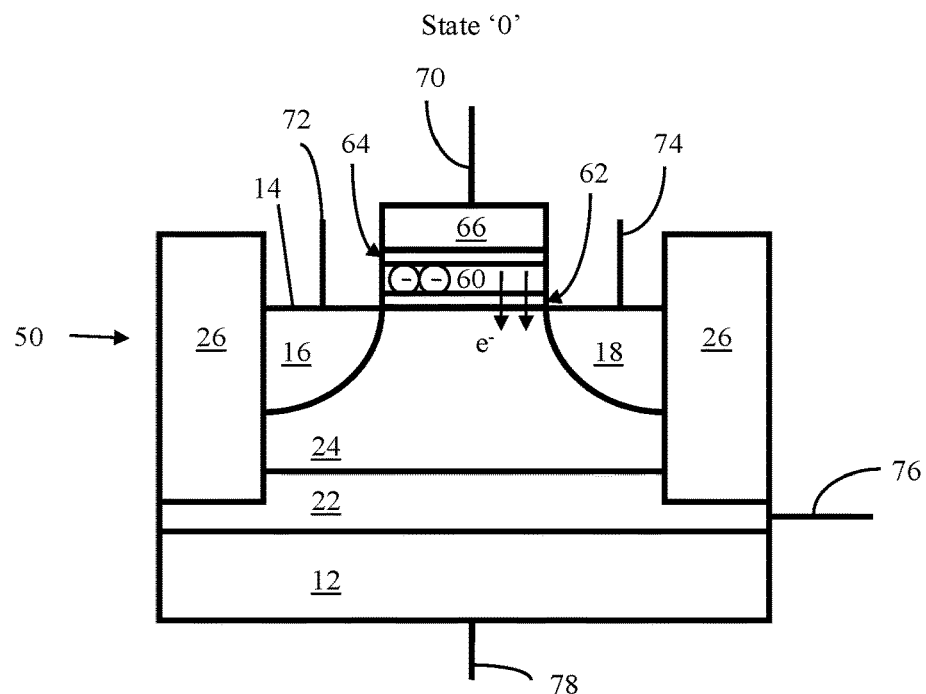

When power is restored to cell 50, the state of the cell 50 as stored on floating gate/trapping layer 60 is restored into floating body region 24. The restore operation (data restoration from non-volatile memory to volatile memory) is described with reference to FIGS. 8A and 8B. Prior to the restore operation/process, the floating body 24 is set to a positive charge, i.e., a "1" state is written to floating body 24. In one embodiment, to perform the restore operation, both SL terminal 72 and BL terminal 74 are left floating. A large negative voltage is applied to WL terminal 70 and a low positive voltage is applied to BW terminal 76, while substrate terminal 78 is grounded. If the floating gate/trapping layer 60 is not negatively charged, no electrons will tunnel from floating gate/trapping layer 60 to floating body 24, and cell 50 will therefore be in a state "1". Conversely, if floating gate/trapping layer 60 is negatively charged, electrons tunnel from floating gate/trapping layer 60 into floating body 24, thereby placing cell 50 in a state "0". In one particular non-limiting embodiment, about −18.0 volts is applied to terminal 70, and about +0.6 volts is applied to terminal 76. However, these voltage levels may vary, while maintaining the relative relationships between the charges applied, as described above. For example, voltage applied to terminal 70 may be in the range of about −12.0 volts to about −20.0 volts, and voltage applied to terminal 76 may be in the range of about 0.0 volts to about +1.0 volts, while about 0.0 volts is applied to terminal 78.

Note that this process occurs non-algorithmically, as the state of the floating gate/trapping layer 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention. Similarly, it is noted that the shadowing process also is performed as a non-algorithmic process. From these operations, it has been shown that cell 50 provides a memory cell having the advantages of a DRAM cell, but where non-volatility is also achieved.

FIGS. 9A-9D illustrate another embodiment of operation of cell 50 to perform a volatile to non-volatile shadowing process, which operates by a hot electron injection process, in contrast to the tunneling process (e.g., Fowler-Nordheim tunneling process) described above with regard to FIGS. 7A-7B. FIG. 9E illustrates the operation of an NPN bipolar device 90, as it relates to the operation of cell 50. Floating body 24 is represented by the terminal to which voltage $V_{FB}$ is applied in FIG. 9E, and the terminals 72 and 74 are represented by terminals to which voltages $V_{SL}$ and $V_{BL}$ are applied, respectively. When $V_{FB}$ is a positive voltage, this turns on the bipolar device 90, and when $V_{FB}$ is a negative or neutral voltage, the device 90 is turned off. Likewise, when floating body 24 has a positive voltage, this turns on the cell 50 so that current flows through the NPN junction formed by 16, 24 and 18 in the direction indicated by the arrow in floating body 24 in FIG. 9A, and when floating body 24 has a negative or neutral voltage, cell is turned off, so that there is no current flow through the NPN junction.

Figure 9A:
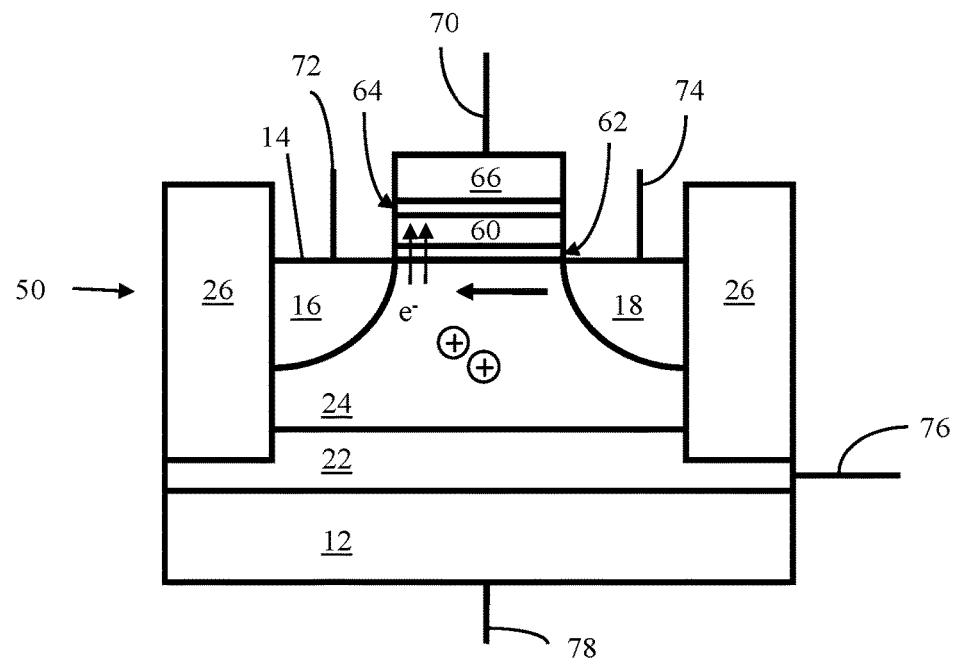
FIGS. 9A-9D illustrate another embodiment of operation of a memory cell to perform volatile to non-volatile shadowing according to the present invention.
Figure 9B:
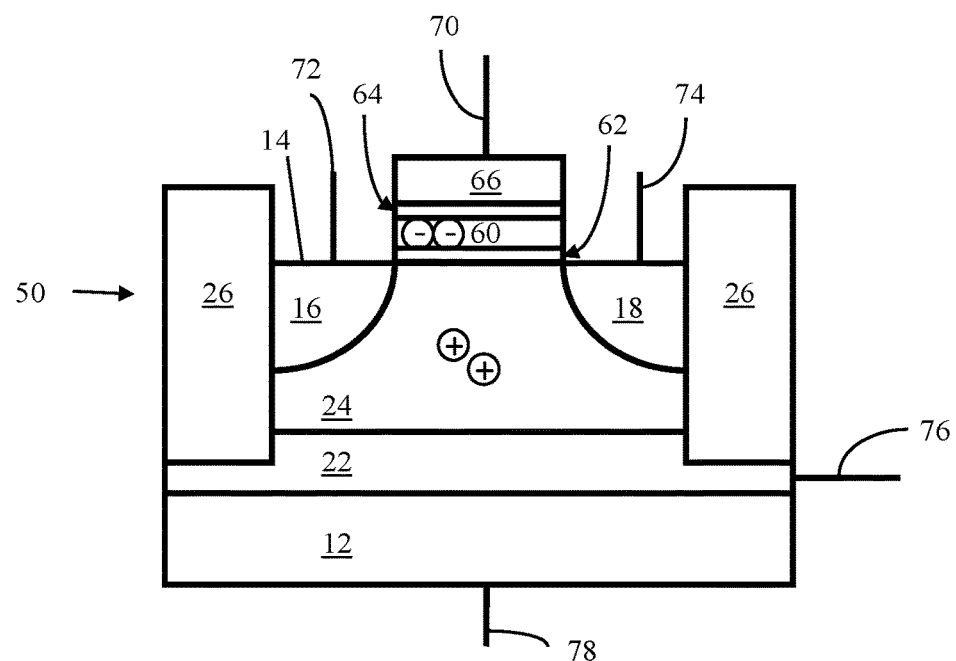

To perform a shadowing process according to the embodiment described with regard to FIGS. 9A-9D, a high positive voltage is applied to terminal 72 and a substantially neutral voltage is applied to terminal 74. Alternatively, a high positive voltage can be applied to terminal 74 and a substantially neutral voltage can be applied to terminal 72. A positive voltage less than the positive voltage applied to terminal 72 or 74 is applied to terminal 70 and a low positive voltage less than the positive voltage applied to terminal 72 or 74 is applied to terminal 76. A high voltage in this case is a voltage greater than or equal to about +3 volts. In one example, a voltage in the range of about +3 to about +6 volts is applied, although it is possible to apply a higher voltage. The floating gate/trapping layer 60 will have been previously initialized or reset to have a positive charge prior to the operation of the cell 50 to store data in non-volatile memory via floating body 24. When floating body 24 has a positive charge/voltage, the NPN junction is on, as noted above, and electrons flow in the direction of the arrow shown in the floating body 24 in FIG. 9A. The application of the high voltage to terminal 72 at 16 energizes/accelerates electrons traveling through the floating body 24 to a sufficient extent that they can "jump over" the oxide barrier between floating body 24 and floating gate/trapping layer 60, so that electrons enter floating gate/trapping layer 60 as indicated by the arrow into floating gate/trapping layer 60 in FIG. 9A. Accordingly, floating gate/trapping layer 60 becomes negatively charged by the shadowing process, when the volatile memory of cell 50 is in state "1" (i.e., floating body 24 is positively charged), as shown in FIG. 9B.

Figure 9C:
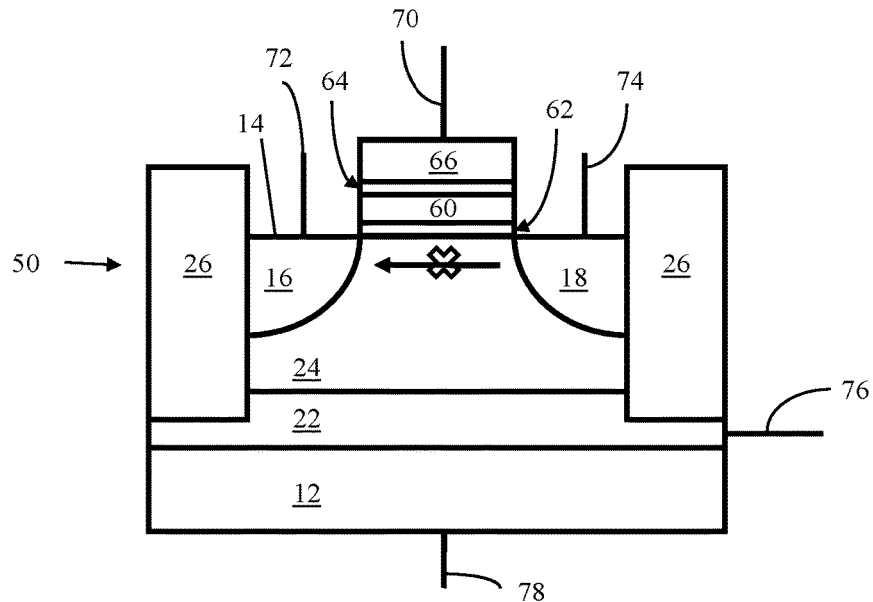
Figure 9D:
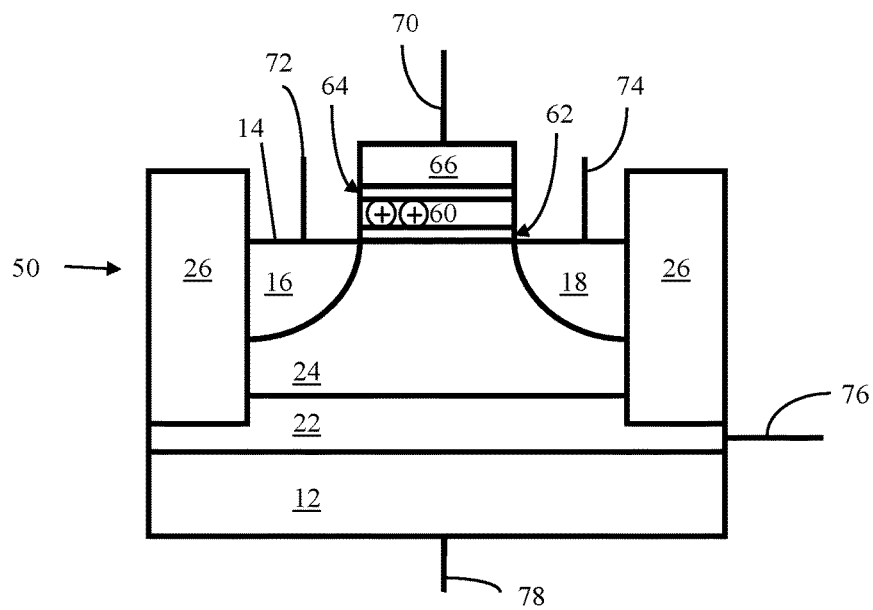
Figure 9E:
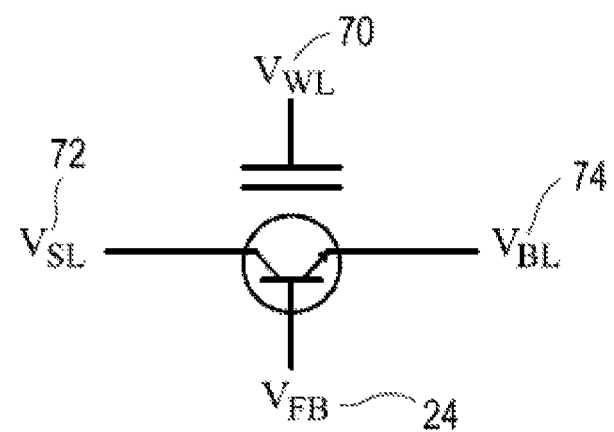
FIG. 9E illustrates the operation of an NPN bipolar device.

When volatile memory of cell 50 is in state "0", i.e., floating body 24 has a negative or neutral charge/voltage, the NPN junction is off, as noted above, and electrons do not flow in the floating body 24, as illustrated in FIG. 9C. Accordingly, when voltages are applied to the terminals as described above, in order to perform the shadowing process, the high positive voltage applied to terminal 72 does not cause an acceleration of electrons in order to cause hot electron injection into floating gate/trapping layer 60, since the electrons are not flowing. Accordingly, floating gate/trapping layer 60 retains its positive charge at the end of the shadowing process, when the volatile memory of cell 50 is in state "0" (i.e., floating body 24 is neutral or negatively charged), as shown in FIG. 9D. Note that the charge state of the floating gate/trapping layer 60 is complementary to the charge state of the floating body 24 after completion of the shadowing process. Thus, if the floating body 24 of the memory cell 50 has a positive charge in volatile memory, the floating gate/trapping layer 60 will become negatively charged by the shadowing process, whereas if the floating body of the memory cell 50 has a negative or neutral charge in volatile memory, the floating gate/trapping layer 60 will be positively charged at the end of the shadowing operation. The charges/states of the floating gates/trapping layers 60 are determined non-algorithmically by the states of the floating bodies, and shadowing of multiple cells occurs in parallel, therefore the shadowing process is very fast.

In one particular non-limiting example of the shadowing process according to this embodiment, about +3 volts are applied to terminal 72, about 0 volts are applied to terminal 74, about +1.2 volts are applied to terminal 70, about +0.6 volts are applied to terminal 76, and about 0.0 volts is applied to terminal 78. However, these voltage levels may vary, while maintaining the relative relationships between the charges applied, as described above. For example, voltage applied to terminal 72 may be in the range of about +3 volts to about +6 volts, the voltage applied to terminal 74 may be in the range of about 0.0 volts to about +0.4 volts, the voltage applied to terminal 70 may be in the range of about 0.0 volts to about +1.6 volts, and voltage applied to terminal 76 may be in the range of about 0.0 volts to about +1.0 volts, while about 0.0 volts is applied to terminal 78.

Figure 10A:
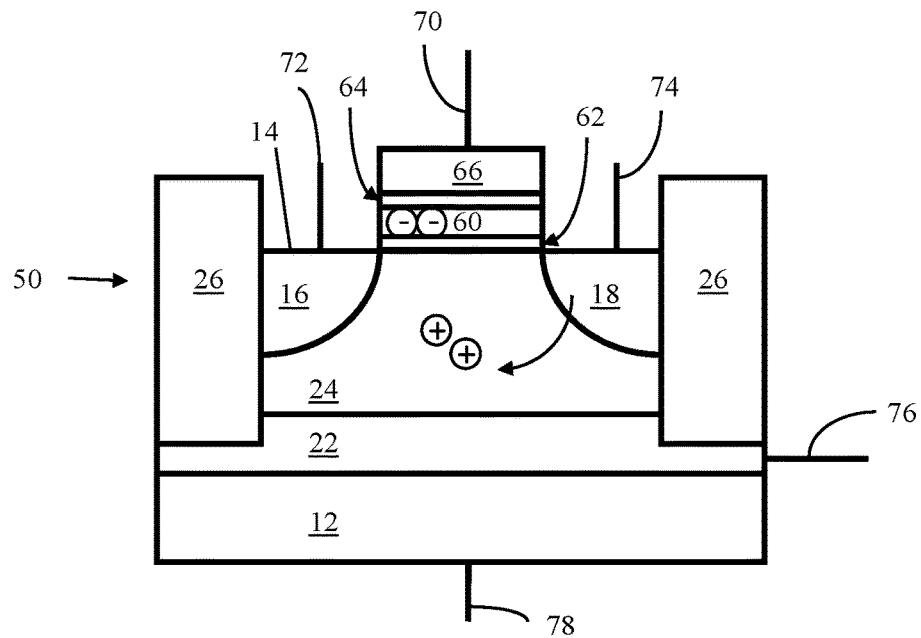
FIGS. 10A-10B illustrate another embodiment of operation of a memory cell to perform a restore process from non-volatile to volatile memory according to the present invention.
Figure 10B:
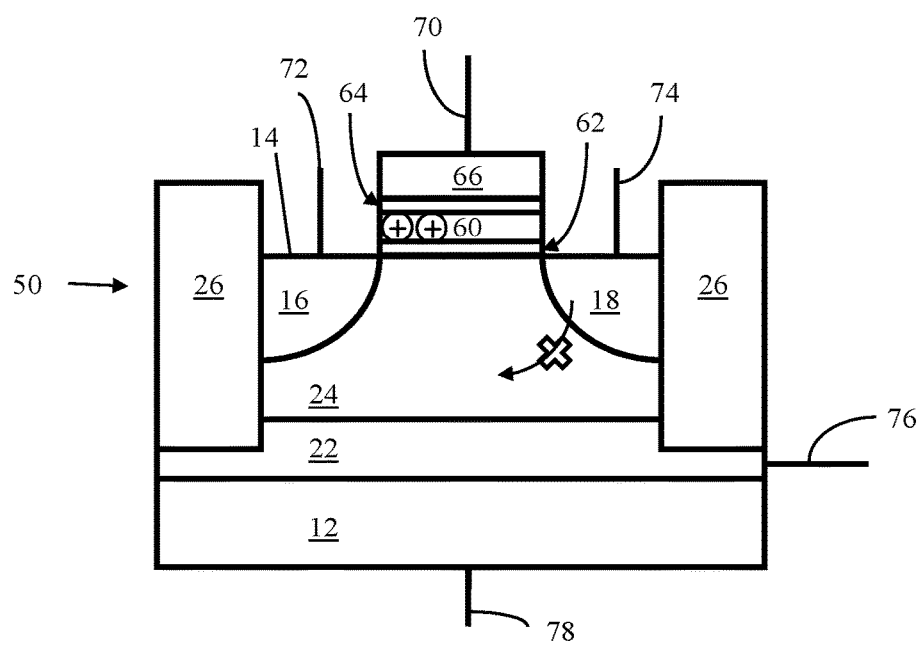

Turning now to FIGS. 10A-10B, another embodiment of operation of cell 50 to perform a restore process from non-volatile to volatile memory is schematically illustrated, in which the restore process operates by a band-to-band tunneling hot hole injection process (modulated by the floating gate/trapping layer 60 charge), in contrast to the electron tunneling process described above with regard to FIGS. 8A-8B. In the embodiment illustrated in FIGS. 10A-10B, the floating body 24 is set to a neutral or negative charge prior to performing the restore operation/process, i.e., a "0" state is written to floating body 24. In the embodiment of FIGS. 10A-10B, to perform the restore operation, terminal 72 is set to a substantially neutral voltage, a positive voltage is applied to terminal 74, a negative voltage is applied to terminal 70, a positive voltage that is less positive than the positive voltage applied to terminal 74 is applied to terminal 76, and a substantially neutral voltage is applied to terminal 78. If the floating gate/trapping layer 60 is negatively charged, as illustrated in FIG. 10A, this negative charge enhances the driving force for the band-to-band hot hole injection process, whereby holes are injected from the n-region 18 into floating body 24, thereby restoring the "1" state that the volatile memory cell 50 had held prior to the performance of the shadowing operation. If the floating gate/trapping layer 60 is not negatively charged, such as when the floating gate/trapping layer 60 is positively charged as shown in FIG. 10B or is neutral, the hot band-to-band hole injection process will not occur, as illustrated in FIG. 10B, resulting in memory cell 50 having a "0" state, just as it did prior to performance of the shadowing process. Accordingly, if floating gate/trapping layer 60 has a positive charge after shadowing is performed, the volatile memory of floating body 24 will be restored to have a negative charge ("0" state), but if the floating gate/trapping layer 60 has a negative or neutral charge, the volatile memory of floating body 24 will be restored to have a positive charge ("1" state).

In one particular non-limiting example of this embodiment, about 0 volts is applied to terminal 72, about +2 volts is applied to terminal 74, about −1.2 volts is applied to terminal 70, about +0.6 volts is applied to terminal 76, and about 0.0 volts is applied to terminal 78. However, these voltage levels may vary, while maintaining the relative relationships between the charges applied, as described above. For example, voltage applied to terminal 72 may be in the range of about +1.5 volts to about +3.0 volts, voltage applied to terminal 74 may be in the range of about 0.0 volts to about +0.6 volts, voltage applied to terminal 70 may be in the range of about 0.0 volts to about −3.0 volts, voltage applied to terminal 76 may be in the range of about 0.0 volts to about +1.0 volts, and about 0.0 volts is applied to terminal 78.

Note that this process occurs non-algorithmically, as the state of the floating gate/trapping layer 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention. From these operations, it has been shown that cell 50 provides a memory cell having the advantages of a DRAM cell, but where non-volatility is also achieved.

After restoring the memory cell(s) 50, the floating gate(s)/trapping layer(s) 60 is/are reset to a predetermined state, e.g., a positive state, so that each floating gate/trapping layer 60 has a known state prior to performing another shadowing operation. The reset process operates by the mechanism of electron tunneling from the floating gate/trapping layer 60 to the source region 16, as illustrated in FIG. 11.

Figure 11:
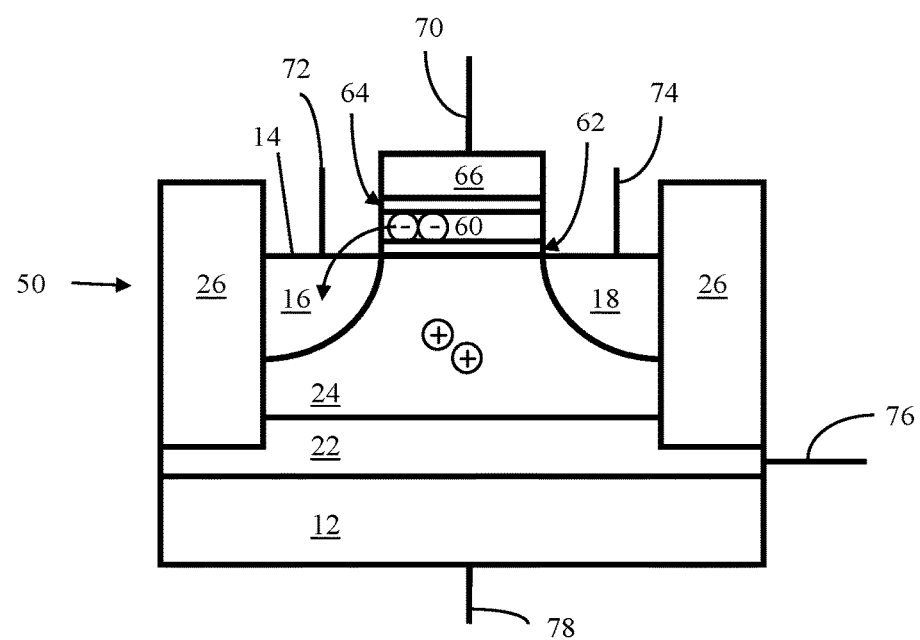
FIG. 11 illustrates resetting the floating gate(s)/trapping layer(s) to a predetermined state.

To perform a reset operation according to the embodiment of FIG. 11, a highly negative voltage is applied to terminal 70, a substantially neutral voltage is applied to SL terminal 72, BL terminal 74 is allowed to float or is grounded, a positive voltage is applied to terminal 76, while substrate terminal 78 is grounded. By applying a neutral voltage to terminal 72 and maintaining the voltage of region 16 to be substantially neutral, this causes region 16 to function as a sink for the electrons from floating gate/trapping layer 60 to travel to by electron tunneling. A large negative voltage is applied to WL terminal 70 and a low positive voltage is applied to BW terminal 76. If the floating gate/trapping layer 60 is negatively charged, electrons will tunnel from floating gate/trapping layer 60 to region 16, and floating gate/trapping layer 60 will therefore become positively charged. As a result of the reset operation, all of the floating gate/trapping layers will become positively charged. In one particular non-limiting embodiment, about −18.0 volts is applied to terminal 70, about +0.6 volts is applied to terminal 76, and about 0.0 volts is applied to terminal 78. However, these voltage levels may vary, while maintaining the relative relationships between the charges applied, as described above. For example, voltage applied to terminal 70 may be in the range of about −12.0 volts to about −20.0 volts, the voltage applied to terminal 76 may be in the range of about 0.0 volts to about 1.0 volts, and about 0.0 volts is applied to terminal 78.

Having described the various operations of cell 50 above, reference is again made to FIG. 1 to describe operation of a memory device having a plurality of memory cells 50. The number of memory cells can vary widely, for example ranging from less than 100 Mb to several Gb, or more. It is noted that, except for the DRAM operations of writing and reading (event 104), which by necessity must be capable of individual, controlled operations, the remaining operations shown in FIG. 1 can all be carried out as parallel, non-algorithmic operations, which results in a very fast operating memory device.

At event 102, the memory device is initialized by first setting all of the floating gates/trapping layers to a positive state, in a manner as described above with reference to FIG. 11, for example. For example, a control line can be used to input a highly negative voltage to each of terminals 70, in parallel, with voltage settings at the other terminals as described above with reference to FIG. 11. Individual bits (or multiple bits, as described below) of data can be read from or written to floating bodies 24 of the respective cells at event 104.

The shadowing operation at event 106 is conducted in a mass parallel, non-algorithmic process, in any of the same manners described above, with each of the cells 50 performing the shadowing operation simultaneously, in a parallel operation. Because no algorithmic interpretation or measurement is required to transfer the data from non-volatile to volatile memory (24 to 60), the shadowing operation is very fast and efficient.

To restore the data into the volatile portion of the memory cells 50 of the memory device (i.e., restore charges in floating bodies 24), a state "0" is first written into each of the floating bodies 24, by a parallel process, and then each of the floating bodies is restored in any of the same manners described above with regard to a restoration process of a single floating body 24. This process is also a mass, parallel non-algorithmic process, so that no algorithmic processing or measurement of the states of the floating gates/trapping layers 60 is required prior to transferring the data stored by the floating gates/trapping layers 60 to the floating bodies 24. Thus, the floating bodies are restored simultaneously, in parallel, in a very fast and efficient process.

Upon restoring the volatile memory at event 108, the floating gates/trapping layers 60 are then reset at event 110, to establish a positive charge in each of the floating gates/trapping layers, in the same manner as described above with regard to initializing at event 110.

Figure 12:
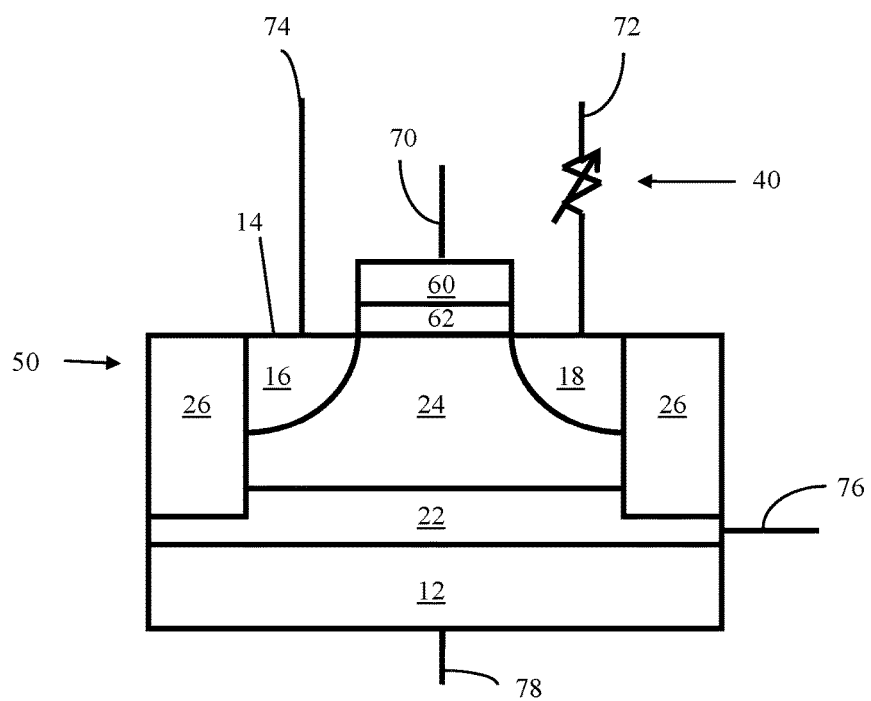
FIG. 12 is a cross-sectional, schematic illustration of a memory cell according to an embodiment of the present invention.

FIG. 12 shows another embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 is also formed by an ion implantation process on the material of substrate 12. A body region 24 of the substrate 12 is bounded by surface 14, first and second regions 16,18 and insulating layers 26 (e.g. shallow trench isolation (STI, which may be made of silicon oxide, for example). Insulating layers 26 insulate cell 50 from neighboring cells 50 when multiple cells 50 are joined to make a memory device. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

A resistance change memory element 40 is positioned above one of the regions 16, 18 (18 in FIG. 12) having second conductivity type and connected to one of the terminals 72, 74 (74 in FIG. 12). The resistance change memory element 40 is shown as a variable resistor, and may be formed from phase change memory material such as a chalcogenide or conductive bridging memory or metal oxide memory, and may take the form of metal-insulator-metal structure, in which transition metal oxide or perovskite metal oxide is used in conjunction with any reasonably good conductors.

Cell 50 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 74 is connected to first region 16 and terminal 72 is connected to resistance change memory element 40 which is, in turn, connected to second region 18. Alternatively, terminal 72 can be connected to resistance change memory element 40 and terminal 74 can be connected to first region 16. Terminal 76 is connected to buried layer 22 and terminal 78 is connected to substrate 12.

Figure 13:
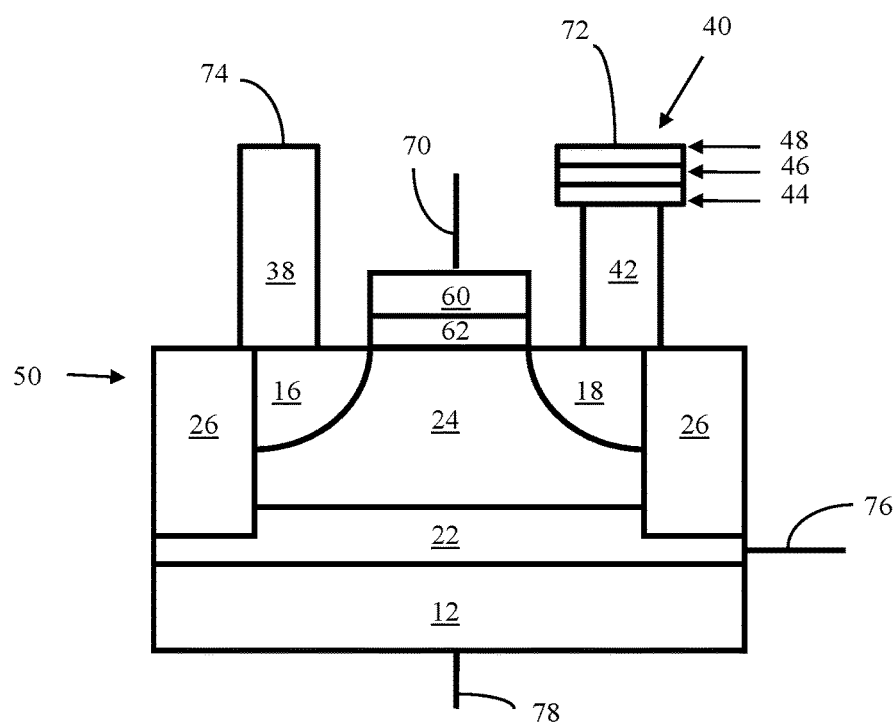
FIG. 13 is a schematic, cross-sectional illustration of a memory cell according to an embodiment of the present invention.

A non-limiting embodiment of the memory cell 50 is shown in FIG. 13. The second conductivity region 16 is connected to an address line terminal 74 through a conductive element 38. The resistance change memory element 40 in this embodiment includes a bottom electrode 44, a resistance change material 46 and a top electrode 48. Resistance change memory element 40 is connected to the second conductivity region 18 on the substrate 12 through a conductive element 42. The resistance change material 46 may be connected to an address line (such as terminal 72 in FIG. 13) through electrode 48 formed from a conductive material. The conductive element 42 may comprise tungsten or silicided silicon materials. Electrodes 44, 48 may be formed from one or more conductive materials, including, but not limited to titanium nitride, titanium aluminum nitride, or titanium silicon nitride. Resistance change material 46 is a material in which properties, such as electrical resistance, can be modified using electrical signals. For the case of phase change memory elements, the resistivity depends on the crystalline phase of the material, while for the metal oxide materials, the resistivity typically depends on the presence or absence of conductive filaments. A crystalline phase of a phase change type resistive change material exhibits a low resistivity (e.g., ~1 k$\Omega$) state and an amorphous phase of that material exhibits a high resistivity state (e.g., >100 k$\Omega$). Examples of phase change material include alloys containing elements from Column VI of the periodic table, such as GeSbTe alloys. Examples of metal-insulator-metal resistance change materials include a variety of oxides such as $Nb_2O_5$, $Al_2O_3$, $Ta_2O_5$, $TiO_2$, and NiO and perovskite metal oxides, such as $SrZrO_3$, $(Pr,Ca)MnO_3$ and $SrTiO_3$:Cr.

When power is applied to cell 50, cell 50 operates like a capacitorless DRAM cell. In a capacitorless DRAM device, the memory information (i.e., data that is stored in memory) is stored as charge in the floating body of the transistor, i.e., in the bodies 24 of the cells 50 of a memory device. The presence of the electrical charge in the floating body 24 modulates the threshold voltage of the cell 50, which determines the state of the cell 50. In one embodiment, the non-volatile memory 40 is initialized to have a low resistance state.

A read operation can be performed on memory cell 50 through the following bias condition. A neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage more positive than the voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a substantially neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage is applied to WL terminal 70, with the voltage applied to BL terminal 74 being more positive than the voltage applied to terminal 70. If cell 50 is in a state "1" having holes in the body region 24, then the parasitic bipolar transistor formed by the SL terminal 72, floating body 24, and BL terminal 74 will be turned on and a higher cell current is observed compared to when cell 50 is in a state "0" having no holes in body region 24. In one particular non-limiting embodiment, about 0.0 volts is applied to terminal 72, about +3.0 volts is applied to terminal 74, about +0.5 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a positive voltage is applied to the substrate terminal 78, a substantially neutral voltage is applied to BL terminal 74, and a positive voltage is applied to WL terminal 70. Cell 50 provides a P1-N2-P3-N4 silicon controlled rectifier device, with substrate 78 functioning as the P1 region, buried layer 22 functioning as the N2 region, body region 24 functioning as the P3 region and region 16 or 18 functioning as the N4 region. The functioning of the silicon controller rectifier device is described in further detail in application Ser. No. 12/533,661 filed Jul. 31, 2009 and titled "Methods of Operating Semiconductor Memory Device with Floating Body Transistor Using Silicon Controlled Rectifier Principle". In this example, the substrate terminal 78 functions as the anode and terminal 72 or terminal 74 functions as the cathode, while body region 24 functions as a p-base to turn on the SCR device. If cell 50 is in a state "1" having holes in the body region 24, the silicon controlled rectifier (SCR) device formed by the substrate, buried well, floating body, and the BL junction will be turned on and a higher cell current is observed compared to when cell 50 is in a state "0" having no holes in body region 24. A positive voltage is applied to WL terminal 70 to select a row in the memory cell array 80 (e.g., see FIGS. 23A-B), while negative voltage is applied to WL terminal 70 for any unselected rows. The negative voltage applied reduces the potential of floating body 24 through capacitive coupling in the unselected rows and turns off the SCR device of each cell 50 in each unselected row. In one particular non-limiting embodiment, about +0.8 volts is applied to terminal 78, about +0.5 volts is applied to terminal 70 (for the selected row), and about 0.0 volts is applied to terminal 74. However, these voltage levels may vary.

Figure 14:
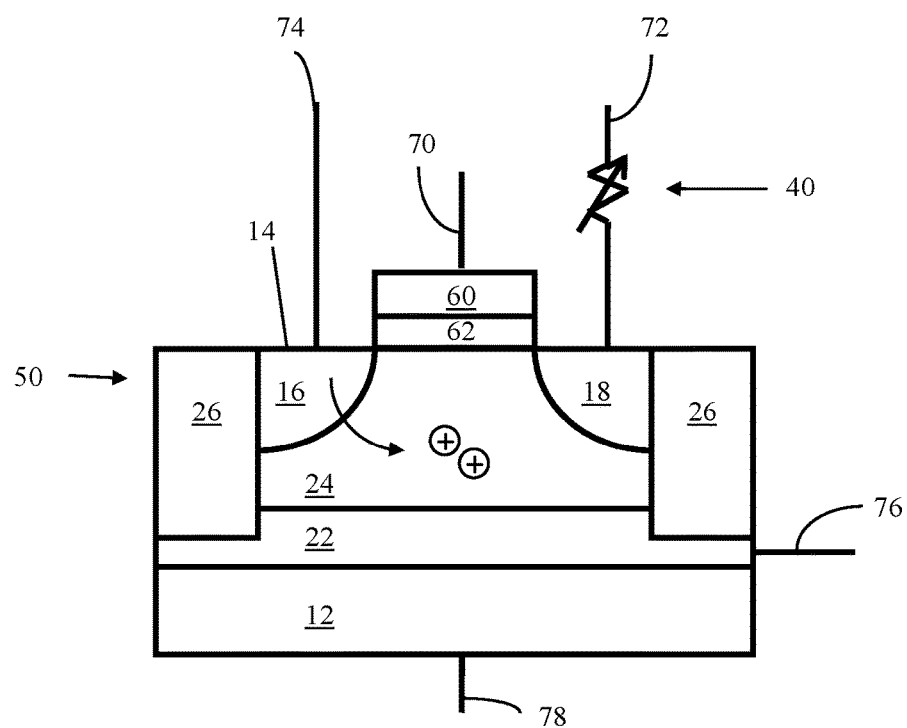
FIG. 14 is a schematic illustrating an operating condition for a write state "1" operation that can be carried out on a memory cell according to an embodiment of the present invention.

FIG. 14 illustrates write state "1" operations that can be carried out on cell 50, by performing band-to-band tunneling hot hole injection or impact ionization hot hole injection. To write state "1" using band-to-band tunneling mechanism, the following voltages are applied to the terminals: a positive voltage is applied to BL terminal 74, a substantially neutral voltage is applied to SL terminal 72, a negative voltage is applied to WL terminal 70, a positive voltage less than the positive voltage applied to terminal 74 is applied to BW terminal 76, and a substantially neutral voltage is applied to the substrate terminal 78. Under these conditions, holes are injected from BL terminal 74 into the floating body region 24, leaving the body region 24 positively charged. In one particular non-limiting embodiment, a charge of about 0.0 volts is applied to terminal 72, a charge of about +2.0 volts is applied to terminal 74, a charge of about −1.2 volts is applied to terminal 70, a charge of about +0.6 volts is applied to terminal 76, and about 0.0 volts is applied to terminal 78. However, these voltage levels may vary, while maintaining the relative relationships between the voltages applied, as described above.

Alternatively, to write state "1" using an impact ionization mechanism, the following voltages can be applied to the terminals: a positive voltage is applied to BL terminal 74, a substantially neutral voltage is applied to SL terminal 72, a positive voltage less than the positive voltage applied to terminal 74 is applied to WL terminal 70, a positive voltage less positive than the positive voltage applied to BL terminal 74 is applied to BW terminal 76, and a substantially neutral voltage is applied to the substrate terminal 78. Under these conditions, holes are injected from BL terminal 74 into the floating body region 24, leaving the body region 24 positively charged. In one particular non-limiting embodiment, +0.0 volts is applied to terminal 72, a charge of about +2.0 volts is applied to terminal 74, a charge of about +0.5 volts is applied to terminal 70, a charge of about +0.6 volts is applied to terminal 76, and about 0.0 volts is applied to terminal 78. However, these voltage levels may vary, while maintaining the relative relationships between the voltages applied, as described above.

In an alternate write state "1" using impact ionization mechanism, a positive bias can be applied to substrate terminal 78. The parasitic silicon controlled rectifier device of the selected cell is now turned off due to the negative potential between the substrate terminal 78 and the BL terminal 74. The functioning of the silicon controller rectifier device is described in further detail in application Ser. No. 12/533,661 filed Jul. 31, 2009 and titled "Methods of Operating Semiconductor Memory Device with Floating Body Transistor Using Silicon Controlled Rectifier Principle". Under these conditions, electrons will flow near the surface of the transistor, and generate holes through impact ionization mechanism. The holes are subsequently injected into the floating body region 24. In one particular non-limiting embodiment, +0.0 volts is applied to terminal 72, a charge of about +2.0 volts is applied to terminal 74, a charge of about +0.5 volts is applied to terminal 70, and about +0.8 volts is applied to terminal 78. However, these voltage levels may vary, while maintaining the relative relationships between the voltages applied, as described above.

Alternatively, the silicon controlled rectifier device of cell 50 can be put into a state "1" (i.e., by performing a write "1" operation) by applying the following bias: a neutral voltage is applied to BL terminal 74, a positive voltage is applied to WL terminal 70, and a positive voltage is applied to the substrate terminal 78, while SL terminal 72 and BW terminal 76 are left floating. The positive voltage applied to the WL terminal 70 will increase the potential of the floating body 24 through capacitive coupling and create a feedback process that turns the SCR device on. Once the SCR device of cell 50 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +3.0 volts is applied to terminal 78. However, these voltage levels may vary, while maintaining the relative relationships between the voltages applied, as described above, e.g., the voltage applied to terminal 78 remains greater than the voltage applied to terminal 74.

Figure 15:
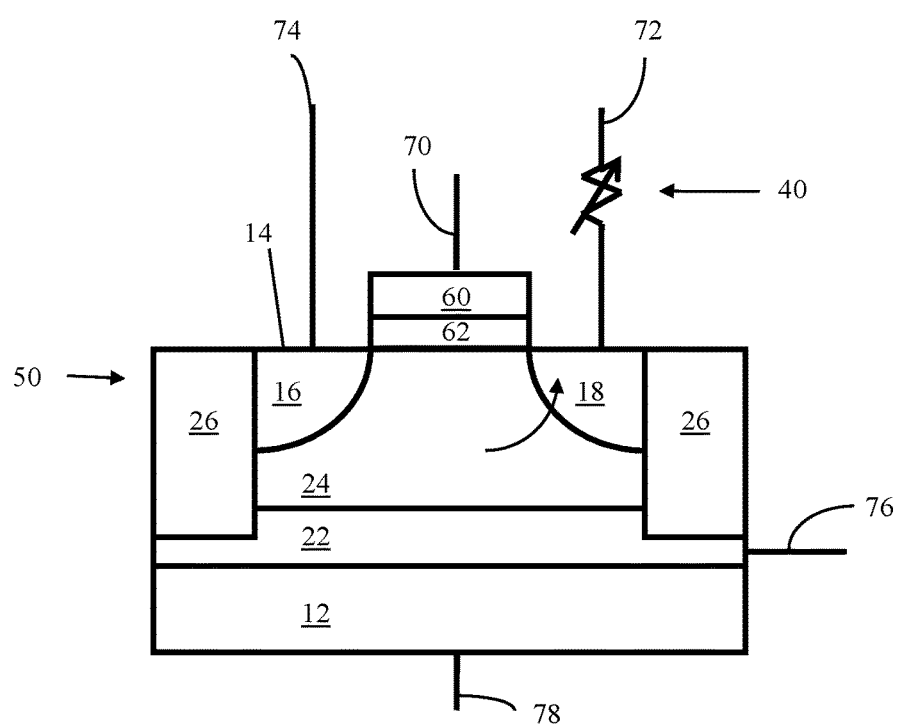
FIG. 15 illustrates an operating condition for a write state "0" operation that can be carried out on a memory cell according to an embodiment of the present invention.

A write "0" operation of the cell 50 is now described with reference to FIG. 15. To write "0" to cell 50, a negative bias is applied to SL terminal 72 and/or BL terminal 74, a neutral or negative voltage is applied to WL terminal 70, and a substantially neutral voltage is applied to substrate terminal 78. Under these conditions, the p-n junction (junction between 24 and 16 and between 24 and 18) is forward-biased, evacuating any holes from the floating body 24. In one particular non-limiting embodiment, about −1.0 volts is applied to terminal 72, about −1.0 volts is applied to terminal 70, and about 0.0 volts is applied to terminal 78. However, these voltage levels may vary, while maintaining the relative relationships between the voltages applied, as described above.

Alternatively, a write "0" operation can be performed to cell 50 by applying a positive bias to WL terminal 70, and substantially neutral voltages to SL terminal 72, BL terminal 74, and substrate terminal 78. Under these conditions, the holes will be evacuated from the floating body 24. In one particular non-limiting embodiment, about 1.0 volts is applied to terminal 70, about 0.0 volts are applied to terminals 72 and 74, and about 0.0 volts is applied to terminal 78. However, these voltage levels may vary, while maintaining the relative relationships between the voltages applied, as described above.

Alternatively, a write "0" operation can be performed by putting the silicon controlled rectifier device into the blocking mode. This can be performed by applying the following bias: a positive voltage is applied to BL terminal 74, a positive voltage is applied to WL terminal 70, and a positive voltage is applied to the substrate terminal 78, while leaving SL terminal 72 and BW terminal 76 floating. Under these conditions the voltage difference between anode and cathode, defined by the voltages at substrate terminal 78 and BL terminal 74, will become too small to maintain the SCR device in conducting mode. As a result, the SCR device of cell 50 will be turned off. In one particular non-limiting embodiment, a voltage of about +0.8 volts is applied to terminal 74, a voltage of about +0.5 volts is applied to terminal 70, and about +0.8 volts is applied to terminal 78. However, these voltage levels may vary, while maintaining the relative relationships between the charges applied, as described above.

A holding or standby operation is implemented to enhance the data retention characteristics of the memory cells 50. The holding operation can be performed by applying the following bias: a substantially neutral voltage is applied to BL terminal 74, a neutral or negative voltage is applied to WL terminal 70, and a positive voltage is applied to the substrate terminal 78, while leaving SL terminal 72 and BW terminal 76 floating. Under these conditions, if memory cell 50 is in memory/data state "1" with positive voltage in floating body 24, the SCR device of memory cell 50 is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 50 can be refreshed by periodically applying a positive voltage pulse through substrate terminal 78. Those memory cells 50 that are commonly connected to substrate terminal 78 and which have a positive voltage in body region 24 will be refreshed with a "1" data state, while those memory cells 50 that are commonly connected to the substrate terminal 78 and which do not have a positive voltage in body region 24 will remain in blocking mode, since their SCR device will not be turned on, and therefore memory state "0" will be maintained in those cells. In this way, all memory cells 50 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships therebetween.

When power down is detected, e.g., when a user turns off the power to cell 50, or the power is inadvertently interrupted, or for any other reason, power is at least temporarily discontinued to cell 50, data stored in the floating body region 24 is transferred to the resistance change memory 40. This operation is referred to as "shadowing" and is described with reference to FIGS. 16A-16B.

To perform a shadowing process, a positive voltage is applied to terminal 72 and a substantially neutral voltage is applied to terminal 74. A neutral voltage or slightly positive voltage is applied terminal 70, a low positive voltage is applied to terminal 76, and a substantially neutral voltage is applied to terminal 78. These voltage levels can be driven by the appropriate circuitry controlling the memory cell array when the power shutdown is expected (such as during standby operation or when entering power savings mode) or from external capacitors in the event of abrupt and sudden power interruption.

Figure 16A:
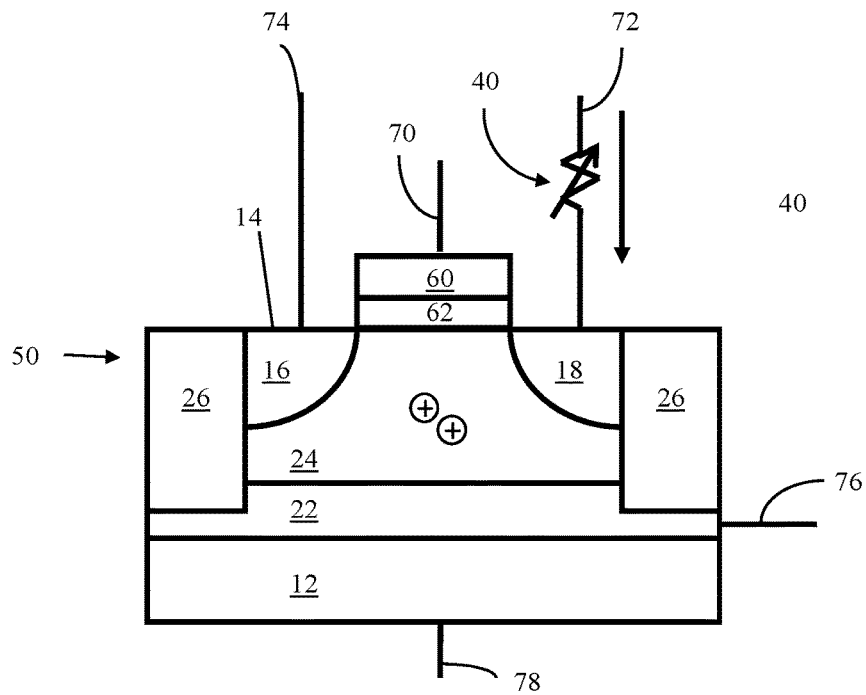
FIGS. 16A-16B schematically illustrate shadowing operations that can be carried out on a memory cell according to an embodiment of the present invention.

When the floating body has a positive potential, the bipolar transistor formed by the SL terminal 72, floating body 24, and BL terminal 74 will be turned on (FIG. 16A). The positive voltage applied to terminal 72 is controlled (e.g., varied to maintain a constant current) such that the electrical current flowing through the resistance change memory 40 is sufficient to change the state of the materials from a low resistivity state to a high resistivity state. In the case of phase change materials, this involves the change of the crystallinity of the chalcogenide materials from crystalline state to amorphous state, while in metal oxide materials, this typically involves the annihilation of conductive filaments. Accordingly, the non-volatile resistance change material will be in a high resistivity state when the volatile memory of cell 50 is in state "1" (i.e. floating body 24 is positively charged).

Figure 16B:
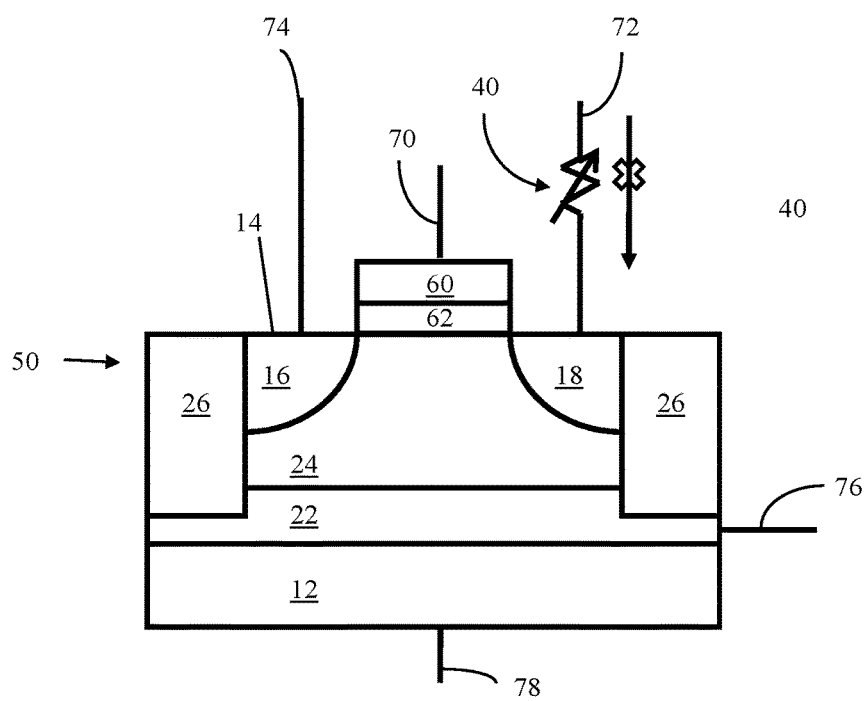

When the floating body is neutral or negatively charged, the bipolar transistor formed by the SL terminal 72, floating body 24, and BL terminal 74 will be turned off (FIG. 16B). Therefore, when voltages are applied as described above, no electrical current will flow through the resistance change memory 40 and it will retain its low resistivity state. Accordingly, the non-volatile resistance change material will be in a low resistivity state when the volatile memory of cell 50 is in state '0" (i.e. floating body is neutral or negatively charged).

In one particular non-limiting example of this embodiment, about 0.0 volts is applied to terminal 72, a constant current of about 700 µA is applied to terminal 74, about +1.0 volts is applied to terminal 70, about +0.6 volts is applied to terminal 76, and about 0.0 volts is applied to terminal 78. However, these voltage and current levels may vary, while maintaining the relative relationships between the charges applied, as described above. To change the non-volatile phase change memory from low resistivity state to high resistivity state, a current level between 600 µA and 1 mA can be used. Lower current will be needed as the phase change material is scaled to smaller geometry. The current levels employed in metal oxide systems vary greatly depending on the materials used, ranging from tens of microamperes to tens of milliamperes.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electrical potential differences. Accordingly, this process is orders of magnitude faster than one that requires algorithmic intervention.

When power is restored to cell 50, the state of the cell 50 as stored on the non-volatile resistance change memory 40 is restored into floating body region 24. The restore operation (data restoration from non-volatile memory to volatile memory) is described with reference to FIGS. 17A-17B. In one embodiment, to perform the restore operation, a negative voltage is applied to terminal 70, a positive voltage is applied to terminal 74, a negative voltage is applied to terminal 72, a low positive voltage is applied to terminal 76, and a substantially neutral voltage is applied to terminal 78.

Figure 17A:
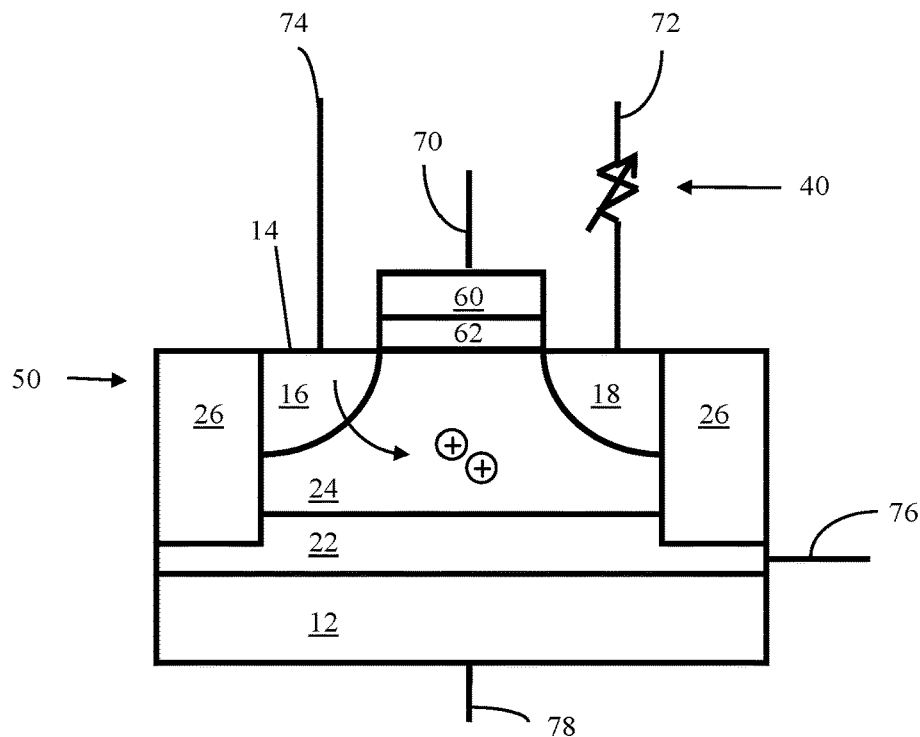
FIGS. 17A-17B schematically illustrate restore operations that can be carried out on a memory cell according to an embodiment of the present invention.
Figure 17B:
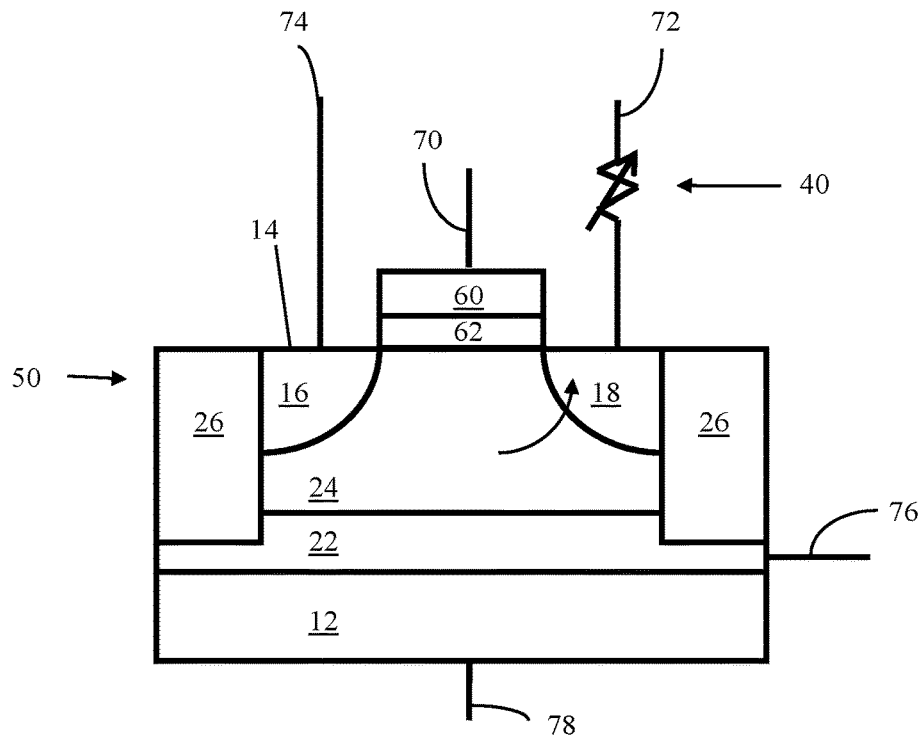

This condition will result in result in band-to-band tunneling hole injection into the floating body 24 (see FIG. 17A). However, if the resistance change memory is in low resistivity state, the negative voltage applied to terminal 72 will evacuate holes in the floating body 24 (see FIG. 17B) because the p-n junction formed by the floating body 24 and the region 18 is forward-biased. Consequently, the volatile memory state of memory cell 50 will be restored to state "0" upon completion of the restore operation, restoring the state that the memory cell 50 held prior to the shadowing operation.

If the resistance change memory 40 is in high resistivity state, no current flows through the resistance change memory 40, hence the holes accumulated in the floating body 24 will not be evacuated (FIG. 17A). As a result, the memory state "1" that the memory cell 50 held prior to the shadowing operation will be restored.

In one particular non-limiting example of this embodiment, about −1.0 volts is applied to terminal 72, about +2.0 volts is applied to terminal 74, about −1.2 volts is applied to terminal 70, about +0.6 volts is applied to terminal 76, and a neutral voltage is applied to the substrate terminal 78. However, these voltage levels may vary, while maintaining the relative relationships between the charges applied, as described above.

Note that this process occurs non-algorithmically, as the state of the non-volatile resistance change memory 40 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention.

Figure 18:
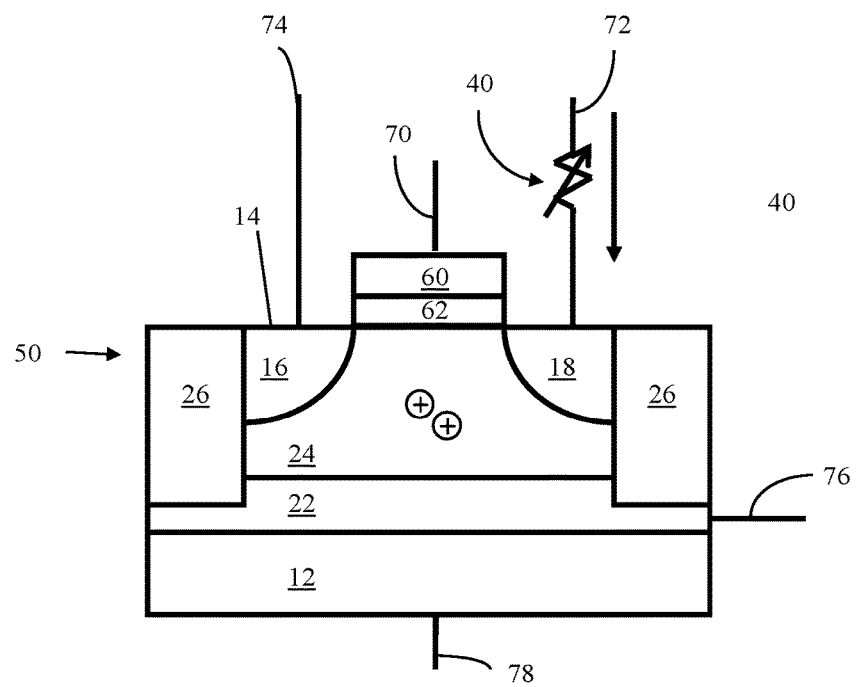
FIG. 18 schematically illustrates a reset operation that can be carried out on a memory cell according to an embodiment of the present invention.

After restoring the memory cell(s) 50, the resistance change memory(ies) 40 is/are reset to a predetermined state, e.g., a low resistivity state as illustrated in FIG. 18, so that each resistance change memory 40 has a known state prior to performing another shadowing operation.

To perform a reset operation according to the embodiment of FIG. 18, a neutral or slightly positive voltage is applied to terminal 70, a substantially neutral voltage is applied to BL terminal 74, a positive voltage is applied to SL terminal 72, a positive voltage is applied to terminal 76, and a neutral voltage is applied to substrate terminal 78.

When the floating body has a positive potential, the bipolar transistor formed by the SL terminal 72, floating body 24, and BL terminal 74 will be turned on. The positive voltage applied to terminal 72 is controlled (e.g., varied to maintain a constant current) such that the electrical current flowing through the resistance change memory 40 is sufficient to change the resistivity of the resistance change materials from a high resistivity state to a low resistivity state. The voltage applied to terminal 72 initially has to exceed a threshold value (sometimes referred to as 'dynamic threshold voltage') to ensure that all resistance change memory materials (including ones in high resistivity state) are conducting. Accordingly, all the non-volatile resistance change memory 40 will be in a low resistivity state upon completion of the reset operation.

In one particular non-limiting example of this embodiment, about 0.0 volts is applied to terminal 74, a constant current of about 400 µA is applied to terminal 72, about +1.0 volts is applied to terminal 70, and about +0.6 volts is applied to terminal 76. However, these voltage levels may vary, while maintaining the relative relationships between the charges applied, as described above. The dynamic threshold voltage of a phase change non-volatile memory is typically greater than 1.0 volts, upon which the high resistivity phase change materials will become conducting. The current level required to change phase change memory materials to low resistivity state typically range between 100 µA to 600 µA. For the case of metal oxide systems, the threshold voltage and the current level vary depending on the materials.

In another embodiment, the resistance change memory 40 is initialized to have a high resistivity state. When power is applied to cell 50, cell 50 operates like a capacitorless DRAM cell. In a capacitorless DRAM device, the memory information (i.e., data that is stored in memory) is stored as charge in the floating body of the transistor, i.e., in the body 24 of cell 50. The presence of the electrical charge in the floating body 24 modulates the threshold voltage of the cell 50, which determines the state of the cell 50.

A read operation can be performed on memory cell 50 through the following exemplary bias condition. A neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage more positive than the voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a neutral voltage is applied to the substrate terminal 78, a neutral or positive voltage is applied to the BW terminal 76, a positive voltage is applied to BL terminal 74, and SL terminal 72 is left floating or grounded, and a neutral or positive voltage less positive than the positive voltage applied to BL terminal 74 is applied to WL terminal 70. If cell 50 is in a state "1" having holes in the body region 24, then the bipolar transistor formed by BL junction 16, floating body 24, and buried layer 22 is turned on. As a result, a higher cell current is observed compared to when cell 50 is in a state "0" having no holes in body region 24. In one particular non-limiting embodiment, terminal 72 is left floating, about +3.0 volts is applied to terminal 74, about +0.5 volts is applied to terminal 70, about +0.6 volts is applied to terminal 76, and about 0.0 volts is applied to terminal 78. However, these voltage levels may vary while maintaining the relative relationships between the voltages applied, as described above.

In another embodiment of the read operation that can be performed on memory cell 50, a positive voltage is applied to the substrate terminal 78, a neutral voltage is applied to BL terminal 74, SL terminal 72 is left floating or grounded, a neutral or positive voltage is applied to WL terminal 70, while BW terminal 76 is left floating. If cell 50 is in state "1" with the body region 24 positively charged, the silicon controlled rectifier (SCR) device formed by the substrate 12, buried well 22, floating body 24, and the BL junction 74 will be turned on and a higher cell current is observed compared to when cell 50 is in a state "0" with the body region 24 in neutral state or negatively charged. In one particular non-limiting embodiment, about +0.8 volts is applied to terminal 78, about +0.5 volts is applied to terminal 70, and about 0.0 volts is applied to terminal 74, while terminals 72 and 76 are left floating. However, these voltage levels may vary while maintaining the relative relationships between the voltages applied, as described above.

The following conditions describe a write state "1" operation that can be performed on memory cell 50, where the resistance change memory 40 is in a high resistivity state. To write state "1" using a band-to-band tunneling mechanism, the following voltages are applied to the terminals: a positive voltage is applied to BL terminal 74, SL terminal 72 is left floating or grounded, a negative voltage is applied to WL terminal 70, a neutral or positive voltage is applied to the BW terminal 76, and a neutral voltage is applied to the substrate terminal 78. Under these conditions, holes are injected from BL junction 16 into the floating body region 24, leaving the body region 24 positively charged. In one particular non-limiting embodiment, about +2.0 volts is applied to terminal 74, about −1.2 volts is applied to terminal 70, about +0.6 volts is applied to terminal 76, about 0.0 volts is applied to terminal 78, and terminal 72 is left floating. However, these voltage levels may vary while maintaining the relative relationships between the voltages applied, as described above.

Alternatively, to write state "1" using an impact ionization mechanism, the following voltages are applied to the terminals: a positive voltage is applied to BL terminal 74, SL terminal 72 is left floating or grounded, a positive voltage is applied to WL terminal 70, a neutral or positive voltage is applied to BW terminal 76, and a substantially neutral voltage is applied to the substrate terminal 78. Under these conditions, holes are injected from BL junction 16 into the floating body region 24, leaving the body region 24 positively charged. In one particular non-limiting embodiment, a potential of about +2.0 volts is applied to terminal 74, a potential of about +0.5 volts is applied to terminal 70, a potential of about +0.6 volts is applied to terminal 76, and about 0.0 volts is applied to terminal 78, while terminal 72 is left floating. However, these voltage levels may vary while maintaining the relative relationships between the voltages applied, as described above.

Alternatively, the silicon controlled rectifier device can be operated to put cell 50 into a state "1" by applying the following bias: a substantially neutral voltage is applied to BL terminal 74, a positive voltage is applied to WL terminal 70, and a positive voltage is applied to the substrate terminal 78, while SL terminal 72 and BW terminal 76 are left floating. The positive voltage applied to the WL terminal 70 will increase the potential of the floating body 24 through capacitive coupling and create a feedback process that turns the device on. In one particular non-limiting embodiment, a charge of about 0.0 volts is applied to terminal 74, a charge of about +0.5 volts is applied to terminal 70, and about +3.0 volts is applied to terminal 78. However, these voltage levels may vary while maintaining the relative relationships between the voltages applied, as described above.

A write "0" operation of the cell 50 is now described. To write "0" to cell 50, a negative bias is applied to BL terminal 74, SL terminal 72 is grounded or left floating, a neutral or negative voltage is applied to WL terminal 70, a neutral or positive voltage is applied to BW terminal 76, and a substantially neutral voltage is applied to substrate terminal 78. Under these conditions, the p-n junction (junction between 24 and 18) is forward-biased, evacuating any holes from the floating body 24. In one particular non-limiting embodiment, about −2.0 volts is applied to terminal 74, about −1.2 volts is applied to terminal 70, about 0.0 volts is applied to terminal 76, and about 0.0 volts is applied to terminal 78, while terminal 72 is grounded or left floating. However, these voltage levels may vary while maintaining the relative relationships between the voltages applied, as described above.

In an alternate write "0" operation, a neutral voltage is applied to BL terminal 74, a positive voltage is applied to WL terminal 70, a neutral or positive voltage is applied to BW terminal 76, a substantially neutral voltage is applied to substrate terminal 78, while terminal 72 is grounded or left floating. Under these conditions, holes from the floating body 24 are evacuated. In one particular non-limiting embodiment, about +1.5 volts is applied to terminal 70, about 0.0 volts is applied to terminal 74, about 0.0 volts is applied to terminal 76, about 0.0 volts is applied to terminal 78, while terminal 72 is grounded or left floating. However, these voltage levels may vary while maintaining the relative relationships between the voltages applied, as described above.

Alternatively, a write "0" operation can be performed by putting the silicon controlled rectifier device of cell 50 into the blocking mode. This can be performed by applying the following bias: a positive voltage is applied to BL terminal 74, a positive voltage is applied to WL terminal 70, and a positive voltage is applied to the substrate terminal 78, while leaving SL terminal 72 and BW terminal 76 floating. In one particular non-limiting embodiment, a charge of about +0.8 volts is applied to terminal 74, a charge of about +0.5 volts is applied to terminal 70, and about +0.8 volts is applied to terminal 78. However, these voltage levels may vary, while maintaining the relative relationships between the charges applied, as described above.

A holding or standby operation is implemented to enhance the data retention characteristics of the memory cells 50. The holding operation can be performed by applying the following bias: a substantially neutral voltage is applied to BL terminal 74, a neutral or negative voltage is applied to WL terminal 70, and a positive voltage is applied to the substrate terminal 78, while leaving SL terminal 72 and BW terminal 76 floating. Under these conditions, if memory cell 50 is in memory/data state "1" with positive voltage in floating body 24, the SCR device of memory cell 50 is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 50 can be refreshed by periodically applying a positive voltage pulse through substrate terminal 78. Those memory cells 50 that are commonly connected to substrate terminal 78 and which have a positive voltage in body region 24 will be refreshed with a "1" data state, while those memory cells 50 that are commonly connected to the substrate terminal 78 and which do not have a positive voltage in body region 24 will remain in blocking mode, since their SCR device will not be turned on, and therefore memory state "0" will be maintained in those cells. In this way, all memory cells 50 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships therebetween.

To perform a shadowing process on memory cell 50, a positive voltage is applied to terminal 72 and a substantially neutral voltage is applied to terminal 74. A neutral voltage or positive voltage is applied terminal 70 and a low positive voltage is applied to terminal 76, while the substrate terminal 78 is grounded.

When the floating body has a positive potential, the bipolar transistor formed by the SL terminal 72, floating body 24, and BL terminal 74 and/or BW terminal 76 will be turned on. The positive voltage applied to terminal 72 is controlled (e.g., varied to maintain a constant current) such that the electrical current flowing through the resistance change memory 40 is sufficient to change the resistivity of the materials from a high resistivity state to a low resistivity state. The voltage applied to terminal 72 initially has to exceed the dynamic threshold voltage (typically larger than 1.0 volts) to ensure that the resistance change memory 40 (even if it is in high resistivity state) will be conducting. Accordingly, the non-volatile resistance change material will be in a low resistivity state when the volatile memory of cell 50 is in state "1" (i.e. floating body 24 is positively charged).

When the floating body is neutral or negatively charged, the bipolar transistor formed by the SL terminal 72, floating body 24, and BL terminal 74 and/or BW terminal 76 will be turned off. Therefore, when voltages are applied as described above, no electrical current will flow through the resistance change memory 40 and it will retain its high resistivity state. Accordingly, the non-volatile resistance change material will be in a high resistivity state when the volatile memory of cell 50 is in state '0' (i.e. floating body is neutral or negatively charged).

In one particular non-limiting example of this embodiment, about 0.0 volts is applied to terminal 74, a constant current of about 400 µA is applied to terminal 72, about +1.0 volts is applied to terminal 70, about +0.6 volts is applied to terminal 76, and about 0.0 volts is applied to terminal 78. However, these voltage and current levels may vary, while maintaining the relative relationships between the charges applied, as described above. The current level required to change phase change memory materials to low resistivity state typically range between 100 µA to 600 µA, while that of metal oxide systems vary depending on the materials. The current level is expected to decrease as the resistance change material is scaled to smaller geometry.

In another embodiment, the following bias can be applied: a neutral voltage is applied to terminal 72, a neutral voltage or positive voltage is applied to terminal 70, a positive voltage is applied to terminal 78, while terminals 74 and 76 are left floating. When the floating body 24 has a positive potential, the silicon controlled rectifier device formed by the SL 72 junction, floating body 24, buried layer 22, and substrate 12 will be turned on. The positive voltage applied to terminal 78 is controlled (e.g., varied to maintain a constant current) such that the electrical current flowing through the resistance change memory 40 is sufficient to change the resistivity of the materials from a high resistivity state to a low resistivity state. For phase change materials, the crystalline state changes from amorphous phase to crystalline phase, while in metal oxide systems, this typically involves the formation of conductive filaments. Accordingly, the non-volatile resistance change material will be in a low resistivity state when the volatile memory of cell 50 is in state "1" (i.e. floating body 24 is positively charged).

When the floating body 24 is neutral or negatively charged, the silicon controlled rectifier device will be turned off. Therefore, no electrical current flows through the resistance change memory 40 and it will retain its high resistivity state. Accordingly, the non-volatile resistance change material will be in a high resistivity state when the volatile memory of cell 50 is in state '0' (i.e. floating body 24 is neutral or negatively charged).

In one particular non-limiting example of this embodiment, about 0.0 volts is applied to terminal 72, a constant current of about 400 µA is applied to terminal 78, about +1.0 volts is applied to terminal 70, while terminals 74 and 76 are left floating. However, these voltage levels may vary while maintaining the relative relationships between the voltages applied, as described above. The current level required to change phase change memory materials to low resistivity state typically range between 100 µA to 600 µA and is expected to decrease as the phase change memory is being scaled to smaller dimension. In metal oxide systems, it varies depending on the materials used.

The restore operation (data restoration from non-volatile memory to volatile memory) is now described. In one embodiment, to perform the restore operation, a negative voltage is applied to terminal 70, a positive voltage is applied to terminal 72, a neutral voltage is applied to terminal 74, a neutral or low positive voltage is applied to terminal 76, and a substantially neutral voltage is applied to terminal 78.

If the resistance change memory 40 is in low resistivity state, this condition will result in holes being injected into the floating body 24, generated through the band-to-band tunneling mechanism, thereby restoring the state "1" that the memory cell 50 held prior to the shadowing operation. If the resistance change memory 40 is in high resistivity state, no holes will be generated; consequently, the volatile memory state of memory cell 50 will be restored to state "0". Upon completion of the restore operation, the volatile memory of cell 50 is restored to the state that the volatile memory of memory cell 50 held prior to the shadowing operation.

In one particular non-limiting example of this embodiment, about +2.0 volts is applied to terminal 72, about +0.0 volts is applied to terminal 74, about −1.2 volts is applied to terminal 70, about 0.0 volts is applied to terminal 76, and about 0.0 volts is applied to terminal 78. However, these voltage levels may vary, while maintaining the relative relationships between the charges applied, as described above.

In another embodiment of the restore operation, the following bias can be applied: a neutral voltage is applied to terminal 72, a positive voltage is applied to terminal 70, a positive voltage is applied to terminal 78, while terminals 74 and 76 are left floating. The positive voltage applied to the WL terminal 70 will increase the potential of the floating body 24 through capacitive coupling. If the resistance change memory 40 is in a low resistivity state, this will create a feedback process that latches the device on and the volatile state of the memory cell 50 will be in state "1". If the resistance change memory 40 is in a high resistivity state, the volatile state of the memory cell 50 will remain in state "0". In one particular non-limiting embodiment, a charge of about 0.0 volts is applied to terminal 72, a charge of about +0.5 volts is applied to terminal 70, about +0.8 volts is applied to terminal 78, while terminals 74 and 76 are left floating. However, these voltage levels may vary while maintaining the relative relationships between the voltages applied, as described above.

After restoring the memory cell(s) 50, the resistance change memory 40 is/are reset to a high resistivity state, so that each resistance change memory 40 has a known state prior to performing another shadowing operation.

To perform a reset operation according to one embodiment, a neutral voltage or positive voltage is applied to terminal 70, a substantially neutral voltage is applied to BL terminal 74, a positive voltage is applied to SL terminal 72, a neutral or positive voltage is applied to terminal 76, and a substantially neutral voltage is applied to terminal 78.

When the floating body 24 has a positive potential, the bipolar transistor formed by the SL terminal 72, floating body 24, and BL terminal 74 and/or BW terminal 76 will be turned on. The positive voltage applied to terminal 72 is controlled (e.g., varied to maintain a constant current) such that the electrical current flowing through the resistance change memory 40 is sufficient to change the resistivity of the materials from a low resistivity state to a high resistivity state. Accordingly, all the non-volatile resistance change memory 40 will be in a high resistivity state upon completion of the reset operation.

In one particular non-limiting example of this embodiment, about 0.0 volts is applied to terminal 74, a constant current of about 700 µA is applied to terminal 72, about +1.0 volts is applied to terminal 70, about +0.6 volts is applied to terminal 76, and about 0.0 volts is applied to terminal 78. However, these voltage levels may vary, while maintaining the relative relationships between the charges applied, as described above. To change the non-volatile phase change memory from low resistivity state to high resistivity state, a current level between 600 µA and 1 mA can be used. Lower current will be needed as the phase change material is scaled to smaller geometry.

In an alternative embodiment of the reset operation, the following bias can be applied: a neutral voltage is applied to terminal 72, a neutral voltage or positive voltage is applied to terminal 70, a positive voltage is applied to terminal 78, while terminals 74 and 76 are left floating.

When the floating body 24 has a positive potential, the silicon controlled rectifier device formed by the SL 72 junction, floating body 24, buried layer 22, and substrate 12 will be turned on. The positive voltage applied to terminal 78 is controlled (e.g., varied to maintain a constant current) such that the electrical current flowing through the resistance change memory 40 is sufficient to change the resistivity of the materials from a low resistivity state to a high resistivity state. Accordingly, the non-volatile resistance change material will be in a high resistivity state upon completion of the reset operation.

In one particular non-limiting example of this embodiment, about 0.0 volts is applied to terminal 72, a constant current of about 700 µA is applied to terminal 78, about +1.0 volts is applied to terminal 70, while terminals 74 and 76 are left floating. However, these voltage levels may vary while maintaining the relative relationships between the voltages applied, as described above. To change the non-volatile phase change memory from low resistivity state to high resistivity state, a current level between 600 µA and 1 mA can be used. Lower current will be needed as the phase change material is scaled to smaller geometry.

Figure 24:
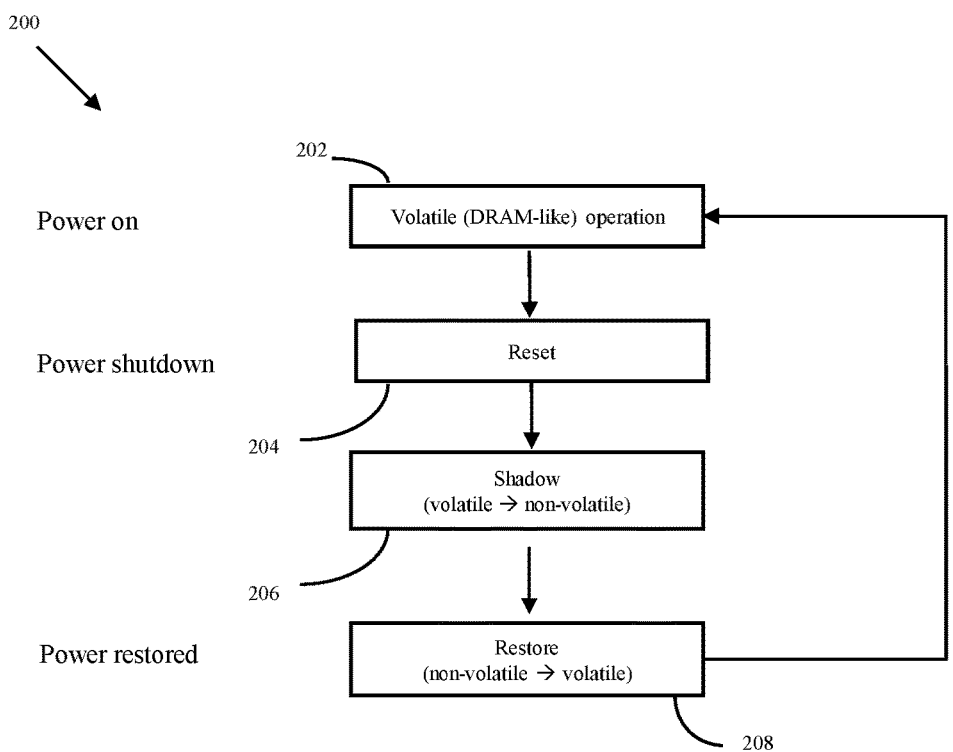
FIG. 24 is a flowchart illustrating operation of a memory device according to another embodiment of the present invention.

In this embodiment of the memory cell operations, the volatile memory operations can be performed in the same manner regardless of the state of the resistance change memory, i.e. there is no interference from the non-volatile memory state to the volatile memory operations. An alternative embodiment of the memory cell operations is described in flowchart 200 in FIG. 24. At event 202, when power is applied to the memory device, the memory device can be operated without the non-volatile memory of the device being set to a predetermined known state. The memory device may operate in the same manner as a volatile memory cell upon restore operation 208. As a result, the memory cell 50 can operate into the volatile operation mode faster, without first resetting the non-volatile memory state. The reset operation 204 can be performed just prior to writing new data into the non-volatile memory cell during the shadowing operation 206. In an alternative embodiment, the volatile and non-volatile memory can be configured to store different data, for example when the non-volatile memory is being used to store "permanent data", which does not change in value during routine use. For example, this includes operating system image, applications, multimedia files, etc. The volatile memory can be used to store state variable. In this embodiment, the reset operation 204 can be bypassed.

Figure 19A:
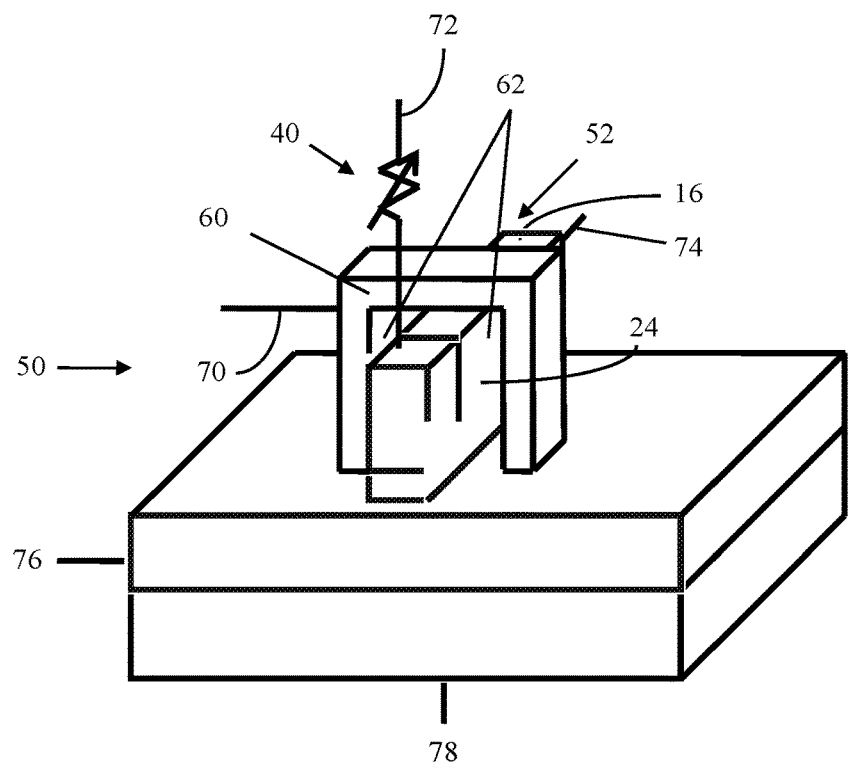
FIG. 19A is a perspective, cross-sectional, schematic illustration of a fin-type memory cell device according to an embodiment of the present invention.
Figure 19B:
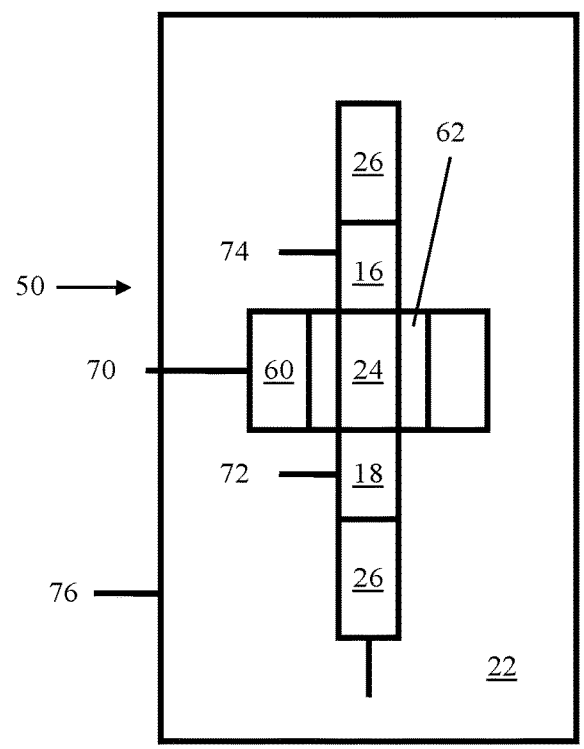
FIG. 19B is a top view schematic illustration of a fin-type memory cell device according to an embodiment of the present invention.

FIGS. 19A-19B show another embodiment (perspective, cross-sectional view and top view, respectively) of the memory cell 50 described in this invention. In this embodiment, cell 50 has a fin structure 52 fabricated on substrate 12, so as to extend from the surface of the substrate to form a three-dimensional structure, with fin 52 extending substantially perpendicularly to, and above the top surface of the substrate 12. Fin structure 52 is conductive and is built on buried well layer 22. Buried well layer 22 is also formed by an ion implantation process on the material of substrate 12. Buried well layer 22 insulates the floating substrate region 24, which has a first conductivity type, from the bulk substrate 12. Fin structure 52 includes first and second regions 16, 18 having a second conductivity type. Thus, the floating body region 24 is bounded by the top surface of the fin 52, the first and second regions 16, 18 the buried well layer 22, and insulating layers 26. Insulating layers 26 insulate cell 50 from neighboring cells 50 when multiple cells 50 are joined to make a memory device. Fin 52 is typically made of silicon, but may comprise germanium, silicon germanium, gallium arsenide, carbon nanotubes, or other semiconductor materials known in the art.

Device 50 further includes gates 60 on three sides of the floating substrate region 24 as shown in FIG. 19A. Alternatively, gates 60 can enclose two opposite sides of the floating substrate region 24. Gates 60 are insulated from floating body 24 by insulating layers 62. Gates 60 are positioned between the first and second regions 16, 18, adjacent to the floating body 24.

A resistance change memory element 40 is positioned above the region having second conductivity type. The resistance change memory element 40 is shown as a variable resistor, and may be formed from resistance change memory element known in the art. In one embodiment, the non-volatile memory is initialized to have a low resistance state. In another alternate embodiment, the non-volatile memory is initialized to have a high resistance state.

Cell 50 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 74 is connected to first region 16 and terminal 72 is connected to resistance change memory element 40, which is, in turn, connected to second region 18. Alternatively, terminal 74 can be connected to resistance change memory element 40 and terminal 72 can be connected to first region 16. Terminal 76 is connected to buried layer 22 and terminal 78 is connected to substrate 12.

The operations of the embodiment of memory cell 50 shown in FIGS. 19A-19B are the same as those described above with regard to the embodiment of memory cell 50 of FIG. 12. Equivalent terminals have been assigned with the same numbering labels in both figures.

Figure 20:
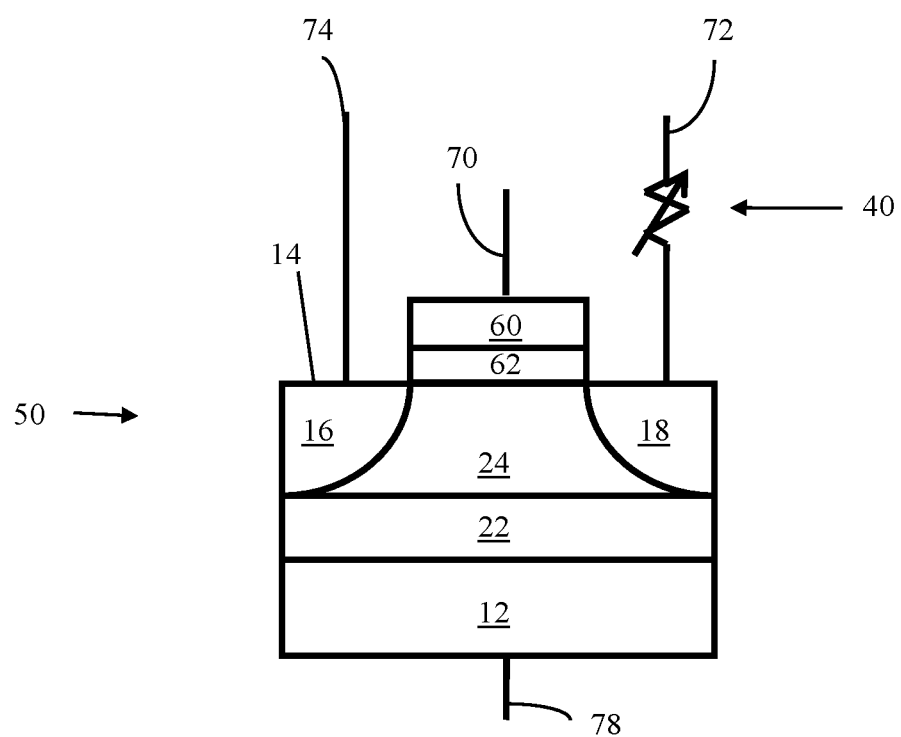
FIG. 20 is a cross-sectional, schematic illustration of a memory cell according to another embodiment of the present invention.

FIG. 20 illustrates another embodiment of the memory cell 50 fabricated on a silicon-on-insulator (SOI) substrate. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art. A buried insulator layer 22 insulates the body region 24 from the substrate 12. The body region 24 is bounded by surface 14, first and second regions 16 and 18, and the buried insulator layer 22. The buried insulator layer 22 may be buried oxide (BOX).

A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

A resistance change memory element 40 is positioned above the region having second conductivity type 16. The resistance change memory element 40 is shown as a variable resistor, and may be formed from phase change material or metal-insulator-metal systems as described in previous embodiments above.

Cell 50 includes several terminals: word line (WL) terminal 70, source line (SL) terminal 72, bit line (BL) terminal 74, and substrate terminal 78. Terminal 70 is connected to the gate 60. Terminal 74 is connected to first region 16 and terminal 72 is connected to resistance change memory element 40 which is connected to second region 18. Alternatively, terminal 74 can be connected to resistance change memory element 40 and terminal 72 can be connected to first region 16. Terminal 78 is connected to substrate 12.

When power is applied to cell 50, cell 50 operates like a capacitorless DRAM cell. In a capacitorless DRAM device, the memory information (i.e., data that is stored in memory of the cells) is stored as charge in the floating bodies 24 of the transistors, i.e., in the bodies 24 of cells 50. The presence of the electrical charge in the floating body 24 modulates the threshold voltage of the cell 50, which determines the state of the cell 50. In one embodiment, the non-volatile memory is initialized to have a low resistance state.

To perform a read operation on memory cell 50 according to one embodiment of the present invention, a neutral or negative voltage is applied to the substrate terminal 78, a substantially neutral voltage is applied to SL terminal 72, a positive voltage is applied to BL terminal 74, and a positive voltage more positive than the positive voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having substantially no holes in body region 24. In one particular non-limiting embodiment, about 0.0 volts is applied to terminal 72, about +0.4 volts is applied to terminal 74, about +1.2 volts is applied to terminal 70, and about −2.0 volts is applied to terminal 78. However, these voltage levels may vary while maintaining the relative relationships between the voltages applied, as described above.

Alternatively, a neutral or negative voltage is applied to the substrate terminal 78, a substantially neutral voltage is applied to SL terminal 72, a positive voltage is applied to BL terminal 74, and a positive voltage less positive than the positive voltage applied to BL terminal 74 is applied to WL terminal 70. If cell 50 is in a state "1" having holes in the body region 24, then the parasitic bipolar transistor formed by the SL terminal 72, floating body 24, and BL terminal 74 will be turned on and a higher cell current is observed compared to when cell 50 is in a state "0" having no holes in body region 24. In one particular non-limiting embodiment, about 0.0 volts is applied to terminal 72, about +3.0 volts is applied to terminal 74, about +0.5 volts is applied to terminal 70, and about −2.0 volts is applied to terminal 78. However, these voltage levels may vary while maintaining the relative relationships between the voltages applied, as described above.

A write state "1" operation can be carried out on cell 50 by performing band-to-band tunneling hot hole injection or impact ionization hot hole injection. To write state "1" using band-to-band tunneling mechanism, the following voltages are applied to the terminals: a positive voltage is applied to BL terminal 74, a substantially neutral voltage is applied to SL terminal 72, a negative voltage is applied to WL terminal 70, a neutral or negative voltage is applied to the substrate terminal 78. Under these conditions, holes are injected from BL terminal 74 into the floating body region 24, leaving the body region 24 positively charged. In one particular non-limiting embodiment, a charge of about 0.0 volts is applied to terminal 72, a potential of about +2.0 volts is applied to terminal 74, a potential of about −1.2 volts is applied to terminal 70, and about −2.0 volts is applied to terminal 78. However, these voltage levels may vary while maintaining the relative relationships between the voltages applied, as described above.

Alternatively, to write state "1" using an impact ionization mechanism, the following voltages are applied to the terminals: a positive voltage is applied to BL terminal 74, a substantially neutral voltage is applied to SL terminal 72, a positive voltage is applied to WL terminal 70, and a neutral or negative voltage is applied to the substrate terminal 78. Under these conditions, holes are injected from the region 16 into the floating body region 24, leaving the body region 24 positively charged. In one particular non-limiting embodiment, +0.0 volts is applied to terminal 72, a potential of about +2.0 volts is applied to terminal 74, a potential of about +0.5 volts is applied to terminal 70, and about −2.0 volts is applied to terminal 78. However, these voltage levels may vary while maintaining the relative relationships between the voltages applied, as described above.

A write "0" operation of the cell 50 is now described. To write "0" to cell 50, a negative bias is applied to SL terminal 72 and/or BL terminal 74, a neutral or negative voltage is applied to WL terminal 70, and a neutral or negative voltage is applied to substrate terminal 78. Under these conditions, the p-n junction (junction between 24 and 16 and between 24 and 18) is forward-biased, evacuating any holes from the floating body 24. In one particular non-limiting embodiment, about −1.0 volts is applied to terminal 72, about −1.0 volts is applied to terminal 70, and about 0.0 volts is applied to terminal 78. However, these voltage levels may vary, while maintaining the relative relationships between the voltages applied, as described above.

Alternatively, a write "0" operation can be performed to cell 50 by applying a positive bias to WL terminal 70, and substantially neutral voltages to SL terminal 72 and BL terminal 74, and a neutral or negative voltage to substrate terminal 78. Under these conditions, the holes will be removed from the floating body 24 through charge recombination. In one particular non-limiting embodiment, about 1.0 volts is applied to terminal 70, about 0.0 volts are applied to terminals 72 and 74, and about −2.0 volts is applied to terminal 78. However, these voltage levels may vary, while maintaining the relative relationships between the charges applied, as described above.

To perform a shadowing process, a positive voltage is applied to terminal 72 and a substantially neutral voltage is applied to terminal 74. A neutral voltage or positive voltage is applied terminal 70 and a neutral or negative voltage is applied to terminal 78.

When the floating body has a positive potential, the bipolar transistor formed by the SL terminal 72, floating body 24, and BL terminal 74 will be turned on. The positive voltage applied to terminal 72 is controlled (e.g., varied to maintain a constant current) such that the electrical current flowing through the resistance change memory 40 is sufficient to change the resistivity of the materials from a low resistivity state to a high resistivity state. Accordingly, the non-volatile resistance change material will be in a high resistivity state when the volatile memory of cell 50 is in state "1" (i.e. floating body 24 is positively charged).

When the floating body is neutral or negatively charged, the bipolar transistor formed by the SL terminal 72, floating body 24, and BL terminal 74 will be turned off. Therefore, when voltages are applied as described above, no electrical current will flow through the resistance change memory 40 and it will retain its low resistivity state. Accordingly, the non-volatile resistance change material will be in a low resistivity state when the volatile memory of cell 50 is in state '0" (i.e. floating body is neutral or negatively charged).

In one particular non-limiting example of this embodiment, about 0.0 volts is applied to terminal 74, about 700 µA is applied to terminal 72, about +1.0 volts is applied to terminal 70, and about −2.0 volts is applied to terminal 78. However, these voltage levels may vary, while maintaining the relative relationships between the charges applied, as described above. To change the non-volatile phase change memory from low resistivity state to high resistivity state, a current level between 600 µA and 1 mA can be used. The current level is expected to decrease as the phase change material is scaled to smaller geometry.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electrical potential differences. Accordingly, this process is orders of magnitude faster than one that requires algorithmic intervention.

When power is restored to cell 50, the state of the cell 50 as stored on the non-volatile resistance change memory 40 is restored into floating body region 24. In one embodiment, to perform the restore operation, a negative voltage is applied to terminal 70, a positive voltage is applied to terminal 74, a negative voltage is applied to terminal 72, and a neutral or negative voltage is applied to terminal 78.

If the resistance change memory 40 is in high resistivity state, this condition will result in holes injection into the floating body 24, generated through the band-to-band tunneling mechanism, thereby restoring the state "1" that the memory cell 50 held prior to the shadowing operation.

If the resistance change memory 40 is in low resistivity state, the negative voltage applied to terminal 72 will evacuate holes injected into the floating body 24 because the p-n junction formed by the floating body 24 and the region 16 is forward-biased. Consequently, the volatile memory state of memory cell 50 will be restored to state "0" upon completion of the restore operation, restoring the state that the memory cell 50 held prior to the shadowing operation.

In one particular non-limiting example of this embodiment, about −1.0 volts is applied to terminal 72, about +2.0 volts is applied to terminal 74, about −1.2 volts is applied to terminal 70, and about −2.0 volts is applied to terminal 78. However, these voltage levels may vary, while maintaining the relative relationships between the charges applied, as described above.

Note that this process occurs non-algorithmically, as the state of the non-volatile resistance change memory 40 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention.

After restoring the memory cell(s) 50, the resistance change memory 40 is/are reset to a predetermined state, e.g., a low resistivity state, so that each resistance change memory 40 has a known state prior to performing another shadowing operation.

To perform a reset operation according to the present embodiment, a neutral voltage or positive voltage is applied to terminal 70, a substantially neutral voltage is applied to BL terminal 74, a positive voltage is applied to SL terminal 72, and a neutral or negative voltage is applied to terminal 78.

When the floating body has a positive potential, the bipolar transistor formed by the SL terminal 72, floating body 24, and BL terminal 74 will be turned on. The positive voltage applied to terminal 72 is optimized such that the electrical current flowing through the resistance change memory 40 is sufficient to change the resistivity of the materials from a high resistivity state to a low resistivity state. Accordingly, all the non-volatile resistance change memory 40 will be in a low resistivity state upon completion of the reset operation.

In one particular non-limiting example of this embodiment, about 0.0 volts is applied to terminal 74, about 400 µA is applied to terminal 72, about −1.0 volts is applied to terminal 70, and about −2.0 volts is applied to terminal 78. However, these voltage levels may vary, while maintaining the relative relationships between the charges applied, as described above. The current level required to change phase change memory materials to low resistivity state typically range between 100 µA to 600 µA. The current level requirement is expected to decrease as the phase change memory dimension is reduced.

Figure 21:
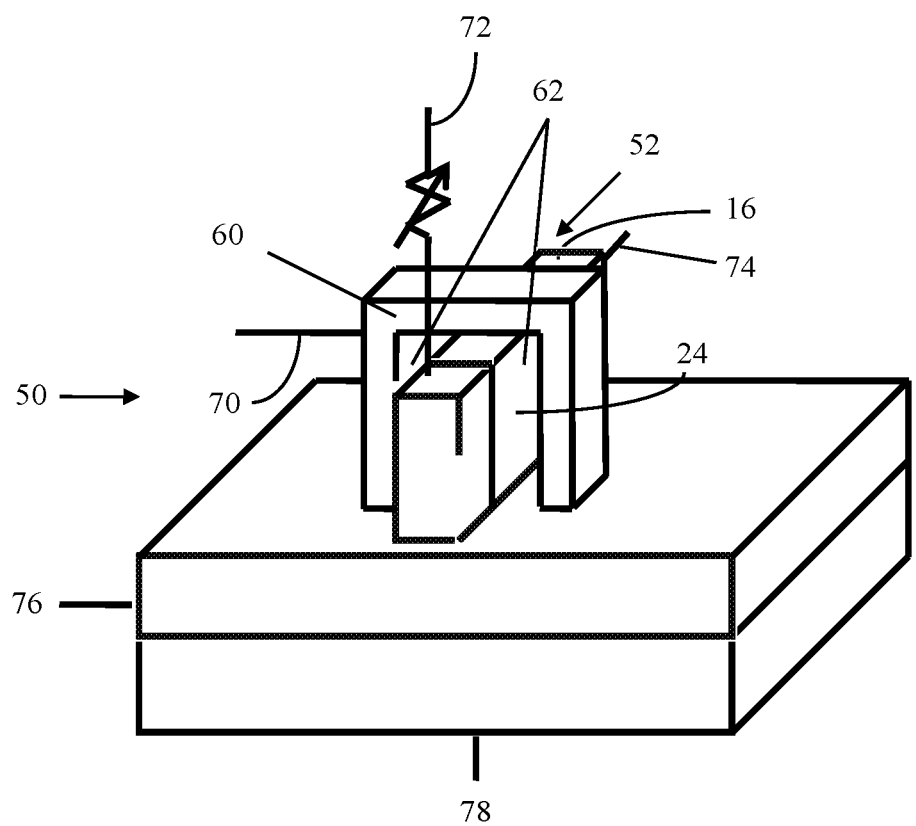
FIG. 21 is a cross-sectional, schematic illustration of a fin-type memory cell device according to another embodiment of the present invention.

FIG. 21 illustrates an alternative embodiment of a memory cell 50 according to the present invention. In this embodiment, cell 50 has a fin structure 52 fabricated on a silicon-on-insulator (SOI) substrate 12, so as to extend from the surface of the substrate to form a three-dimensional structure, with fin 52 extending substantially perpendicularly to, and above the top surface of the substrate 12. Fin structure 52 is conductive and is built on buried insulator layer 22, which may be buried oxide (BOX). Insulator layer 22 insulates the floating substrate region 24, which has a first conductivity type, from the bulk substrate 12. Fin structure 52 includes first and second regions 16, 18 having a second conductivity type. Thus, the floating body region 24 is bounded by the top surface of the fin 52, the first and second regions 16, 18 and the buried insulator layer 22. Fin 52 is typically made of silicon, but may comprise germanium, silicon germanium, gallium arsenide, carbon nanotubes, or other semiconductor materials known in the art.

Device 50 further includes gates 60 on three sides of the floating substrate region 24, as shown in FIG. 21. Alternatively, gates 60 can enclose two opposite sides of the floating substrate region 24. Gates 60 are insulated from floating body 24 by insulating layers 62. Gates 60 are positioned between the first and second regions 16, 18, adjacent to the floating body 24.

A resistance change memory element 40 is positioned above the region having second conductivity type. The resistance change memory element 40 is shown as a variable resistor, and may be formed from phase change material or metal-insulator-metal systems, for example. In one embodiment, the non-volatile memory is initialized to have a low resistance state. In another alternate embodiment, the non-volatile memory is initialized to have a high resistance state.

Cell 50 includes several terminals: word line (WL) terminal 70, source line (SL) terminal 72, bit line (BL) terminal 74, and substrate terminal 78. Terminal 70 is connected to the gate 60. Terminal 74 is connected to first region 16 and terminal 72 is connected to resistance change memory element 40 which is connected to second region 18. Alternatively, terminal 74 can be connected to resistance change memory element 40 and terminal 72 can be connected to first region 16. The bulk substrate 12 is connected to terminal 78.

Cell 50 includes four terminals: word line (WL) terminal 70, source line (SL) terminal 72, bit line (BL) terminal 74 and substrate terminal 78. Gate 60 is connected to terminal 70, first and second regions 16, 18 are connected to terminals 74 and 72, respectively, or vice versa, and the bulk substrate 12 is connected to terminal 78.

The operations of the embodiment of memory cell 50 shown in FIG. 21 are the same as for memory cell 50 described in FIG. 20. Equivalent terminals have been assigned with the same numbering labels in both figures.

Figure 22:
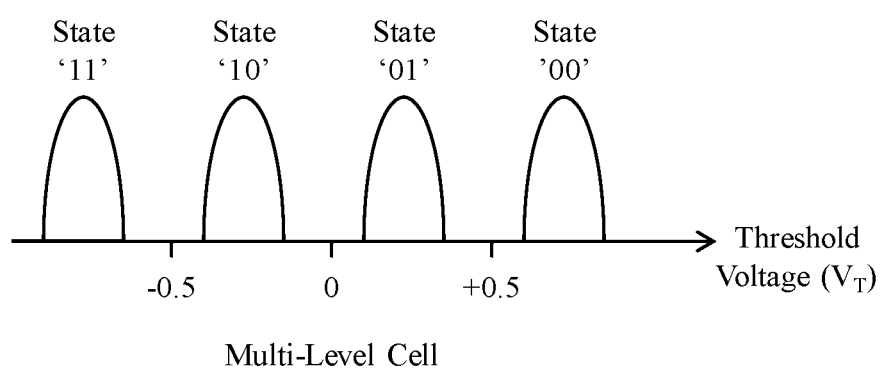
FIG. 22 illustrates various states of a multi-level cell according to an embodiment of the present invention.

Up until this point, the description of cells 50 have been in regard to binary cells, in which the data memories, both volatile and non-volatile, are binary, meaning that they either store state "1" or state "0". However, in an alternative embodiment, any of the memory cell embodiments described herein can be configured to function as multi-level cells, so that more than one bit of data can be stored in each cell 50. FIG. 22 illustrates an example of voltage states of a multi-level cell wherein two bits of data can be stored in each cell 50. In this case, a voltage less than or equal to a first predetermined voltage and greater than a second predetermined voltage that is less than the first predetermined voltage in floating body or base region 24 volts is interpreted as state "01", a voltage less than or equal to the second predetermined voltage is interpreted as state "00", a voltage greater than the first predetermined voltage and less than or equal to a third predetermined voltage that is greater than the first predetermined voltage is interpreted to be state "10" and a voltage greater than the third predetermined voltage is interpreted as state "11".

During the shadowing operation, the potential of the floating body or base region 24 in turn determines the amount of current flowing through the resistance change memory 40 or the floating gate 60, which will in turn determine the state of the non-volatile memory. The resistivity state of the resistance change memory 40 or the charge stored on the floating gate 60 can then be configured to store multi-level bits.

During restore operation, the resistivity state of the resistance change memory 40 or the charge of the floating gate 60 will subsequently determine the voltage state of the floating body or base region 24.

Figure 23A:
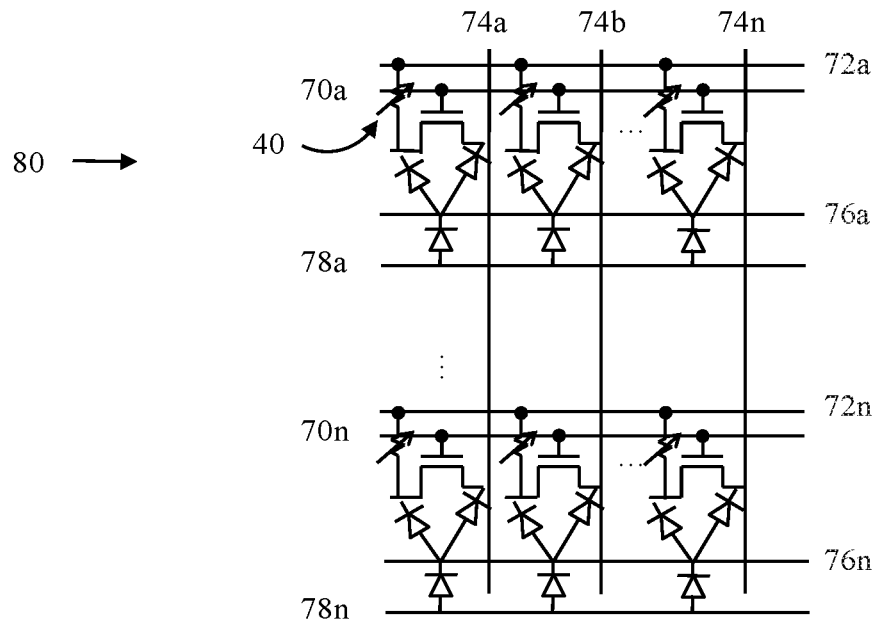
FIG. 23A is a schematic diagram showing an example of array architecture of a plurality of memory cells according to an embodiment of the present invention.

FIG. 23A shows an example of array architecture 80 of a plurality of memory cells 50 arranged in a plurality of rows and columns according to an embodiment of the present invention. The memory cells 50 are connected such that within each row, all of the gates 60 are connected by a common word line terminal 70. The first regions 18 are connected to resistance change materials 40. Within the same row, they are then connected by a common source line 72. Within each column, the second regions 16 are connected to a common bit line terminal 74. Within each row, all of the buried layers 22 are connected by a common buried well terminal 76. Likewise, within each row, all of the substrates 12 are connected by a common substrate terminal 78.

Figure 23B:
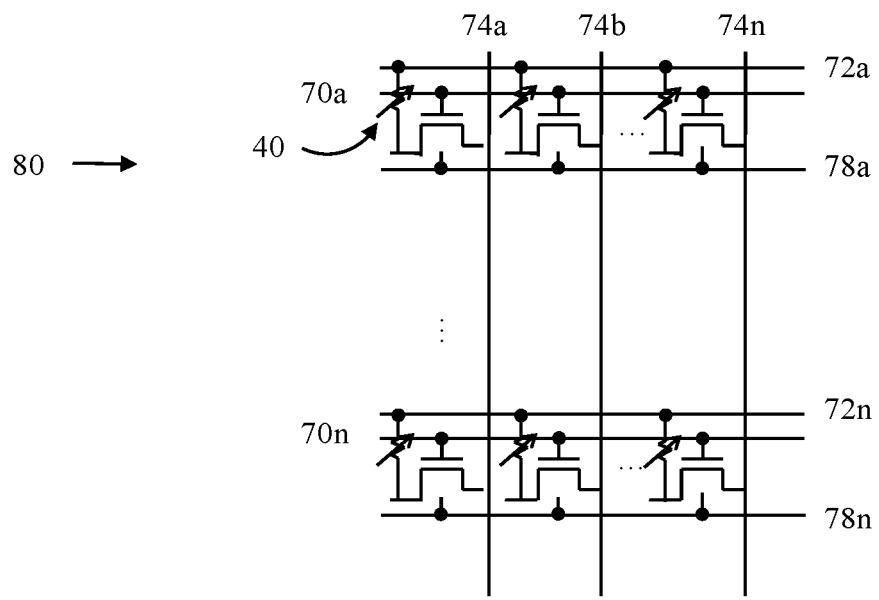
FIG. 23B is a schematic diagram showing an example of array architecture of a plurality of memory cells according to another embodiment of the present invention.

FIG. 23B shows an example of array architecture 80 of a plurality of memory cells 50 fabricated on a silicon-on-insulator (SOI) substrate, arranged in a plurality of rows and columns according to an embodiment of the present invention. The memory cells 50 are connected such that within each row, all of the gates 60 are connected by a common word line terminal 70. The first regions 18 are connected to resistance change materials 40. Within the same row, they are then connected by a common source line 72. Within each column, the second regions 16 are connected to a common bit line terminal 74. Likewise, within each row, all of the substrates 12 are connected by a common substrate terminal 78.

Figure 25:
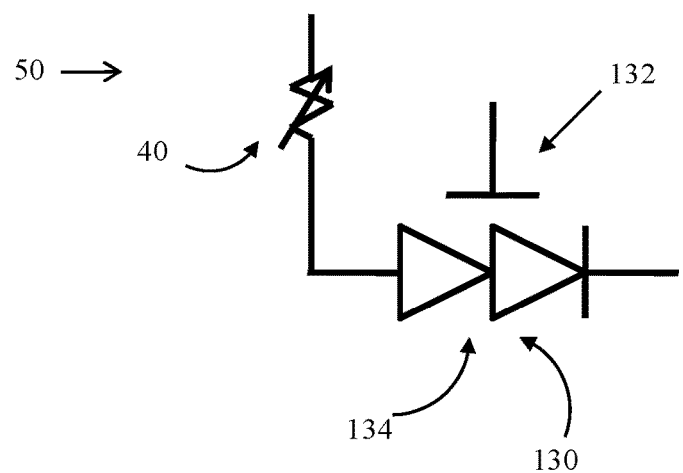
FIG. 25 is a schematic equivalent circuit model of a memory cell according to an embodiment of the present invention.

FIG. 25 is a schematic of an equivalent circuit model of a memory cell 50 using a resistance change element 40 with a thin capacitively coupled thyristor (TCCT) access device 130 according to an embodiment of the present invention. TCCT device 130 includes four regions with alternating n-type and p-type conductivity, along with a gate capacitively coupled to the p-region near the cathode terminal. In FIG. 25, the TCCT device 130 is shown as a back-to-back diode 134 with a gate terminal 132. A resistive change memory 40 is used to store non-volatile data, as it is able to retain its state in the absence of power. Examples of resistive change memory include phase change memory, conductive bridging memory, and metal oxide memory.

Figure 26:
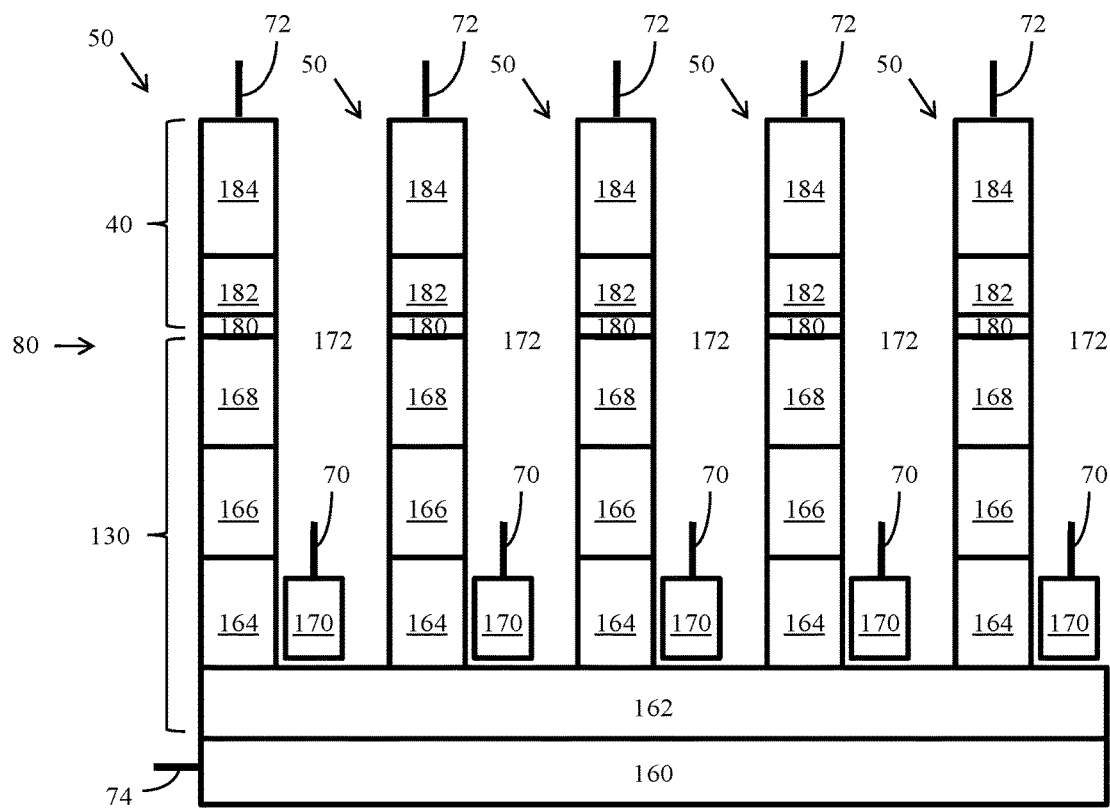
FIG. 26 is a cross-sectional illustration of a plurality of vertical memory cells according to an embodiment of the present invention.

A plurality of memory cells 50 according to a non-limiting embodiment of the present invention is shown in FIG. 26, where a phase change element is used to illustrate the resistive change memory. Memory cells 50 are formed vertically and are insulated from one another by insulator layers 172. The vertical arrangement results in a compact cell size. The p-n-p-n regions 168, 166, 164, and 162 forming the thyristor device 130 are formed using semiconductor materials, such as silicon or polysilicon. A gate 170 is capacitively coupled to the p-region 164. The TCCT device 130 is formed on top of a conductor layer 160. The conductor layer 160 can be made of semiconductor materials such as silicon, germanium, silicon germanium, gallium arsenide, carbon nanotubes, or other semiconductor materials, or conductor materials such as tungsten (W), aluminum (Al), titanium (Ti), or copper (Cu).

The phase change memory 40 on top of the thyristor device 130 is formed by a bottom electrode 180, a chalcogenide material 182, and a top electrode 184. The bottom electrode 180 can be made from titanium nitride (TiN) layer, titanium silicon nitride (TiSiN) layer, titanium aluminum nitride (TiAlN) layer, or other electrode layer. Phase change material 182 is a material having properties, such as electrical resistance, that depend on the crystalline phase of the material. Crystalline phase will exhibit a low resistivity state and amorphous phase will exhibit a high resistivity state. Examples of phase change material include alloys containing elements from Column VI of the periodic table, such as GeSbTe alloys. The top electrode layer 184 can be formed from aluminum (Al), titanium (Ti), or copper (Cu) layer.

Cell 50 includes several terminals: word line (WL) terminal 70, source line (SL) terminal 72, and bit line (BL) terminal 74. Terminal 70 is connected to the gate 170. Terminal 72 is connected to the phase change memory top electrode 184 and terminal 74 is connected to the conductor layer 160.

The TCCT device 130 can operate in two modes: a low impedance conducting mode and a high impedance blocking mode. Gate 170 is used to assist the switching between the two states by modifying the potential of the base region 164 through capacitive coupling. To select a resistive change memory element 40, the TCCT device 130 operates in a conducting mode.

The read operation of the memory cell 50 can be performed as follows. A positive voltage is applied to the SL terminal 72, a substantially neutral voltage is applied to the BL terminal 74, and a positive voltage is applied to WL terminal 70. The positive voltage applied to the SL terminal 72 needs to be lower than the switching voltage of the resistive change element 40 to avoid unintentional writing of the resistive change element 40. If the resistive change element 40 is in high resistance state, no current will flow through the memory cell 50. If the resistive change element 40 is in low resistance state, a higher current will be observed flowing through the memory cell 50. In one particular non-limiting embodiment, about +0.5 volts is applied to terminal 72, about 0.0 volts is applied to terminal 74, and about +0.5 volts is applied to terminal 70. However, these voltage levels may vary while maintaining the relative relationships between the charges applied, as described above.

To write the phase change memory element 40 into a low resistance state, which is often referred to as "SET" state, the following bias is applied. A positive voltage is applied to SL terminal 72, a substantially neutral voltage is applied to the BL terminal 74, and a positive voltage is applied to WL terminal 70. The positive voltage applied to terminal 72 is controlled so that the electrical current flowing through the phase change memory 40 is substantially constant and is sufficient to change the phase of the materials to a low resistivity state.

In one particular non-limiting example of this embodiment, about 0.0 volts is applied to terminal 74, about 400 µA is applied to terminal 72, and about +0.5 volts is applied to terminal 70. However, these voltage levels may vary, while maintaining the relative relationships between the charges applied, as described above.

To write the phase change memory element 40 into a high resistance state, which is often referred to as "RESET" state, the following bias is applied. A positive voltage is applied to SL terminal 72, a substantially neutral voltage is applied to the BL terminal 74, and a positive voltage is applied to WL terminal 70. The positive voltage applied to terminal 72 is controlled so that the electrical current flowing through the phase change memory 40 is substantially constant and is sufficient to change the phase of the material to a low resistivity state.

In one particular non-limiting example of this embodiment, about 0.0 volts is applied to terminal 74, about 700 µA is applied to terminal 72, and about +0.5 volts is applied to terminal 70. However, these voltage levels may vary, while maintaining the relative relationships between the charges applied, as described above.

Figure 27:
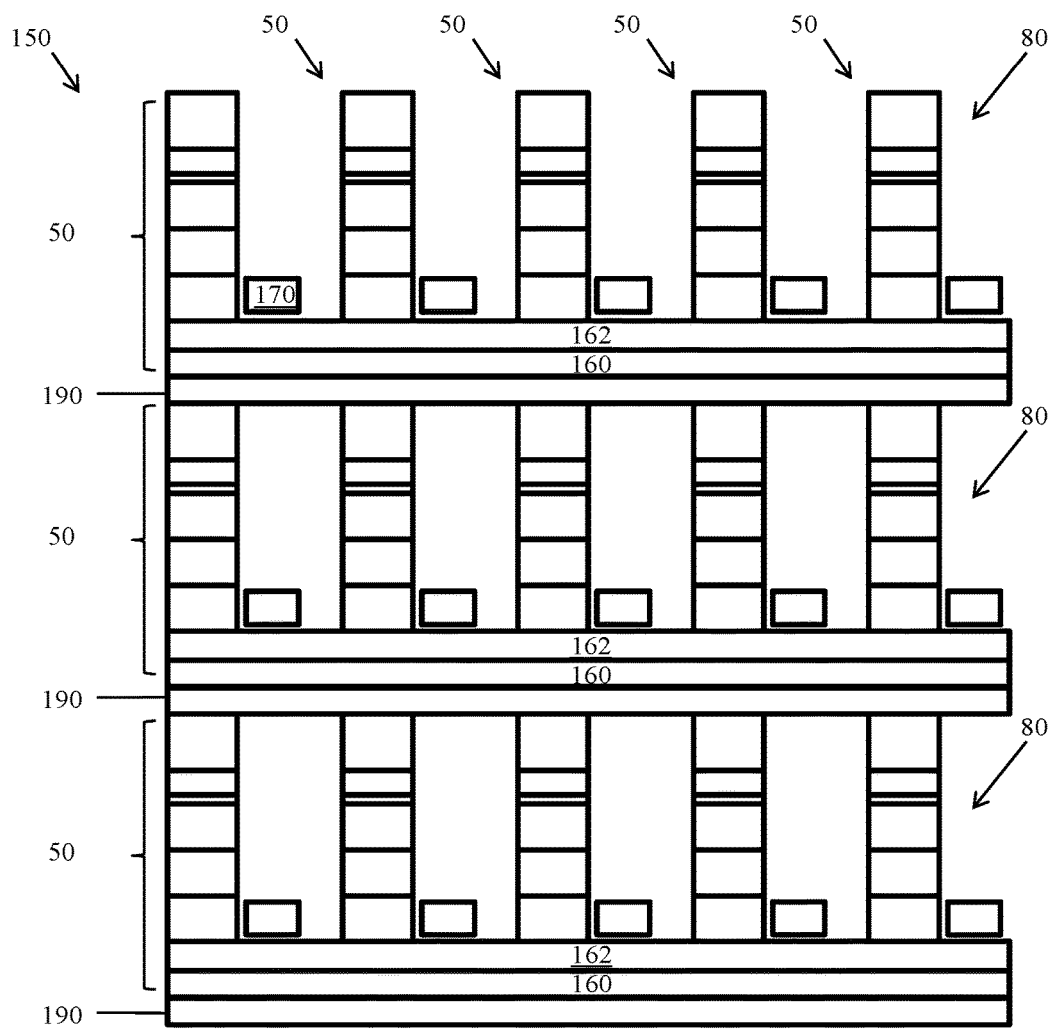
FIG. 27 is a cross-sectional illustration of a vertical stack of a plurality of the arrays of FIG. 26 to form a three-dimensional array of memory cells according to an embodiment of the present invention.

To increase the memory density, the memory cell 50 can be stacked in the vertical direction to form a three-dimensional memory array. FIG. 27 shows an example of a three-dimensional memory array 150 according to an embodiment of the present invention, in which memory array 80, comprising a two-dimensional array of memory cells 50 (i.e., rows and columns of interconnected memory cells 50 (although only one plane corresponding to one row or one column is shown in FIG. 26, and only one plane is likewise shown in FIG. 27) is stacked in the vertical direction, insulated by an insulator layer 190. The insulation layer 190 is typically made of silicon oxide, although other insulating materials can be used.

Figure 28:
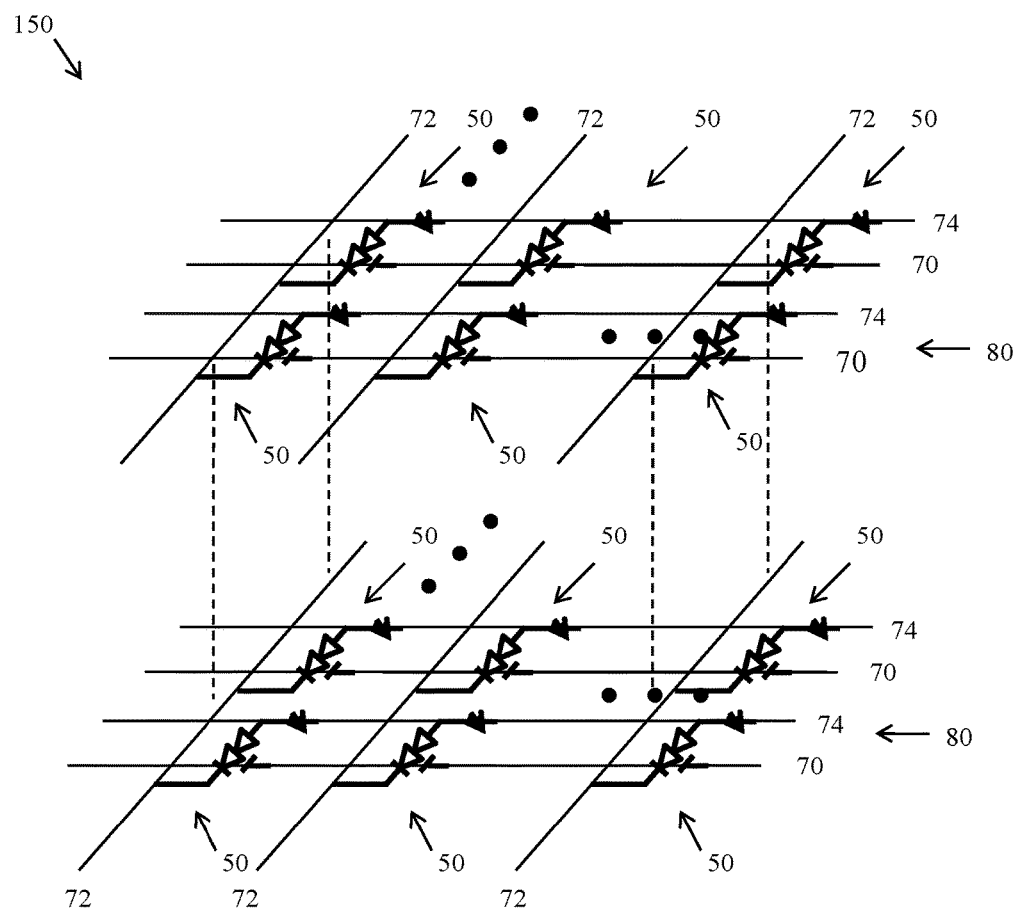
FIG. 28 illustrates a schematic diagram showing another example of array architecture of memory cells according to an embodiment of the present invention.

FIG. 28 illustrates an example of memory array architecture of the memory array 150, where two vertical stacks of memory array 80 are shown. At each stack, the memory cells 50 are connected such that within each row, all of the gates 170 are connected in common word line terminals 70 and the conductor layer 160 is connected to the common bit line terminals 74. Within each column, the top electrodes 184 are connected to common source line terminals 72. In another embodiment of the memory array architecture, the source line terminals 72 can be shared between the memory cells 50 in the first and second level of the stacks. In another embodiment, the gates 170 and WL terminals 70 can control regions 164 of two adjacent vertical stacks in two adjacent columns. This will further reduce the size of memory array 150.

Figure 29:
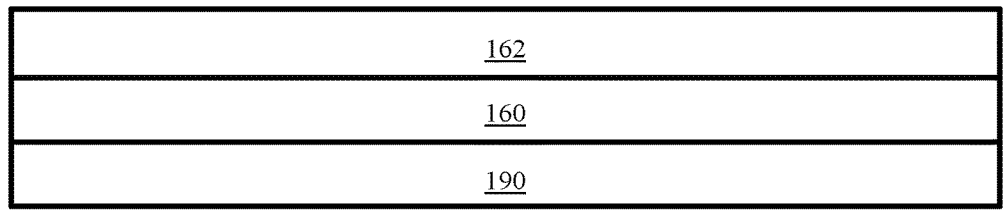
FIGS. 29-35 illustrate steps in a fabrication sequence of memory cells according to an embodiment of the present invention
Figure 30:
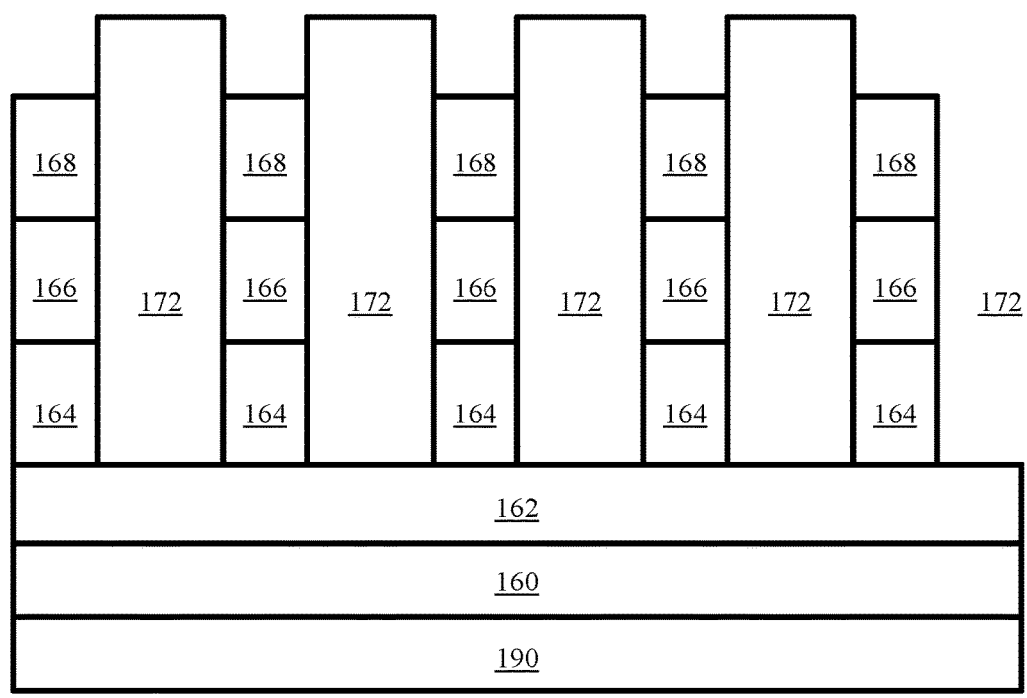

FIGS. 29-35 illustrate an embodiment of a sequence of fabrication steps of the memory array 150. As shown in FIG. 29, a conductor layer 160 is deposited on an insulator layer 190, followed by a polysilicon layer 162. The polysilicon is doped to form n-type region, either through ion implantation process or through in-situ deposition process. The conductor layer 160 and the polysilicon layer 162 are then patterned and etched to form column lines of the memory array.

Subsequently, insulator layer 172 is deposited on the polysilicon layer 162. Holes are then patterned and etched through the insulator layer 172. Polysilicon films are then deposited to fill the holes, followed by a planarization step. An ion implantation process can then be performed to form the p-n-p regions 168, 166, and 164 shown in FIG. 30.

Figure 31:
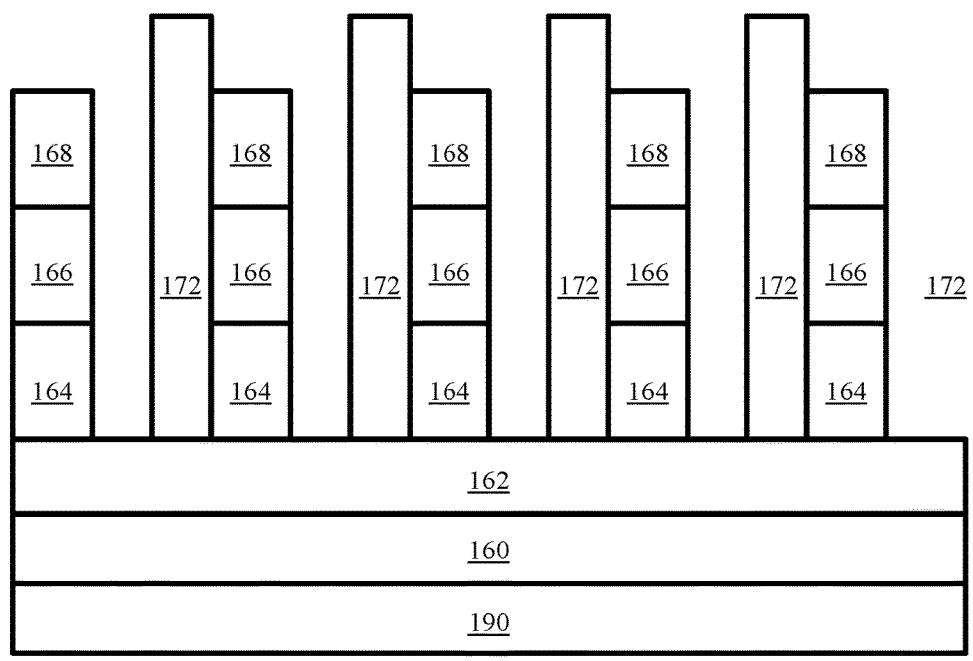
Figure 32:
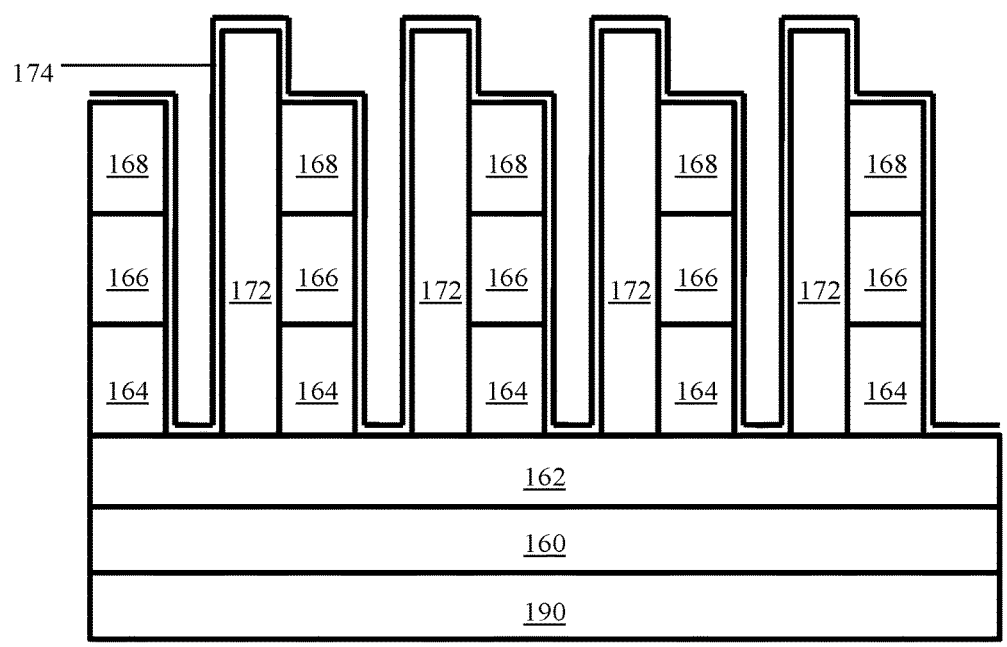
Figure 33:
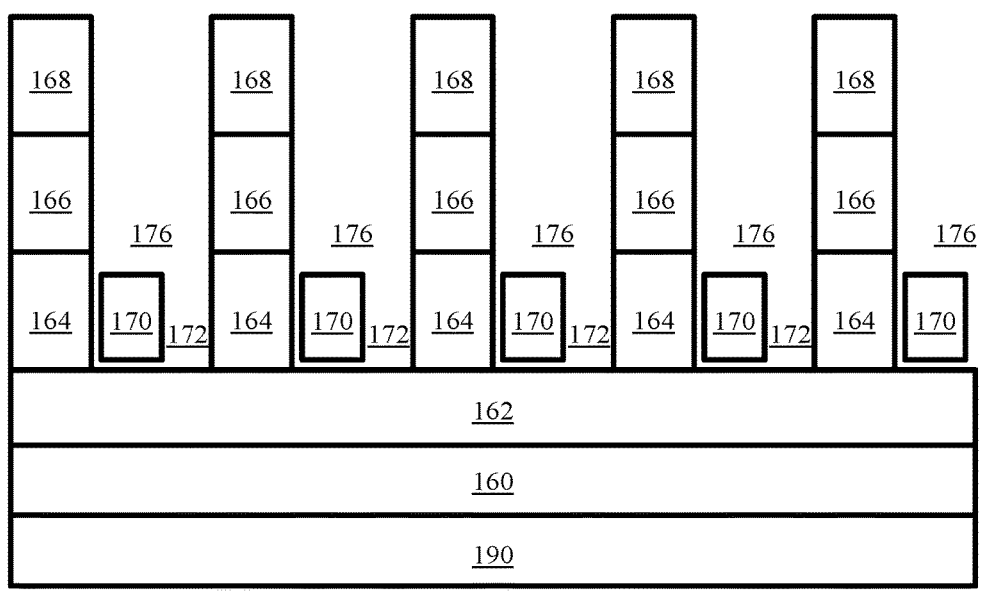

Following the formation of the p-n-p regions 168, 166 an 164, the insulator layer 172 is patterned to form the row lines of the memory array and etched as shown in FIG. 31. A thin layer of insulating layer 174 is then deposited as shown in FIG. 32. The insulator layer 174 is typically silicon oxide, but other insulating materials particularly with high dielectric constants may be used. As shown in FIG. 33, this is then followed by a polysilicon deposition step to form the gates 170. An insulating layer 176 is subsequently deposited following the polysilicon 170 deposition. A chemical mechanical polish (CMP) or a dry etch process can then be performed to planarize the resulting films.

Figure 34:
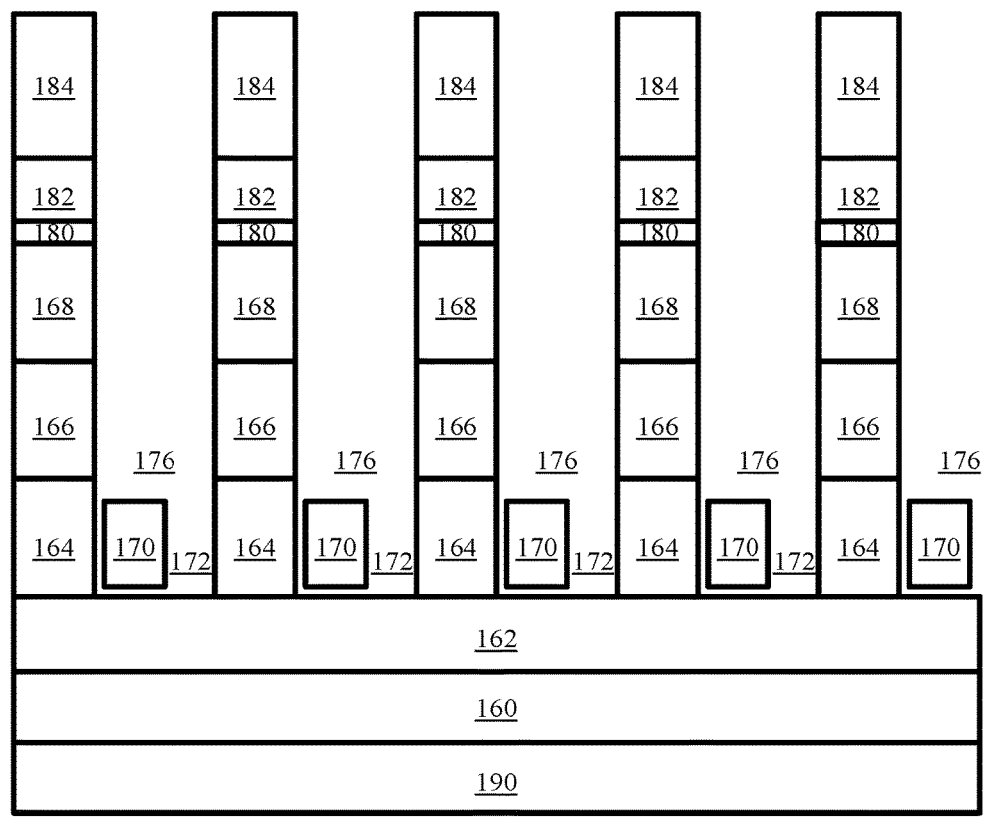
Figure 35:
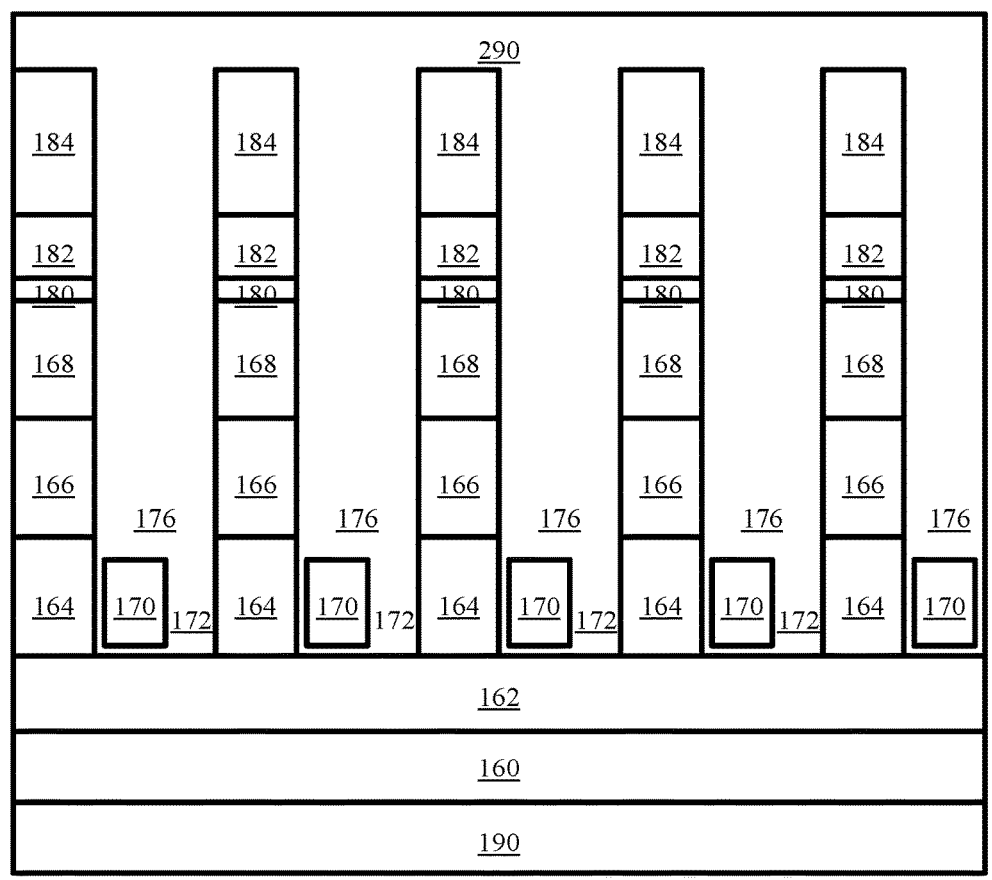

As shown in FIG. 34, a bottom electrode 180, a phase change material 182, and a top electrode 184 are subsequently deposited. These films are then patterned and etched to form the row lines of the memory array. An insulating layer 290 is then deposited to cap the resulting layers, as depicted in FIG. 35

Figure 36:
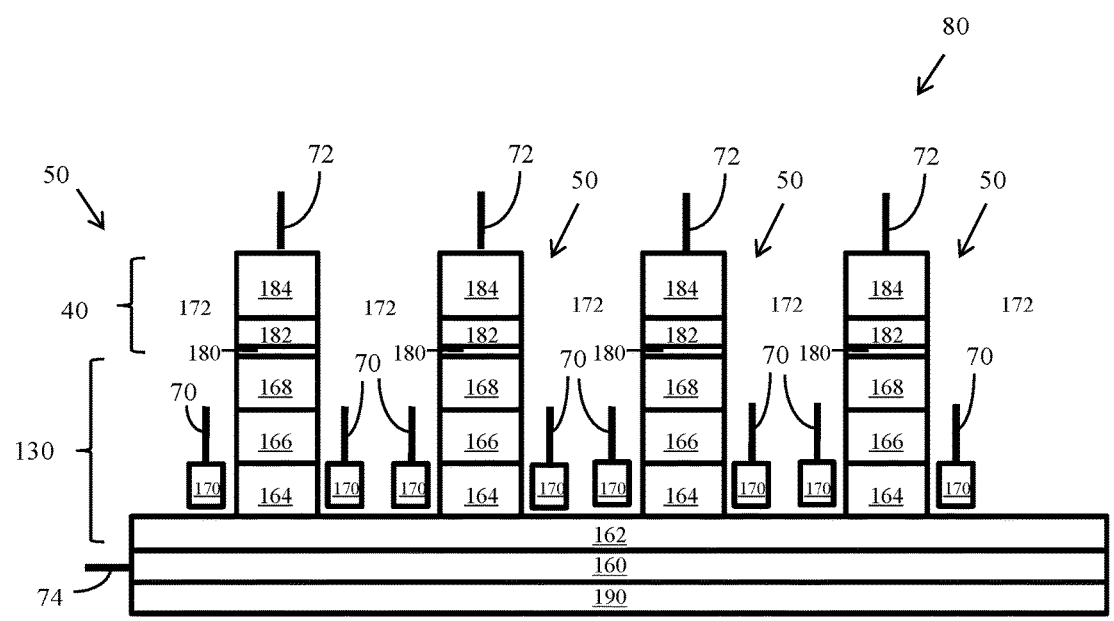
FIG. 36 is a cross-sectional illustration of a plurality of vertical memory cells according to another embodiment of the present invention

Another embodiment of an array 80 of memory cells 50 is shown in FIG. 36. Memory cells 50 are formed vertically and are insulated from one another by an insulator layer 172. The vertical arrangement results in a compact cell size. The p-n-p-n regions 168, 166, 164, and 162 forming the thyristor device is formed using semiconductor materials, such as silicon or polysilicon. A gate 170 is capacitively coupled to and encloses the p-region 64. The TCCT device 130 is formed on top of a conductor layer 160. The conductor layer 160 can be made of semiconductor materials such as silicon, germanium, silicon germanium, gallium arsenide, carbon nanotubes, or other semiconductor materials, or conductor materials such as tungsten (W), aluminum (Al), titanium (Ti), or copper (Cu).

The phase change memory 40 on top of the thyristor device 130 is formed by a bottom electrode 180, a chalcogenide material 182, and a top electrode 184. The bottom electrode 180 can be made from titanium nitride (TiN) layer, titanium silicon nitride (TiSiN) layer, titanium aluminum nitride (TiAlN) layer, or other electrode layer. Phase change material 182 is a material having properties, such as electrical resistance, that depend on the crystalline phase of the material. Crystalline phase will exhibit a low resistivity state and amorphous phase will exhibit a high resistivity state. Examples of phase change material include alloys containing elements from Column VI of the periodic table, such as GeSbTe alloys. The top electrode layer 84 can be formed from aluminum (Al), titanium (Ti), or copper (Cu) layer.

Cell 50 includes several terminals: word line (WL) terminal 70, source line (SL) terminal 72, and bit line (BL) terminal 74. Terminal 70 is connected to the gate 170. Terminal 72 is connected to the phase change memory top electrode 184 and terminal 74 is connected to the conductor layer 160.

To increase the memory density, the arrays 80 of memory cells 50 can be stacked in the vertical direction to form a three-dimensional memory array 150. In another embodiment, the gates 170 and WL terminals 70 can control regions 164 of two adjacent vertical stacks in two adjacent columns. This will further reduce the memory array size.

Figure 37:
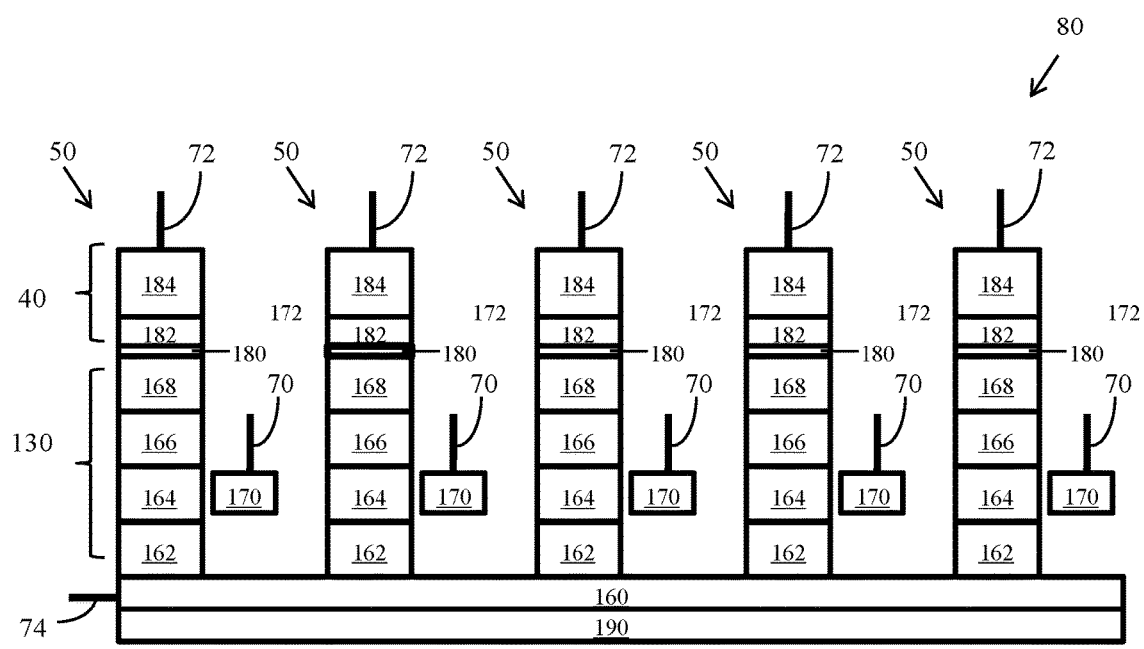
FIG. 37 is a cross-sectional illustration of a plurality of vertical memory cells according to another embodiment of the present invention

Another embodiment of an array 80 of memory cells 50 is shown in FIG. 37. Memory cells 50 are formed vertically and are insulated from one another by an insulator layer 172. The vertical arrangement results in a compact cell size. The p-n-p-n regions 168, 166, 164, and 162 forming the thyristor device 130 is formed using semiconductor materials, such as silicon or polysilicon. A gate 170 is capacitively coupled to the p-region 164. The TCCT device 130 is formed on top of a conductor layer 160. The conductor layer 160 can be made of semiconductor materials such as silicon, germanium, silicon germanium, gallium arsenide, carbon nanotubes, or other semiconductor materials, or conductor materials such as tungsten (W), aluminum (Al), titanium (Ti), or copper (Cu).

The phase change memory 40 on top of the thyristor device 130 is formed by a bottom electrode 180, a chalcogenide material 182, and a top electrode 184. The bottom electrode 180 can be made from titanium nitride (TiN) layer, titanium silicon nitride (TiSiN) layer, titanium aluminum nitride (TiAlN) layer, or other electrode layer. Phase change material 182 is a material having properties, such as electrical resistance, that depend on the crystalline phase of the material. Crystalline phase will exhibit a low resistivity state and amorphous phase will exhibit a high resistivity state. Examples of phase change material include alloys containing elements from Column VI of the periodic table, such as GeSbTe alloys. The top electrode layer 184 can be formed from aluminum (Al), titanium (Ti), or copper (Cu) layer.

Cell 50 includes several terminals: word line (WL) terminal 70, source line (SL) terminal 72, and bit line (BL) terminal 74. Terminal 70 is connected to the gate 170. Terminal 72 is connected to the phase change memory top electrode 184 and terminal 74 is connected to the conductor layer 160.

To increase the memory density, the arrays 80 of memory cells 50 can be stacked in the vertical direction to form a three-dimensional memory array 150. In another embodiment, the gates 170 and WL terminals 70 can control regions 164 of two adjacent vertical stacks in two adjacent columns. This will further reduce the memory array size.

Figure 38:
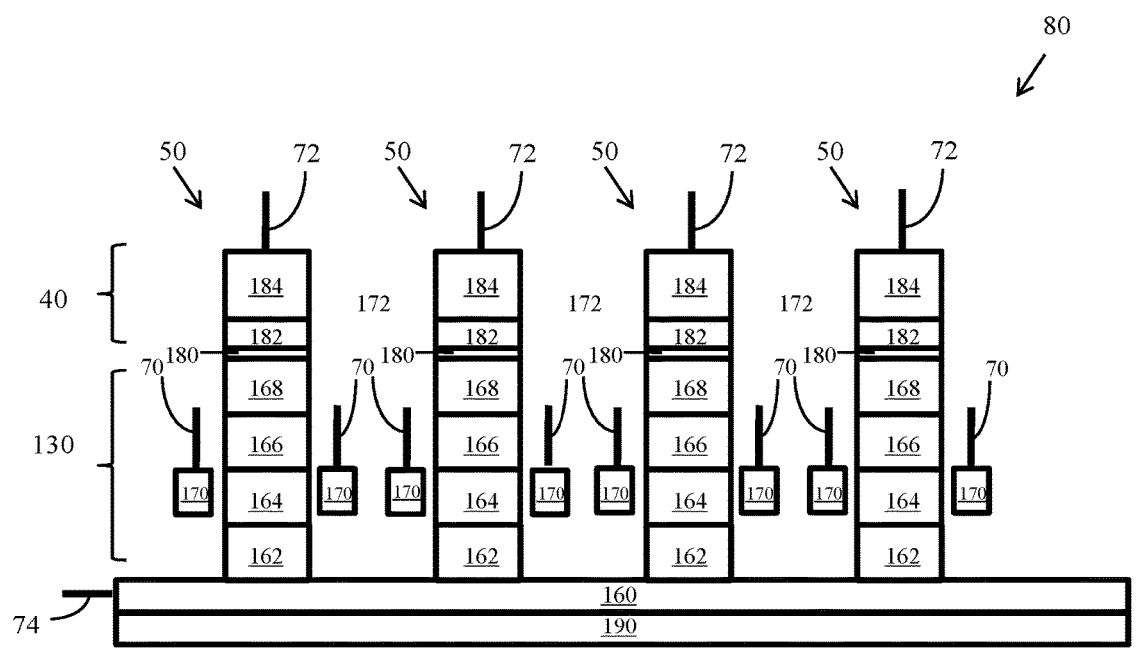
FIG. 38 is a cross-sectional illustration of a plurality of vertical memory cells according to another embodiment of the present invention.

Another embodiment of memory cells 50 is shown in FIG. 38. Memory cell 50 is formed vertically and is insulated from one another by an insulator layer 172. The vertical arrangement results in a compact cell size. The p-n-p-n regions 168, 166, 164, and 162 forming the thyristor device 130 is formed using semiconductor materials, such as silicon or polysilicon. A gate 170 is capacitively coupled to and encloses the p-region 164. The TCCT device is formed on top of a conductor layer 160. The conductor layer 160 can be made of semiconductor materials such as silicon, germanium, silicon germanium, gallium arsenide, carbon nanotubes, or other semiconductor materials, or conductor materials such as tungsten (W), aluminum (Al), titanium (Ti), or copper (Cu).

The phase change memory on top of the thyristor device is formed by a bottom electrode 180, a chalcogenide material 182, and a top electrode 184. The bottom electrode 180 can be made from titanium nitride (TiN) layer, titanium silicon nitride (TiSiN) layer, titanium aluminum nitride (TiAlN) layer, or other electrode layer. Phase change material 182 is a material having properties, such as electrical resistance, that depend on the crystalline phase of the material. Crystalline phase will exhibit a low resistivity state and amorphous phase will exhibit a high resistivity state. Examples of phase change materials that can be used include alloys containing elements from Column VI of the periodic table, such as GeSbTe alloys. The top electrode layer 184 can be formed from aluminum (Al), titanium (Ti), or copper (Cu) layer.

Cell 50 includes several terminals: word line (WL) terminal 70, source line (SL) terminal 72, and bit line (BL) terminal 74. Terminal 70 is connected to the gate 170. Terminal 72 is connected to the phase change memory top electrode 184 and terminal 74 is connected to the conductor layer 160.

To increase the memory density, the arrays 80 of memory cells 50 can be stacked in the vertical direction to form a three-dimensional memory array 150. In another embodiment, the gates 170 and WL terminals 70 can control regions 14 of two adjacent vertical stacks in two adjacent columns. This will further reduce the memory array size.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. An integrated circuit comprising:
   a semiconductor memory array comprising:
      a plurality of memory cells arranged in a matrix of rows and columns, wherein at least two of said memory cells each include:
         a capacitorless transistor having a floating body configured to store data as charge therein when power is applied to said memory cell; and
         a nonvolatile memory comprising a resistance change element configured to store data stored in said floating body upon transfer thereto;
      wherein said nonvolatile memory is configured to restore said data to said floating body;
      wherein said restore operation is performable to said at least two of said memory cells in parallel; and
   a control circuit configured to perform said restore operation.

2. The integrated circuit of claim 1, wherein said resistance change element comprises a phase change material.

3. The integrated circuit of claim 1, wherein said resistance change element comprises a metal-oxide-metal system.

4. The integrated circuit of claim 1, wherein said nonvolatile memory is configured to store said data stored in said floating body upon receiving an instruction to back up said data stored in said floating body.

5. The integrated circuit of claim 1, wherein said nonvolatile memory is configured to store said data stored in said floating body upon a loss of power to said array, wherein said array is configured to perform a shadowing process wherein said data in said floating body is loaded into and stored in said nonvolatile memory.

6. The integrated circuit of claim 5, wherein said loss of power to said array is one of unintentional power loss or intentional power loss, wherein said intentional power loss is predetermined to conserve power.

7. The integrated circuit of claim 5, wherein, upon restoration of power to said array, said data in said nonvolatile memory is loaded into said floating body and stored therein.

8. The integrated circuit of claim 7, wherein said array is configured to reset said nonvolatile memory to an initial state after loading said data into said floating body upon said restoration of power.

9. The integrated circuit of claim 1, wherein said capacitorless transistor is formed in a fin.

10. An integrated circuit comprising:
    a semiconductor memory array comprising:
       a plurality of memory cells arranged in a matrix of rows and columns, wherein at least two of said memory cells each include:
          a capacitorless transistor having a floating body configured to store data as charge therein when power is applied to said memory cell; and
          a nonvolatile memory comprising a resistance change element configured to store data stored in said floating body upon transfer thereto;
       wherein said nonvolatile memory is configured to restore said data to said floating body;
       wherein charge flow into said floating body region upon said restore operation to said memory cell depends on charge stored in said resistance change element; and
    a control circuit configured to perform said restore operation.

11. The integrated circuit of claim 10, wherein said resistance change element comprises a phase change material.

12. The integrated circuit of claim 10, wherein said resistance change element comprises a metal-oxide-metal system.

13. The integrated circuit of claim 10, wherein said capacitorless transistor comprises a floating body region configured to store a state of said capacitorless transistor.

14. The integrated circuit of claim 13, further comprising:
    a buried layer region in electrical contact with said floating body region, located below said floating body region.

15. The integrated circuit of claim 10, wherein said nonvolatile memory is configured to store said data stored in said capacitorless transistor upon receiving an instruction to back up said data stored in said capacitorless transistor.

16. The integrated circuit of claim 10, wherein said nonvolatile memory is configured to store said data stored in said capacitorless transistor upon a loss of power to said memory cell, wherein said memory cell is configured to perform a shadowing process wherein said data in said capacitorless transistor is loaded into and stored in said nonvolatile memory.

17. The integrated circuit of claim 16, wherein said loss of power to said memory cell is one of unintentional power loss or intentional power loss, wherein said intentional power loss is predetermined to conserve power.

18. The integrated circuit of claim 16, wherein, upon restoration of power to said memory cell, said data in said nonvolatile memory is loaded into said capacitorless transistor and stored therein.

19. The integrated circuit of claim 18, wherein said memory cell is configured to reset said nonvolatile memory to an initial state after loading said data into said capacitorless transistor upon said restoration of power.

20. The integrated circuit of claim 10, wherein said capacitorless transistor is formed in a fin.

21. The integrated circuit of claim 10, wherein said data stored in said capacitorless transistor determines a current flowing to said nonvolatile memory.

* * * * *